(12) United States Patent
Masuoka et al.

(10) Patent No.: US 9,362,353 B2
(45) Date of Patent: *Jun. 7, 2016

(54) SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/690,582

(22) Filed: Apr. 20, 2015

(65) Prior Publication Data

US 2015/0228719 A1 Aug. 13, 2015

Related U.S. Application Data

(63) Continuation of application No. 14/289,919, filed on May 29, 2014, now Pat. No. 9,035,384, which is a (Continued)

(51) Int. Cl.
*H01L 27/01* (2006.01)
*H01L 27/12* (2006.01)
(Continued)

(52) U.S. Cl.
CPC .... *H01L 29/0653* (2013.01); *H01L 21/823487* (2013.01); *H01L 27/092* (2013.01);
(Continued)

(58) Field of Classification Search
CPC . H01L 21/8238; H01L 21/041; H01L 21/046; H01L 21/048; H01L 21/02576; H01L 21/02579; H01L 21/31683; H01L 21/11104; H01L 21/38; H01L 21/845; H01L 21/3141; H01L 27/0924; H01L 27/0251; H01L 27/0886; H01L 27/10879; H01L 29/7831; H01L 29/0852; H01L 29/7816; H01L 51/102
USPC ......... 257/288, 315, 316, 317, 350, 358, 359, 257/384, E21.006, E21.014, E21.042, 257/E21.043, E21.048, E21.051, E21.151, 257/E21.165, E21.173, E21.278, E21.293, 257/E21.38
See application file for complete search history.

(56) References Cited

U.S. PATENT DOCUMENTS 5,017,977 A 5/1991 Richardson
5,258,635 A 11/1993 Nitayama et al.
(Continued)

FOREIGN PATENT DOCUMENTS

CN 1507035 6/2004
CN 1610126 A 4/2005
(Continued)

OTHER PUBLICATIONS

Office Action for U.S. Appl. No. 14/537,322 dated Sep. 4, 2015, 7 pages.
(Continued)

*Primary Examiner* — David Nhu
(74) *Attorney, Agent, or Firm* — Brinks Gilson & Lione

(57) ABSTRACT

A semiconductor device includes first and second fin-shaped silicon layers on a substrate, each corresponding to the dimensions of a sidewall pattern around a dummy pattern. First and second pillar-shaped silicon layers reside on the first and second fin-shaped silicon layers, respectively. An n-type diffusion layer resides in an upper portion of the first fin-shaped silicon layer and in upper and lower portions of the first pillar-shaped silicon layer. A p-type diffusion layer resides in an upper portion of the second fin-shaped silicon layer and upper and lower portions of the second pillar-shaped silicon layer. First and second gate insulating films and metal gate electrodes are around the first and second pillar-shaped silicon layers, respectively. A metal gate line is connected to the first and second metal gate electrodes and extends in a direction perpendicular to the first and second fin-shaped silicon layers.

1 Claim, 52 Drawing Sheets

Related U.S. Application Data continuation of application No. 13/693,524, filed on Dec. 4, 2012, now Pat. No. 8,772,175.

(60) Provisional application No. 61/577,189, filed on Dec. 19, 2011.

(51) Int. Cl.
| | |
|---|---|
| H01L 31/0392 | (2006.01) |
| H01L 29/06 | (2006.01) |
| H01L 29/66 | (2006.01) |
| H01L 29/78 | (2006.01) |
| H01L 21/8234 | (2006.01) |
| H01L 27/092 | (2006.01) |
| H01L 29/423 | (2006.01) |

(52) U.S. Cl.
CPC ...... *H01L27/0924* (2013.01); *H01L 29/42392* (2013.01); *H01L 29/66666* (2013.01); *H01L 29/7827* (2013.01)

(56) References Cited

U.S. PATENT DOCUMENTS

| | | | |
|---|---|---|---|
| 5,308,782 A | 5/1994 | Mazure et al. | |
| 5,312,767 A | 5/1994 | Shimizu et al. | |
| 5,382,816 A | 1/1995 | Mitsui | |
| 5,416,350 A | 5/1995 | Watanabe | |
| 5,480,838 A | 1/1996 | Mitsui | |
| 5,627,390 A | 5/1997 | Maeda et al. | |
| 5,656,842 A | 8/1997 | Iwamatsu et al. | |
| 5,703,386 A | 12/1997 | Yasuda et al. | |
| 5,707,885 A | 1/1998 | Lim | |
| 5,710,447 A | 1/1998 | Tohyama | |
| 5,767,549 A | 6/1998 | Chen et al. | |
| 5,780,888 A | 7/1998 | Maeda et al. | |
| 5,811,336 A | 9/1998 | Kasai | |
| 5,872,037 A | 2/1999 | Iwamatsu et al. | |
| 5,905,283 A | 5/1999 | Kasai | |
| 5,994,735 A | 11/1999 | Maeda et al. | |
| 6,121,086 A | 9/2000 | Kuroda et al. | |
| 6,127,209 A | 10/2000 | Maeda et al. | |
| 6,175,138 B1 | 1/2001 | Noda | |
| 6,294,418 B1 | 9/2001 | Noble | |
| 6,373,099 B1 | 4/2002 | Kikuchi et al. | |
| 6,392,271 B1 | 5/2002 | Alavi et al. | |
| 6,406,962 B1 | 6/2002 | Agnello et al. | |
| 6,420,751 B1 | 7/2002 | Maeda et al. | |
| 6,461,900 B1 | 10/2002 | Sundaresan et al. | |
| 6,483,171 B1 | 11/2002 | Forbes et al. | |
| 6,624,459 B1 | 9/2003 | Dachtera et al. | |
| 6,658,259 B2 | 12/2003 | McIntosh | |
| 6,740,937 B1 | 5/2004 | Sushihara | |
| 6,747,314 B2 | 6/2004 | Sundaresan et al. | |
| 6,815,277 B2 | 11/2004 | Fried et al. | |
| 6,849,903 B2 | 2/2005 | Sushihara | |
| 6,861,684 B2 | 3/2005 | Skotnicki et al. | |
| 6,878,991 B1 | 4/2005 | Forbes | |
| 6,891,225 B2 | 5/2005 | Horiguchi et al. | |
| 6,943,407 B2 | 9/2005 | Ouyang et al. | |
| 7,052,941 B2 | 5/2006 | Lee | |
| 7,193,278 B2 | 3/2007 | Song | |
| 7,198,976 B2 | 4/2007 | Hirata | |
| 7,233,033 B2 | 6/2007 | Koyama et al. | |
| 7,241,655 B2 | 7/2007 | Tang et al. | |
| 7,271,052 B1 | 9/2007 | Forbes | |
| 7,368,334 B2 | 5/2008 | Yeo et al. | |
| 7,374,990 B2 | 5/2008 | Tang et al. | |
| 7,413,480 B2 | 8/2008 | Thomas | |
| 7,579,214 B2 | 8/2009 | Yamazaki et al. | |
| 7,619,675 B2 | 11/2009 | Horii | |
| 7,829,952 B2 | 11/2010 | Moniwa et al. | |
| 7,872,287 B2 | 1/2011 | Masuoka et al. | |
| 7,977,736 B2 | 7/2011 | Kim et al. | |
| 7,977,738 B2 | 7/2011 | Minami et al. | |
| 7,981,738 B2 | 7/2011 | Moniwa et al. | |
| 8,039,893 B2 | 10/2011 | Masuoka et al. | |
| 8,058,683 B2 | 11/2011 | Yoon et al. | |
| 8,067,800 B2 | 11/2011 | Hsieh | |
| 8,110,869 B2 | 2/2012 | Bhalla | |
| 8,154,076 B2 | 4/2012 | Takaishi | |
| 8,188,537 B2 | 5/2012 | Masuoka et al. | |
| 8,227,305 B2 | 7/2012 | Forbes | |
| 8,378,400 B2 | 2/2013 | Masuoka et al. | |
| 8,482,047 B2 | 7/2013 | Abbott et al. | |
| 8,772,175 B2 | 7/2014 | Masuoka et al. | |
| 8,916,478 B2 | 12/2014 | Masuoka et al. | |
| 9,035,384 B2 * | 5/2015 | Masuoka | H01L 29/66666 257/350 |
| 2001/0052614 A1 | 12/2001 | Ishibashi | |
| 2002/0000624 A1 | 1/2002 | Takemura et al. | |
| 2002/0034853 A1 | 3/2002 | Alavi et al. | |
| 2002/0110039 A1 | 8/2002 | Forbes et al. | |
| 2002/0195652 A1 | 12/2002 | Maeda et al. | |
| 2003/0002093 A1 | 1/2003 | Hynecek | |
| 2003/0075758 A1 | 4/2003 | Sundaresan et al. | |
| 2004/0005755 A1 | 1/2004 | Moniwa et al. | |
| 2004/0113207 A1 | 6/2004 | Hsu et al. | |
| 2004/0135215 A1 | 7/2004 | Song | |
| 2004/0169293 A1 | 9/2004 | Sushihara | |
| 2004/0256639 A1 | 12/2004 | Ouyang et al. | |
| 2004/0262681 A1 | 12/2004 | Masuoka et al. | |
| 2005/0127404 A1 | 6/2005 | Sushihara | |
| 2005/0145911 A1 | 7/2005 | Forbes et al. | |
| 2005/0263821 A1 | 12/2005 | Cho et al. | |
| 2005/0281119 A1 | 12/2005 | Shibata et al. | |
| 2006/0006444 A1 | 1/2006 | Leslie | |
| 2006/0007333 A1 | 1/2006 | Horii | |
| 2006/0033524 A1 | 2/2006 | Sushihara | |
| 2006/0043520 A1 | 3/2006 | Jerdev et al. | |
| 2006/0046391 A1 | 3/2006 | Tang et al. | |
| 2006/0261406 A1 | 11/2006 | Chen | |
| 2007/0007601 A1 | 1/2007 | Hsu et al. | |
| 2007/0075359 A1 | 4/2007 | Yoon et al. | |
| 2007/0117324 A1 | 5/2007 | Previtali | |
| 2007/0138557 A1 | 6/2007 | Ipposhi | |
| 2007/0173006 A1 | 7/2007 | Moniwa et al. | |
| 2008/0048245 A1 | 2/2008 | Kito et al. | |
| 2008/0173936 A1 | 7/2008 | Yoon et al. | |
| 2008/0210985 A1 | 9/2008 | Ogawa et al. | |
| 2008/0227241 A1 | 9/2008 | Nakabayashi et al. | |
| 2009/0032955 A1 | 2/2009 | Tanaka et al. | |
| 2009/0057722 A1 | 3/2009 | Masuoka et al. | |
| 2009/0065832 A1 | 3/2009 | Masuoka et al. | |
| 2009/0085088 A1 | 4/2009 | Takaishi | |
| 2009/0114989 A1 | 5/2009 | Hamamoto | |
| 2009/0159964 A1 | 6/2009 | Lee | |
| 2009/0174024 A1 | 7/2009 | Kim | |
| 2009/0197379 A1 | 8/2009 | Leslie | |
| 2009/0290082 A1 | 11/2009 | Yamazaki et al. | |
| 2009/0291551 A1 | 11/2009 | Cho | |
| 2010/0052029 A1 | 3/2010 | Huang | |
| 2010/0200731 A1 | 8/2010 | Masuoka et al. | |
| 2010/0200913 A1 | 8/2010 | Masuoka et al. | |
| 2010/0207172 A1 | 8/2010 | Masuoka et al. | |
| 2010/0207201 A1 | 8/2010 | Masuoka et al. | |
| 2010/0207213 A1 | 8/2010 | Tan et al. | |
| 2010/0213525 A1 | 8/2010 | Masuoka et al. | |
| 2010/0213539 A1 | 8/2010 | Masuoka et al. | |
| 2010/0219457 A1 | 9/2010 | Masuoka et al. | |
| 2010/0219483 A1 | 9/2010 | Masuoka et al. | |
| 2010/0270611 A1 | 10/2010 | Masuoka et al. | |
| 2010/0276750 A1 | 11/2010 | Tu | |
| 2010/0295123 A1 | 11/2010 | Lung et al. | |
| 2011/0073925 A1 | 3/2011 | Park et al. | |
| 2011/0215381 A1 | 9/2011 | Masuoka et al. | |
| 2011/0254067 A1 | 10/2011 | Abbott et al. | |
| 2011/0275207 A1 | 11/2011 | Moniwa et al. | |
| 2011/0303973 A1 | 12/2011 | Masuoka et al. | |
| 2011/0303985 A1 | 12/2011 | Masuoka et al. | |

(56) References Cited

U.S. PATENT DOCUMENTS

| | | | |
|---|---|---|---|
| 2012/0086051 A1 | 4/2012 | Wang et al. | |
| 2012/0196415 A1 | 8/2012 | Masuoka et al. | |

FOREIGN PATENT DOCUMENTS

| | | | |
|---|---|---|---|
| CN | 1983601 A | 6/2007 | |
| CN | 101542733 A | 9/2009 | |
| DE | 4443968 | 11/1995 | |
| EP | 1770769 A1 | 4/2007 | |
| EP | 2197032 A1 | 6/2010 | |
| EP | 2239770 A1 | 10/2010 | |
| EP | 2239771 A1 | 10/2010 | |
| EP | 2244305 A1 | 10/2010 | |
| EP | 2246895 A1 | 11/2010 | |
| JP | 60-070757 A | 4/1985 | |
| JP | 61-013661 | 1/1986 | |
| JP | 62-045058 A | 2/1987 | |
| JP | 62-190751 | 8/1987 | |
| JP | 63-037633 A | 2/1988 | |
| JP | 63-158866 A | 7/1988 | |
| JP | 64-089560 A | 4/1989 | |
| JP | 01-175775 A | 7/1989 | |
| JP | 02-066969 A | 3/1990 | |
| JP | 02-071556 | 3/1990 | |
| JP | 02-089368 A | 3/1990 | |
| JP | 02-188966 | 7/1990 | |
| JP | 03-114233 | 5/1991 | |
| JP | 03-145761 | 6/1991 | |
| JP | 03-225873 A | 10/1991 | |
| JP | 04-234166 A | 8/1992 | |
| JP | 05-276442 A | 10/1993 | |
| JP | 06-021467 A | 1/1994 | |
| JP | 06-069441 | 3/1994 | |
| JP | 06-237003 A | 8/1994 | |
| JP | 07-099311 | 4/1995 | |
| JP | 07-321228 | 12/1995 | |
| JP | 08-078533 A | 3/1996 | |
| JP | 09-008295 | 1/1997 | |
| JP | 10-079482 A | 3/1998 | |
| JP | 10-223777 A | 8/1998 | |
| JP | 11-087649 | 3/1999 | |
| JP | 2000-012705 A | 1/2000 | |
| JP | 2000-068516 | 3/2000 | |
| JP | 2000-208434 | 7/2000 | |
| JP | 2000-243085 | 9/2000 | |
| JP | 2000-244818 A | 9/2000 | |
| JP | 2000-357736 | 12/2000 | |
| JP | 2001-028399 | 1/2001 | |
| JP | 2001-237421 A | 8/2001 | |
| JP | 2001-339057 A | 12/2001 | |
| JP | 2001-352047 A | 12/2001 | |
| JP | 2002-009257 | 1/2002 | |
| JP | 2002-033399 A | 1/2002 | |
| JP | 2002-231951 A | 8/2002 | |
| JP | 2002-246580 A | 8/2002 | |
| JP | 2002-246581 A | 8/2002 | |
| JP | 2003-068883 A | 3/2003 | |
| JP | 2003-142684 | 5/2003 | |
| JP | 2003-179160 A | 6/2003 | |
| JP | 2003-224211 A | 8/2003 | |
| JP | 2004-079694 | 3/2004 | |
| JP | 2004-096065 A | 3/2004 | |
| JP | 2004-153246 | 5/2004 | |
| JP | 2004-193588 A | 7/2004 | |
| JP | 2004-259733 A | 9/2004 | |
| JP | 2004-319808 A | 11/2004 | |
| JP | 2005-012213 A | 1/2005 | |
| JP | 2005-135451 | 5/2005 | |
| JP | 2006-024799 A | 1/2006 | |
| JP | 2006-514392 | 4/2006 | |
| JP | 2006-294995 A | 10/2006 | |
| JP | 2007-0250652 A | 9/2007 | |
| JP | 2008-177565 | 7/2008 | |
| JP | 2008-205168 A | 9/2008 | |
| JP | 2008-300558 A | 12/2008 | |
| JP | 2009-110049 A | 5/2009 | |
| JP | 2009-182316 A | 8/2009 | |
| JP | 2009-182317 A | 8/2009 | |
| JP | 2010-171055 | 8/2010 | |
| JP | 2010-0213539 A | 9/2010 | |
| JP | 2010-258345 | 11/2010 | |
| JP | 2011-066105 | 3/2011 | |
| JP | 2011-071235 | 4/2011 | |
| JP | 2011-077437 | 4/2011 | |
| JP | 2011-211161 A | 10/2011 | |
| KR | 10-0132560 | 12/1997 | |
| KR | 10-0200222 | 6/1999 | |
| KR | 10-0327875 B1 | 9/2002 | |
| KR | 2004-0063348 A | 7/2004 | |
| WO | WO 94/14198 A1 | 6/1994 | |
| WO | WO 01/22494 A1 | 3/2001 | |
| WO | WO 2005/036651 | 4/2005 | |
| WO | WO 2006/127586 | 11/2006 | |
| WO | WO 2009/034623 A1 | 3/2009 | |
| WO | WO 2009/034731 A1 | 3/2009 | |
| WO | WO 2009/057194 A1 | 5/2009 | |
| WO | WO 2009/095997 A1 | 8/2009 | |
| WO | WO 2009/096001 A1 | 8/2009 | |
| WO | WO 2009/096464 A1 | 8/2009 | |
| WO | WO 2009/096465 A1 | 8/2009 | |
| WO | WO 2009/096466 A1 | 8/2009 | |
| WO | WO 2009/096470 A1 | 8/2009 | |
| WO | WO 2009/102059 A1 | 8/2009 | |
| WO | WO 2009/133957 A1 | 11/2009 | |
| WO | WO 2011/111662 A1 | 9/2011 | |

OTHER PUBLICATIONS

Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.

Chen, Yijian et al., "Vertical integrated-gate CMOS for ultra-dense IC", *Microelectronic Engineering*, vol. 83, 2006, pp. 1745-1748.

Choi, Yang-Kyu et al., "FinFET Process Refinements for Improved Mobility and Gate Work Function Engineering," IEEE, 2002, 4 pages.

Office Action for Chinese Patent Application Serial No. 200980103454.9, dated Oct. 31, 2012, 7 pages.

Office Action for Chinese Patent Application Serial No. 200980103505.8, dated Nov. 1, 2012, 5 pages.

Office Action for Chinese Patent Application Serial No. 201010171435.4, dated Dec. 21, 2012, 7 pages.

Office Action for Chinese Application Serial No. 2011100647037, dated Nov. 14, 2012, 6 pages.

Office Action for Japanese Patent Application Serial No. 2009-538870, dated Nov. 8, 2012, 4 pages.

Restriction Requirement for U.S. Appl. No. 13/412,959, dated Nov. 8, 2012, 6 pages.

European Search Report for counterpart European Application No. 09705485.2, dated Feb. 14, 2011, 5 pages.

Examination Report for European Application No. 08722595.9, dated Jul. 11, 2012, 4 pages.

Examination Report in corresponding European Application No. 07 807 139.6, dated Jun. 11, 2012, 4 pages.

Extended European Search Report for European Application No. 07807139.6, dated Jun. 24, 2011, 10 pages.

Extended European Search Report for European Application No. 10004492.4, dated Jun. 21, 2012, 10 pages.

Extended European Search Report for European Application No. 10009574.4, dated May 15, 2012, 6 pages.

Extended European Search Report for European Application No. 12001395.8, dated Apr. 26, 2012, 7 pages.

Extened European Search Report for European Application No. 10009579.3, dated Jun. 11, 2012, 11 pages.

Guidash, R.M. et al. "A 0.6 μm CMOS Pinned Photodiode Color Imager Technology", *IEDM Digest Papers*, pp. 927-929, 1997.

Hieda, K. et al., "New Effects of Trench Isolated Transistor Using Side-Wall Gates", *VLSI Research Center*, Toshiba Corporation, 1987, 4 pages.

(56) References Cited

OTHER PUBLICATIONS

International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2007/071052, dated Jan. 29, 2008, 6 pages.
International Search Report for International Application No. PCT/JP2008/051300, dated May 13, 2008, 4 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051459, dated Apr. 14, 2009, 4 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Iwai, Makoto et al., "High-Performance Buried Gate Surrounding Gate Transistor for Future Three-Dimensional Devices", *Japanese Journal of Applied Physics,* 2004, vol. 43, No. 10, pp. 6904-6906.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Mendis, Sunetra K. et al. "A 128 x 128 CMOS Active Pixel Image Sensor for Highly Integrated Imaging System", *IEDM93, Digest Papers,* 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nakamura, Jun-ichi et al., "Nondestructive Readout Mode Static Induction Transistor (SIT) Photo Sensors," IEEE Transactions on Electron Devices, 1993, vol. 40, pp. 334-341.
Nitayama, Akihiro et al., "Multi-Pillar Surrounding Gate Transistor (M-SGT) for Compact and High-Speed Circuits", *IEEE Transactions on Electron Devices,* vol. 3, No. 3, Mar. 1991, pp. 679-583.
Non-Certified Partial Translation of Office Action from counterpart Korean Application No. 10-2010-7018204, dated Mar. 29, 2012, 1 page.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Notice of Allowance for U.S. Appl. No. 12/700,294, dated Oct. 5, 2012, 7 pages.
Office Action from co-pending U.S. Appl. No. 12/704,935, dated Nov. 18, 2011, 9 pages.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Office Action from co-pending U.S. Appl. No. 12/704,955, dated Dec. 8, 2011, 12 pages.
Office Action from counterpart Korean Application No. 10-2010-7018204, dated Mar. 29, 2012, 7 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.
Watanabe, S. et al., "A Novel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2007/071052, dated Jan. 29, 2008, 9 pages.
Written Opinion of the International Searching Authority for International Application No. PCT/JP2008/051300, dated Aug. 30, 2010, 8 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2008/058412, dated Jun. 10, 2008, 4 pages.
Written Opinion of the International Searching Authority for International Application No. PCT/JP2009/051459, dated Aug. 30, 2010, 8 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Written Opinion of the International Searching Authority for International Application No. PCT/JP2009/058629, dated Jun. 2, 2009, 4 pages.
Wu et al., "High Performance 22/20nm FinFET CMOS Devices with Advanced High-K/Metal Gate Scheme", IEEE, pp. 27.1.1-27.1.4, 2010.
Wuu, S.G. et al., "A Leading-Edge 0.9 μm Pixel CMOS Image Sensor Technology with Backside Illumination: Future Challenges for Pixel Scaling", *IEDM2010 Digest Papers,* 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuits Conference, 9 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.

(56) References Cited

OTHER PUBLICATIONS

Lee, et al., "An Active Pixel Sensor Fabricated Using CMOS/CCD Process Technology" in Program IEEE Workshop on Charge-Coupled Devices and Advanced Image Sensors, 1995, 5 pages.

Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.

Takahashi et al., "A 3.9-μm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.

Yasutomi et al, "A High-Speed CMOS Image Sensor with Global Electronic Shutter Pixel Using Pinned Diodes", IEEJ Trans. SM, vol. 129, No. 10, 2009, pp. 321-327.

Notice of Allowance for U.S. Appl. No. 13/043,081, dated Mar. 18, 2013, 6 pages.

Notice of Allowance for U.S. Appl. No. 13/113,482, dated Apr. 4, 2013, 10 pages.

Notice of Allowance for U.S. Appl. No. 12/768,290, dated Apr. 18, 2013, 9 pages.

Notice of Allowance for U.S. Appl. No. 12/704,935, dated May 16, 2013, 10 pages.

Notice of Allowance for U.S. Appl. No. 13/046,113, dated May 13 2013, 10 pages.

Notice of Allowance for U.S. Appl. No. 13/412,959, dated May 8, 2013, 9 pages.

Office Action for U.S. Appl. No. 13/116,506, dated Jul. 18, 2013, 12 pages.

Notice of Allowance for U.S. Appl. No. 12/894,923, dated Jul. 2, 2013, 9 pages.

Notice of Allowance for U.S. Appl. No. 13/606,823, dated Jul. 8, 2013, 12 pages.

English translation of previously cited International Search Report for PCT/JP2011/070534, dated Dec. 6, 2011, 2 pages.

English translation of previously cited International Search Report for PCT/JP2011/071162, dated Dec. 13, 2011, 5 pages.

Office Action for U.S. Appl. No. 13/917,040 dated Aug. 6, 2013, 5 pages.

Ex Parte Quayle Action for U.S. Appl. No. 13/693,524 dated Feb. 20, 2014, 4 pages.

Notice of Allowance for U.S. Appl. No. 13/693,524 dated Mar. 18, 2014, 7 pages.

Office Action for U.S. Appl. No. 14/066,095 dated Sep. 15, 2014, 7 pages.

Notice of Allowance for U.S. Appl. No. 14/066,095 dated Oct. 23, 2014, 7 pages.

Office Action for U.S. Appl. No. 14/289,919 dated Feb. 5, 2015, 7 pages.

Notice of Allowance for U.S. Appl. No. 14/289,919 dated Mar. 18, 2015, 7 pages.

Notice of Allowance for U.S. Appl. No. 14/537,322 dated Oct. 29, 2015, 7 pages.

\* cited by examiner

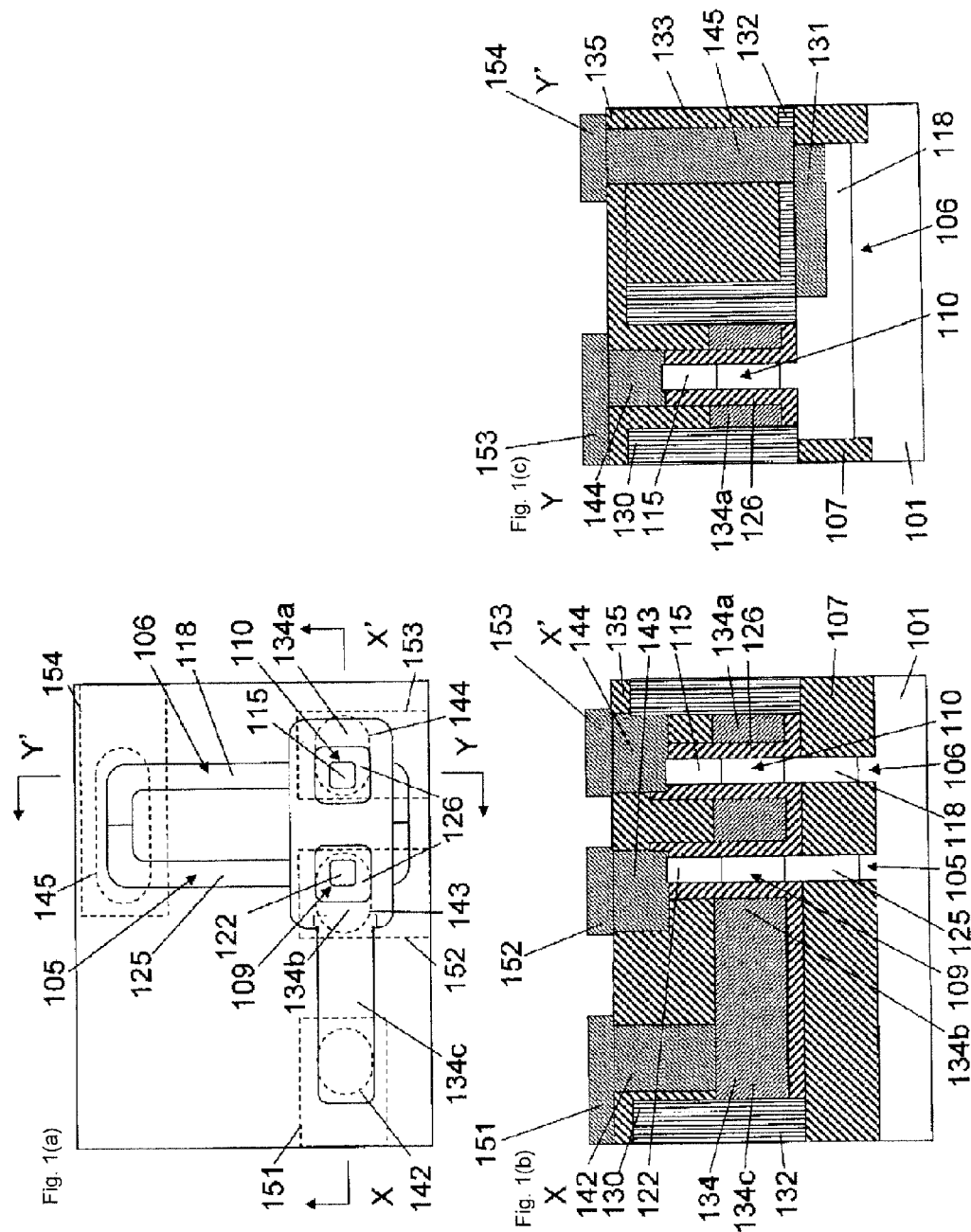

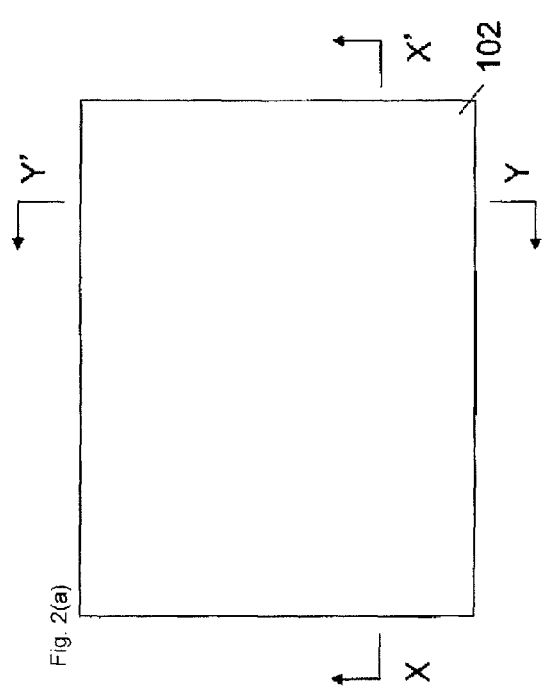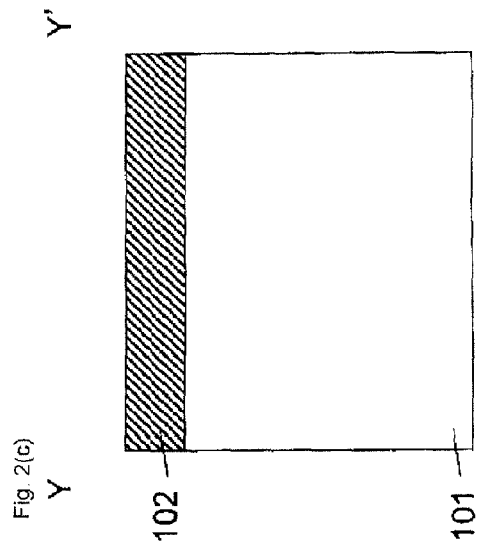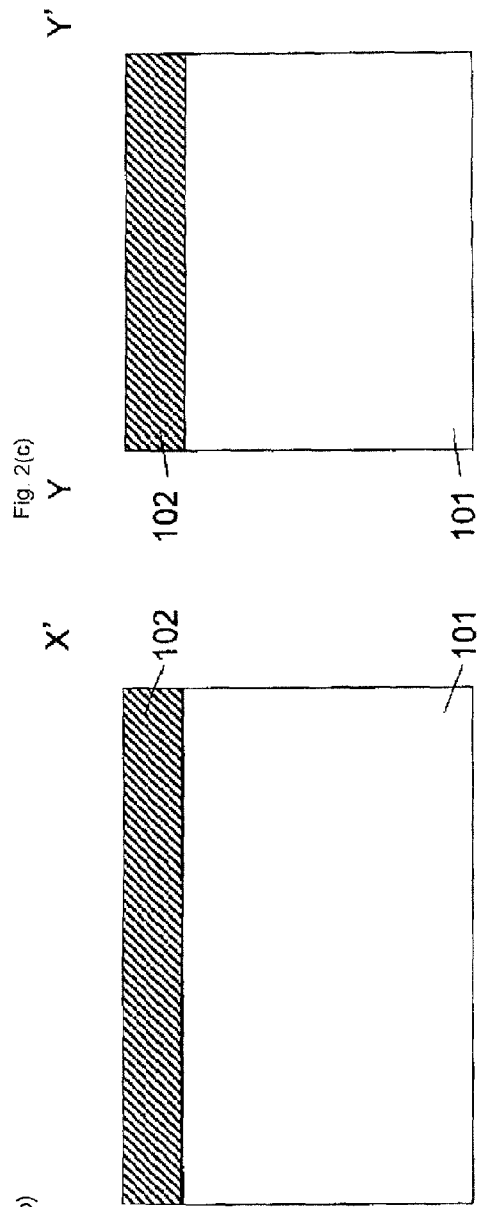

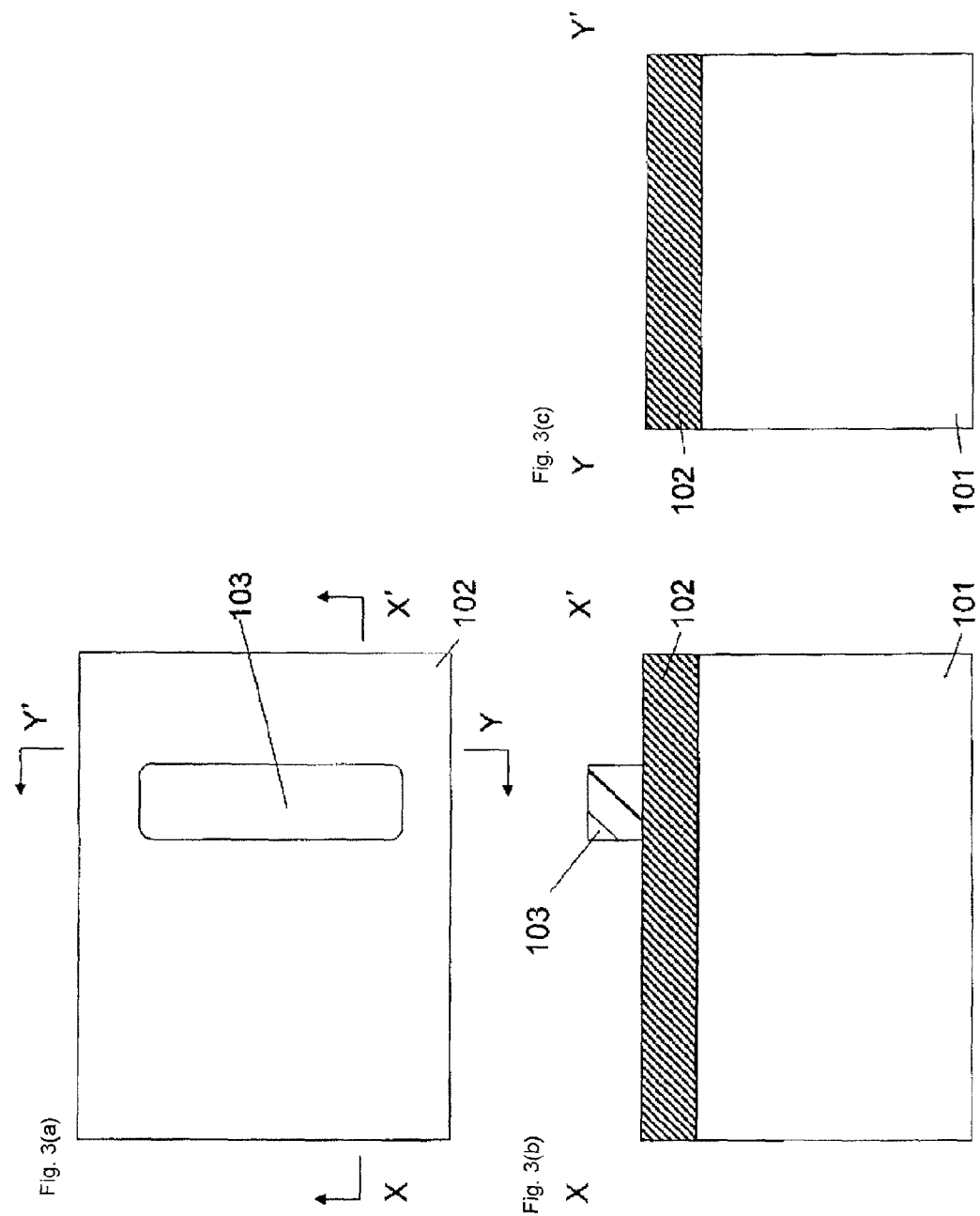

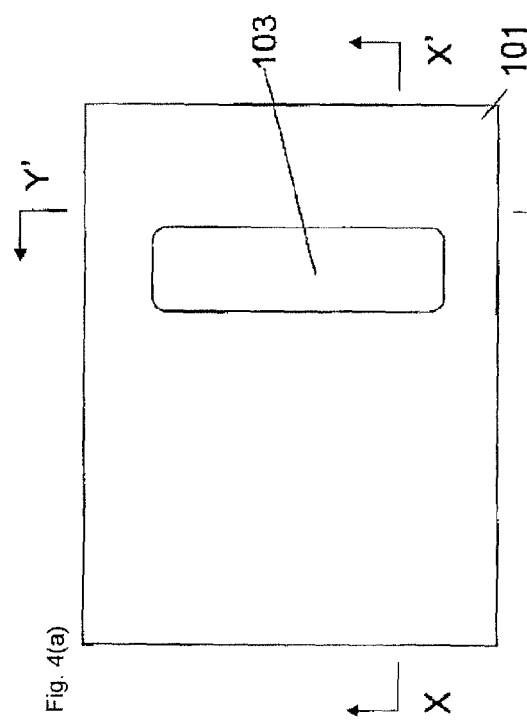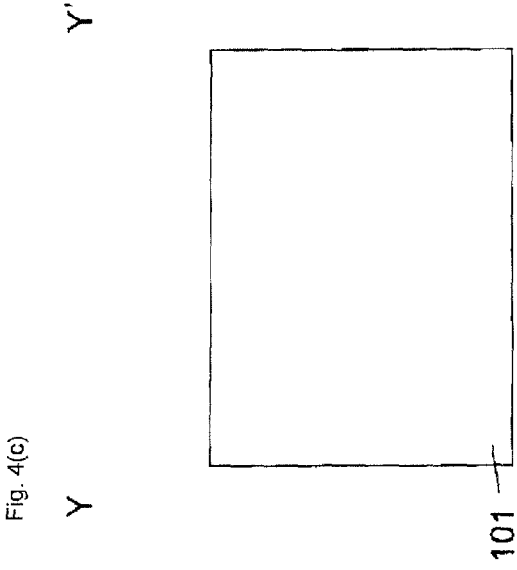
Fig. 4(a)
Fig. 4(b)
Fig. 4(c)

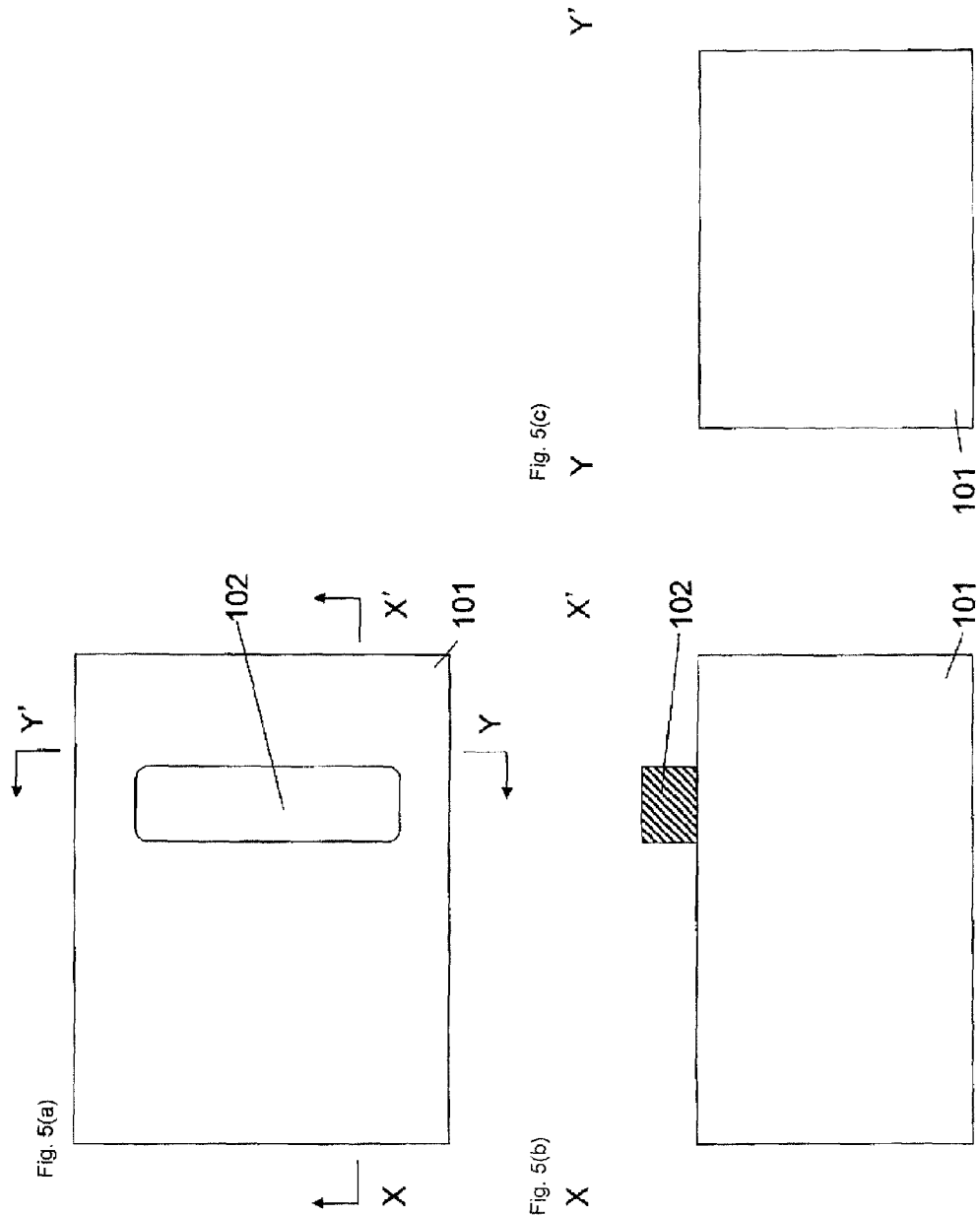

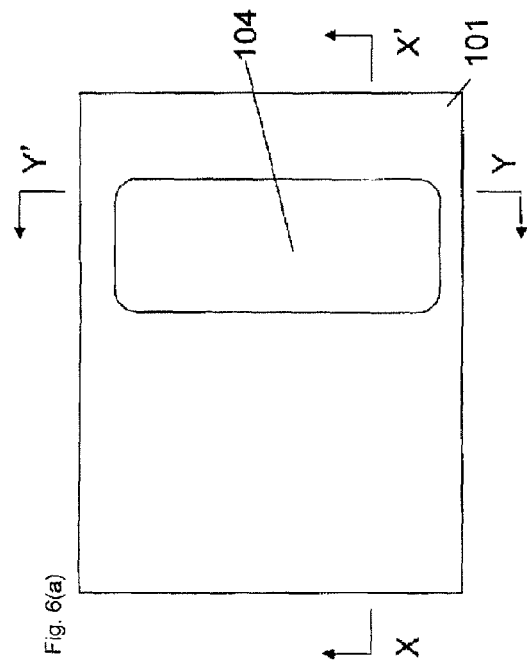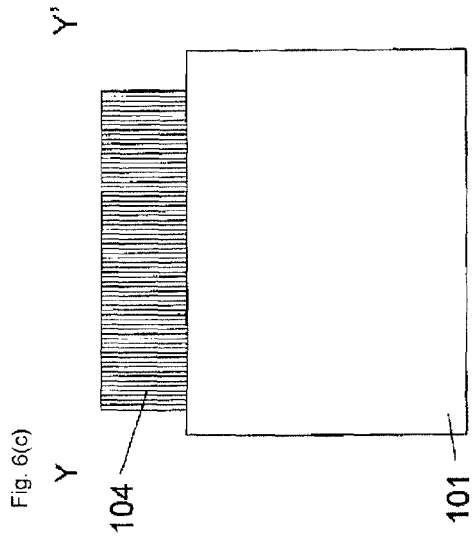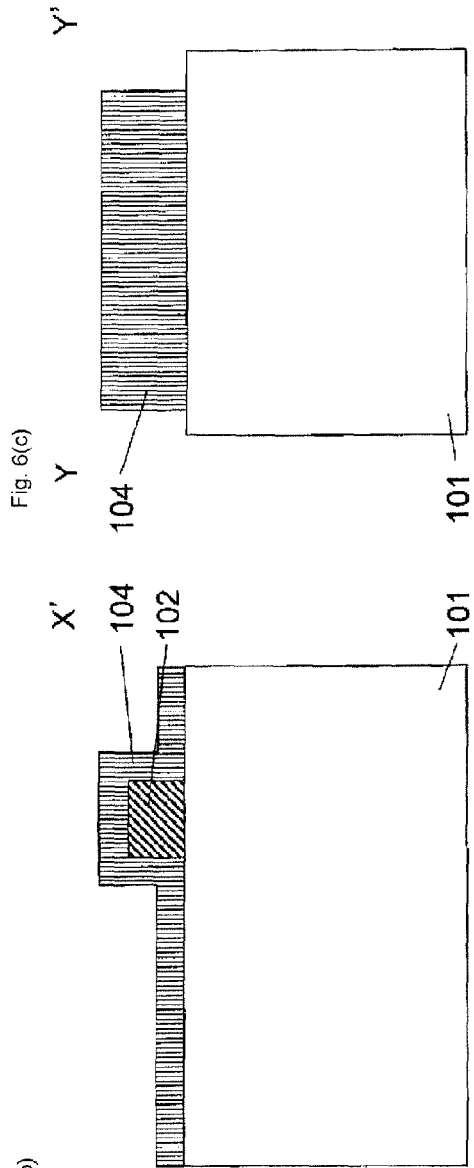

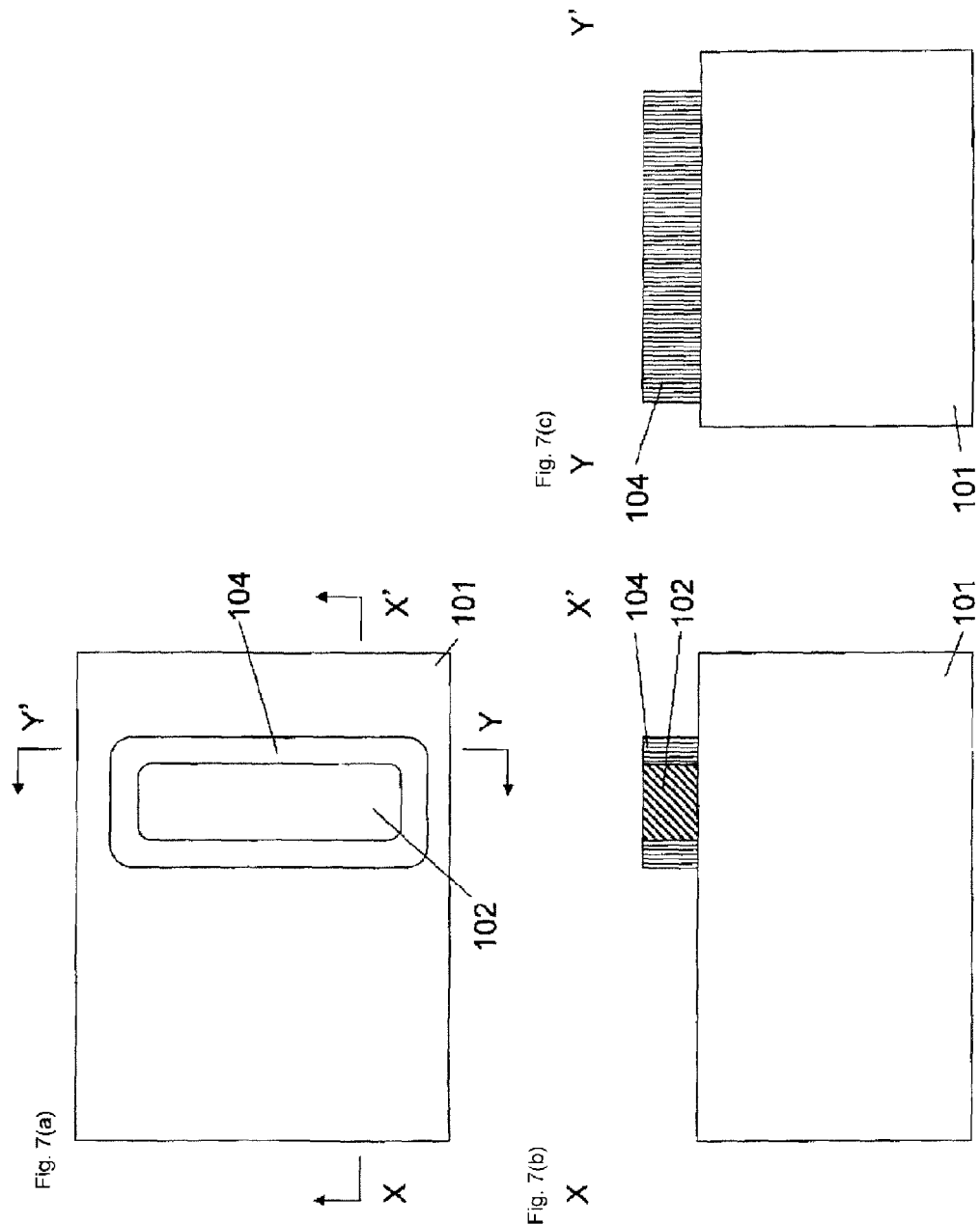

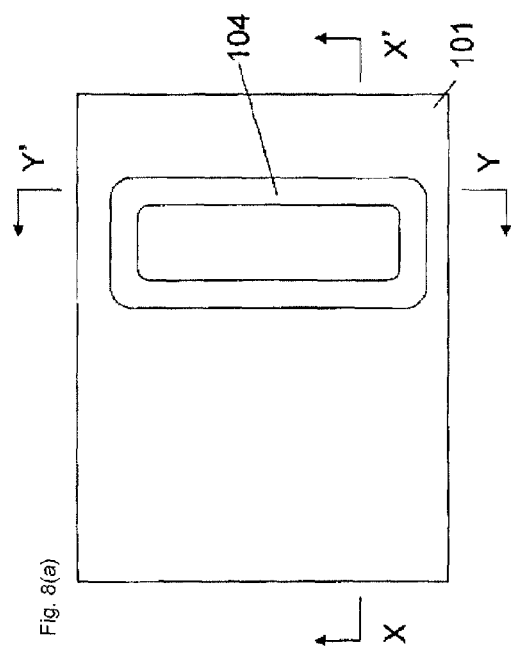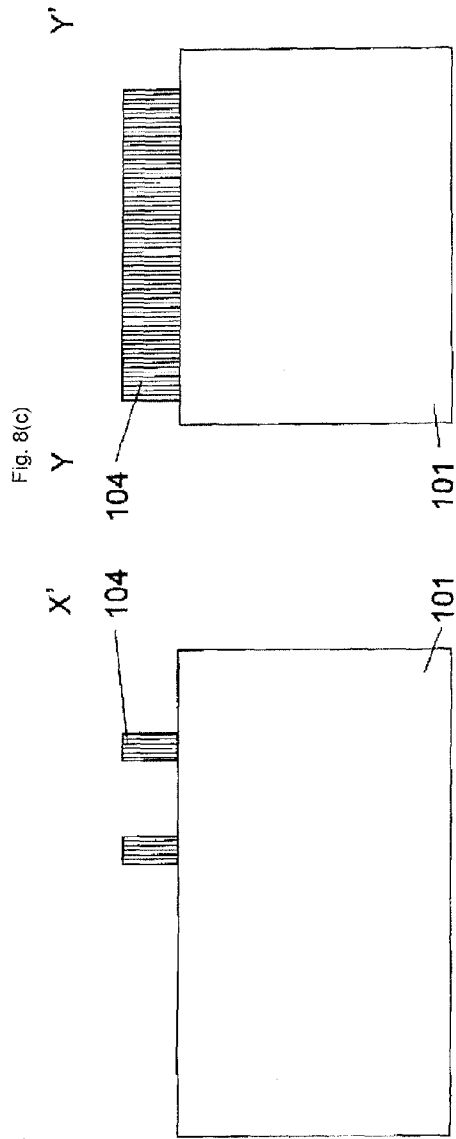

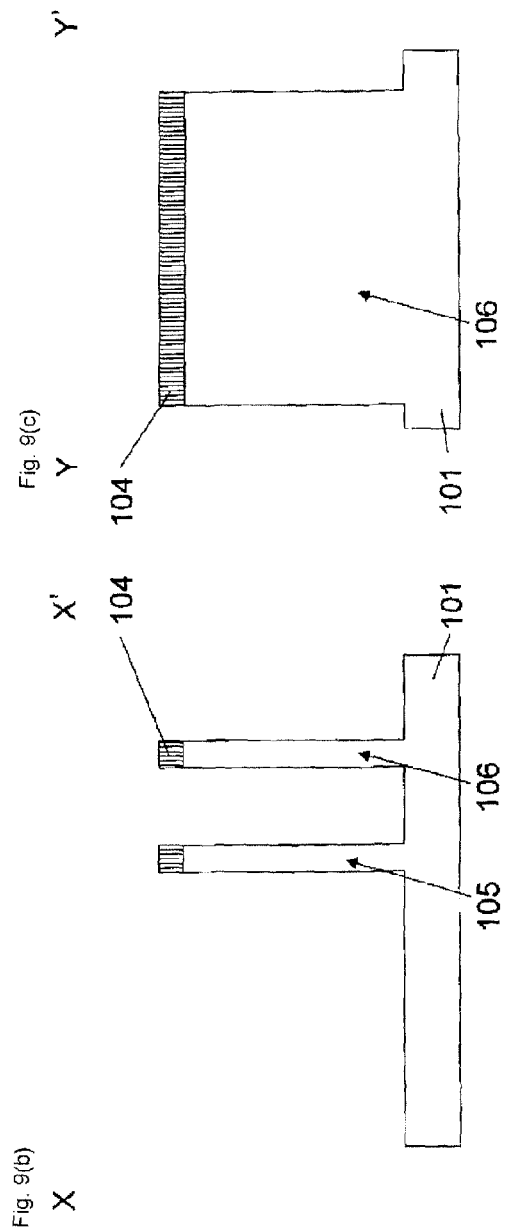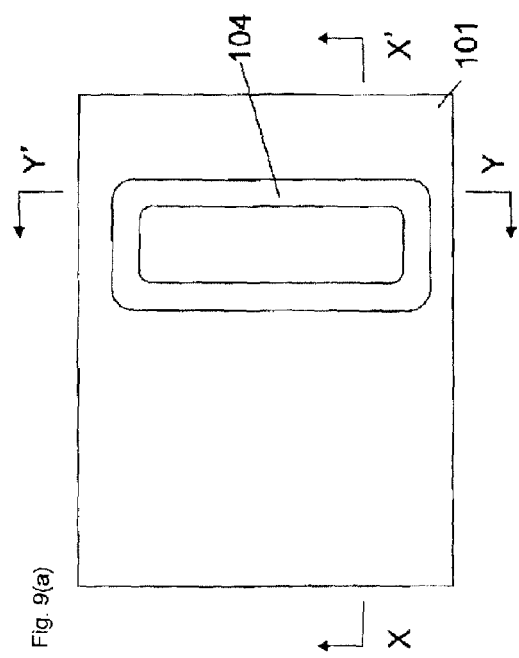

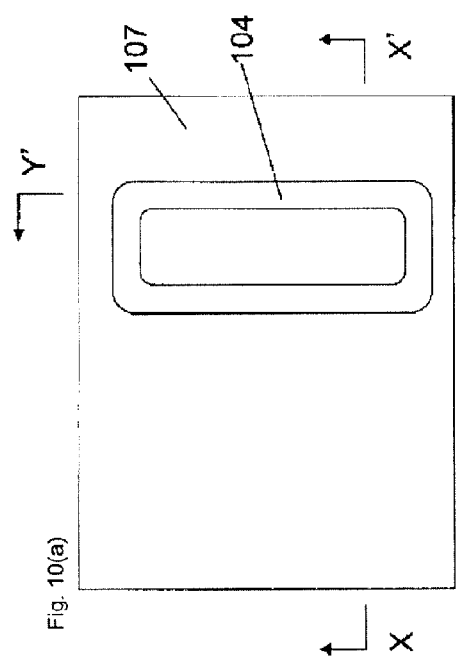
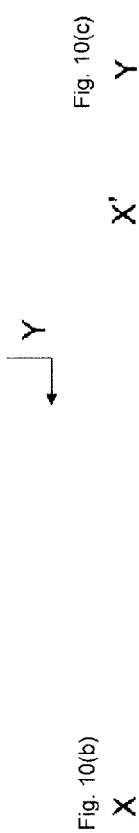
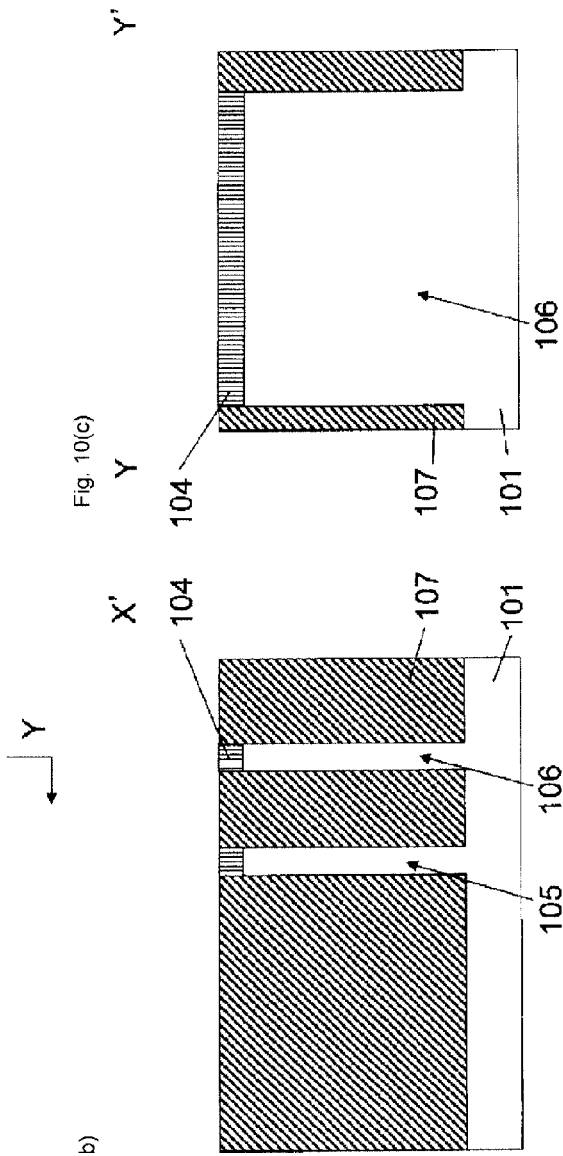

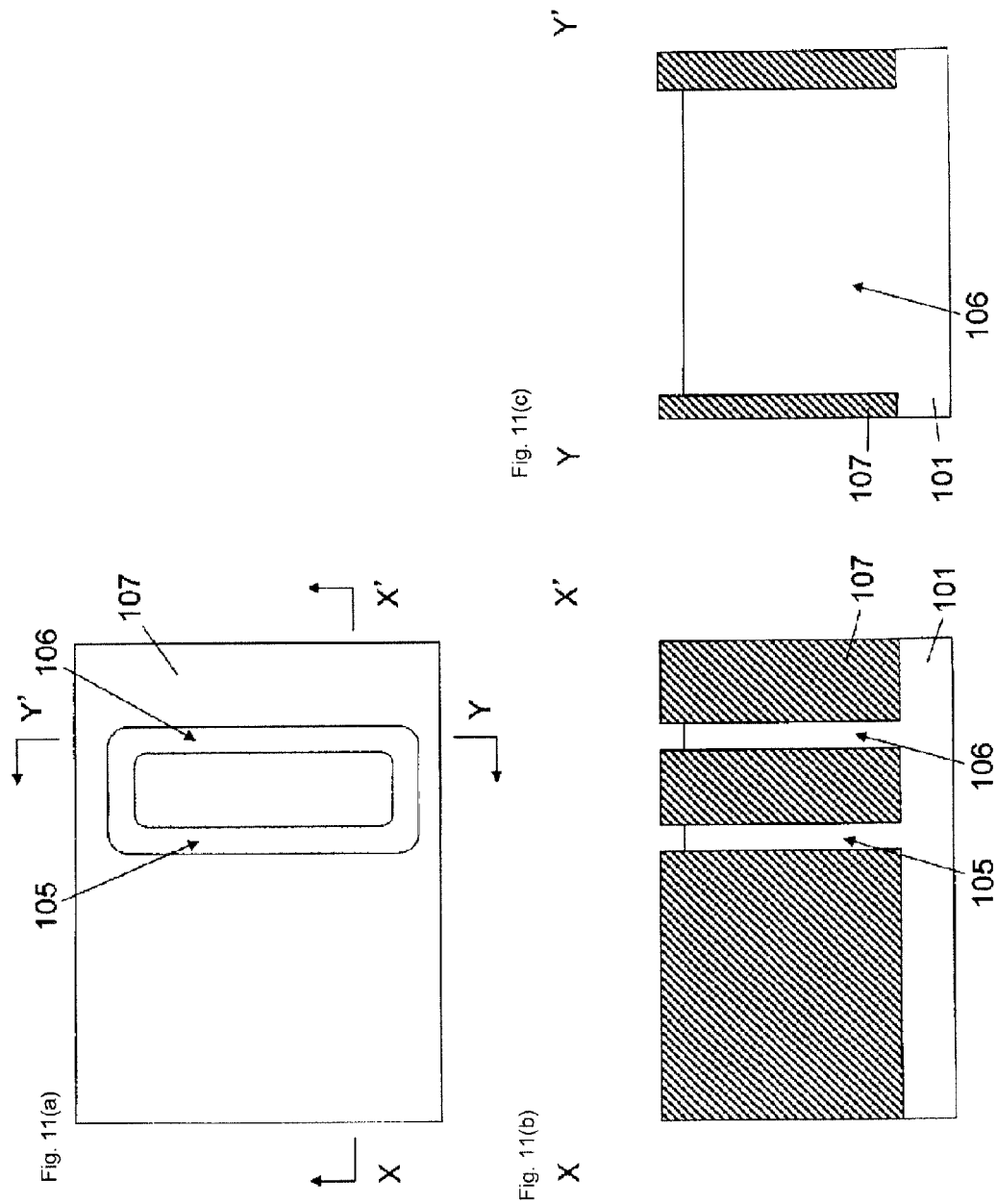

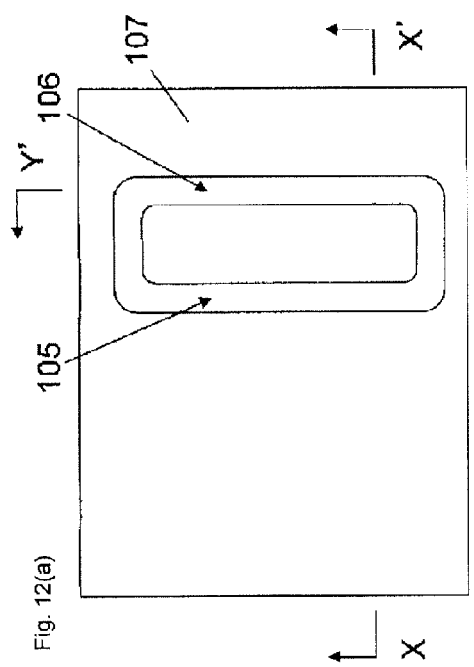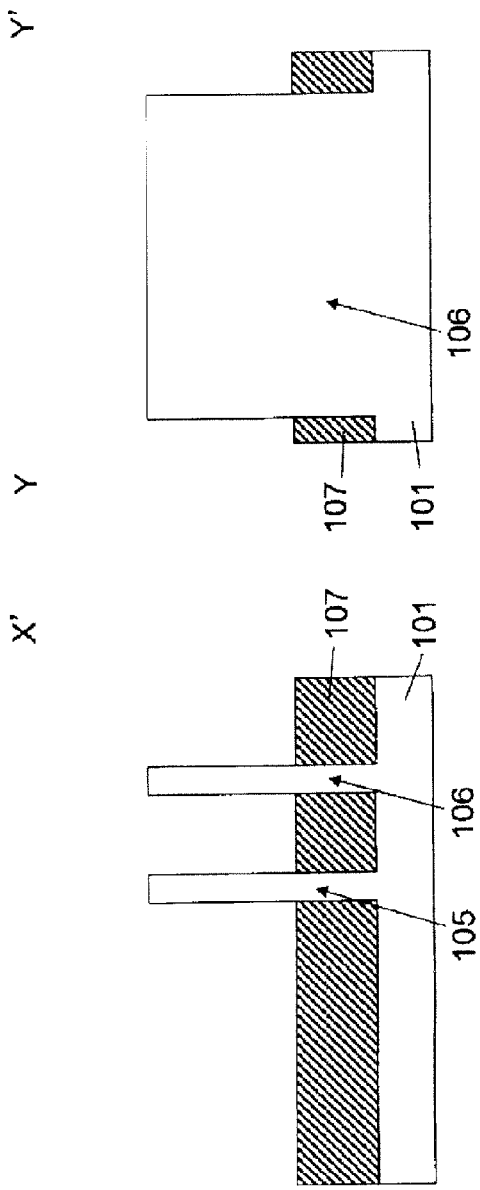

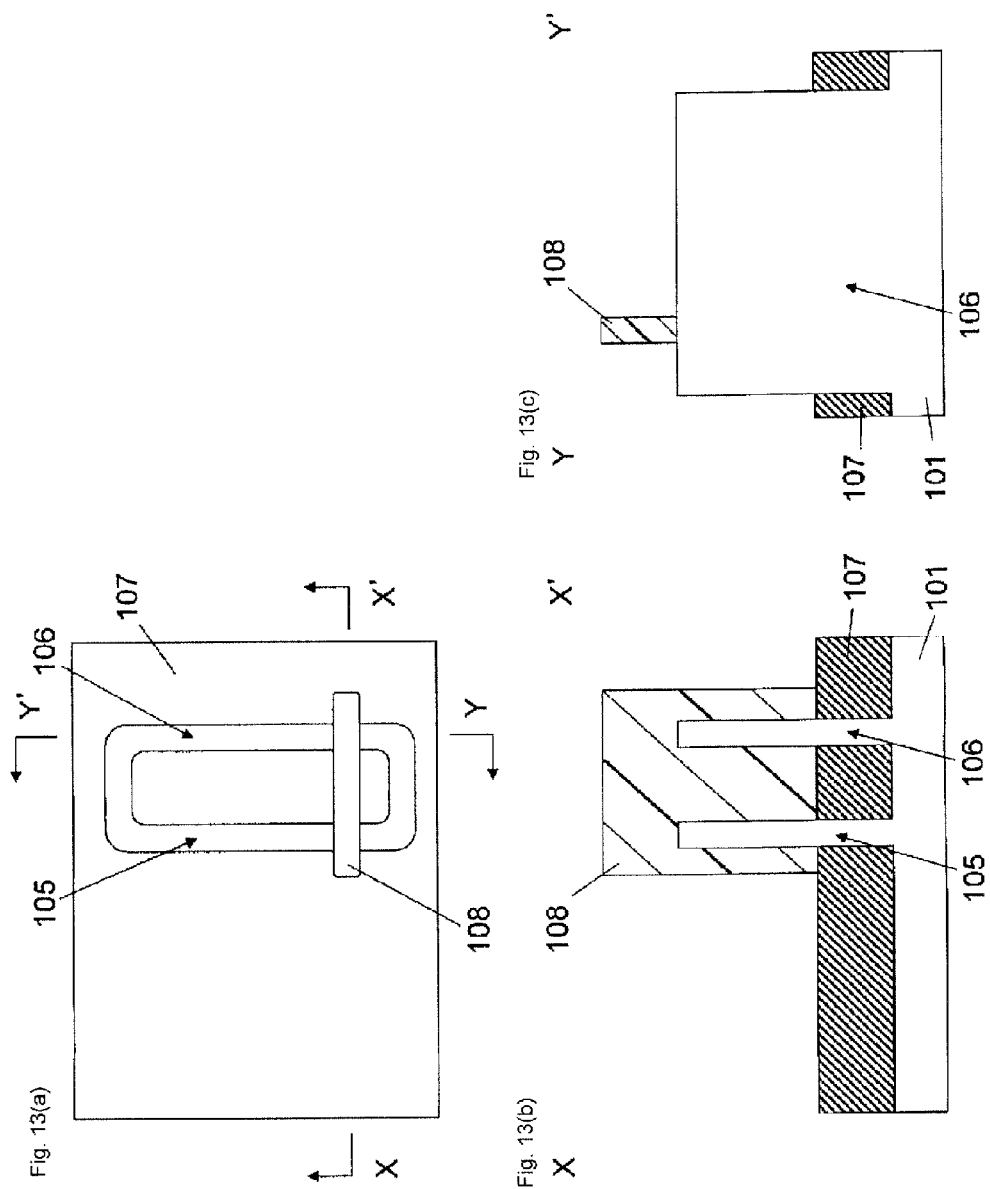

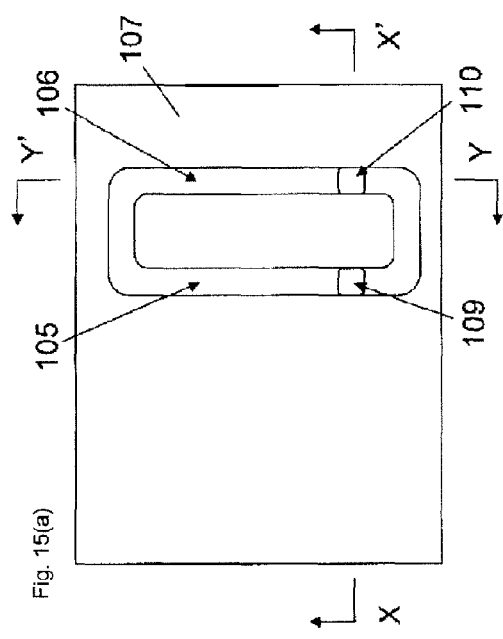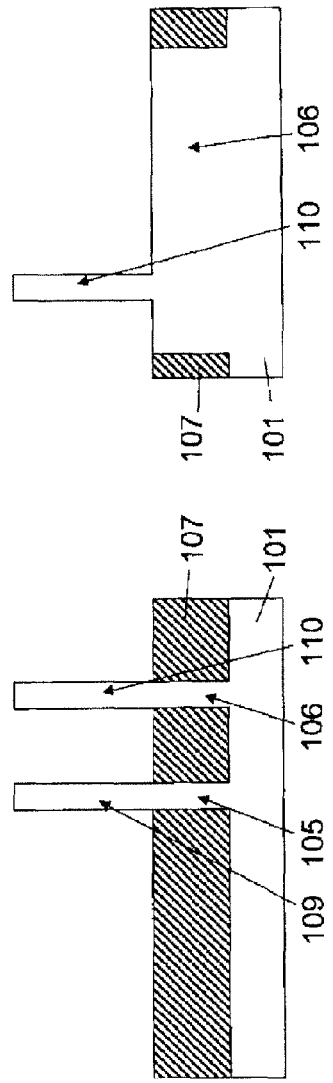
Fig. 15(a)
Fig. 15(b)
Fig. 15(c)

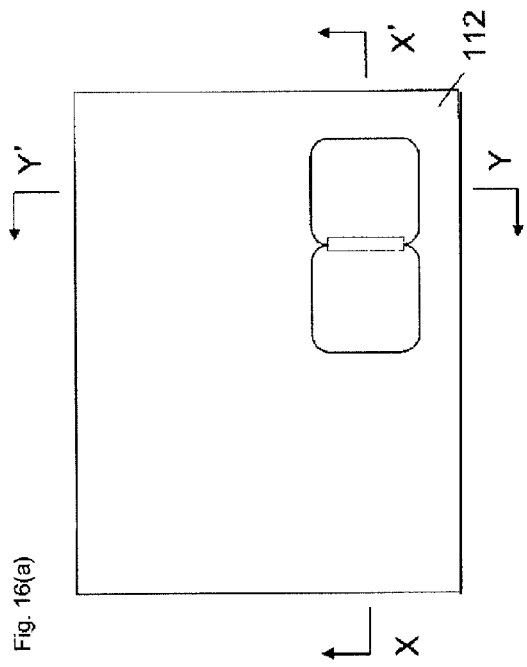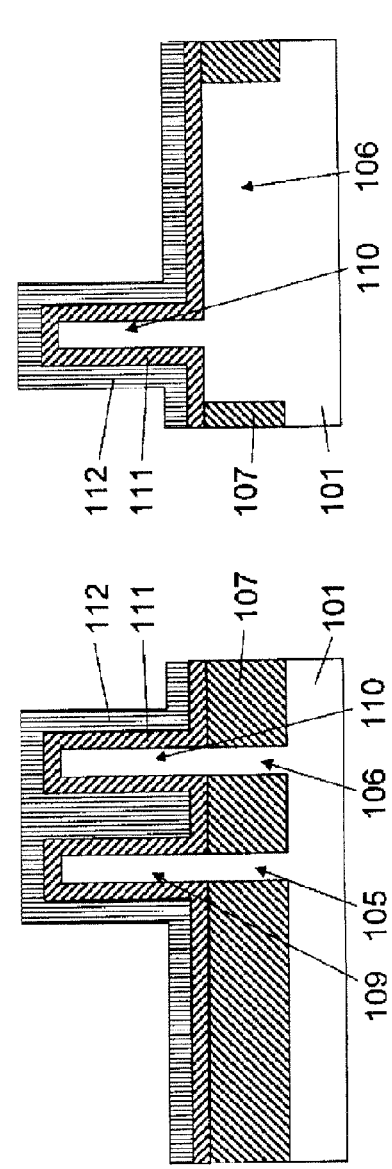
Fig. 16(a)
Fig. 16(b)
Fig. 16(c)

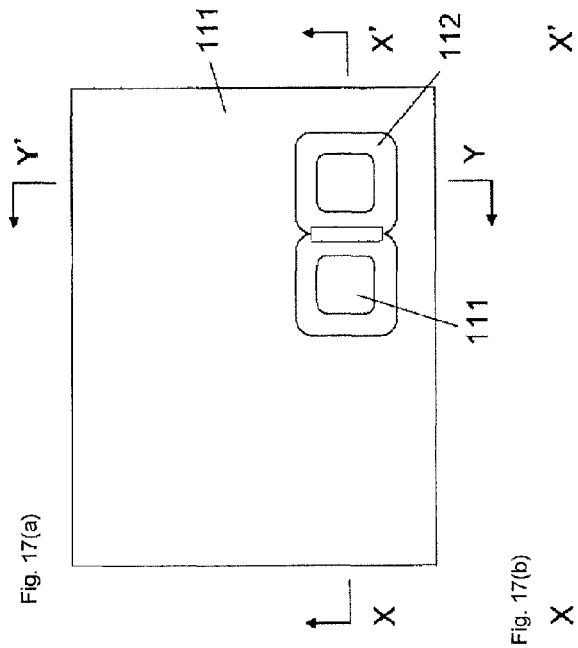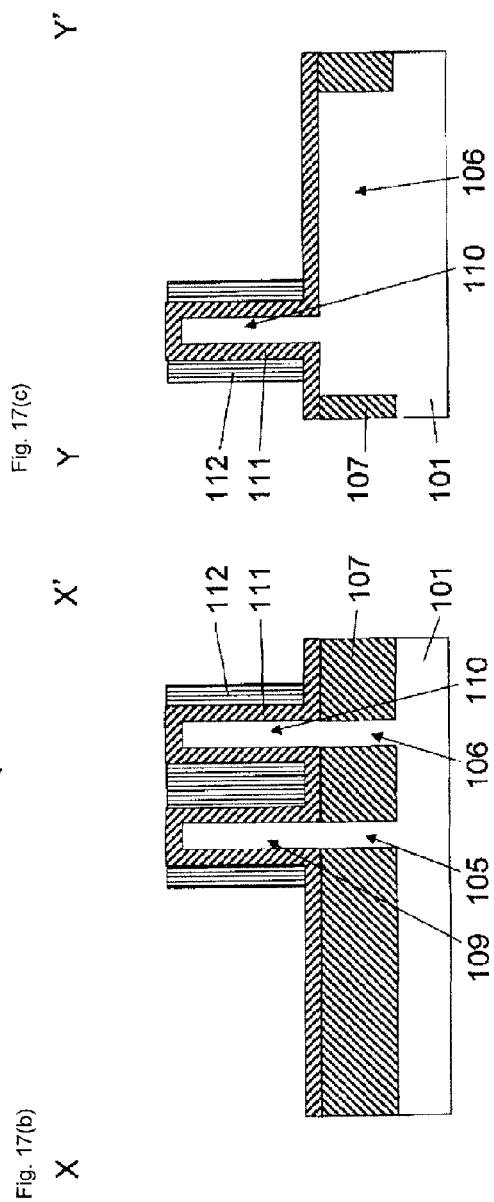
Fig. 17(a)
Fig. 17(b)
Fig. 17(c)

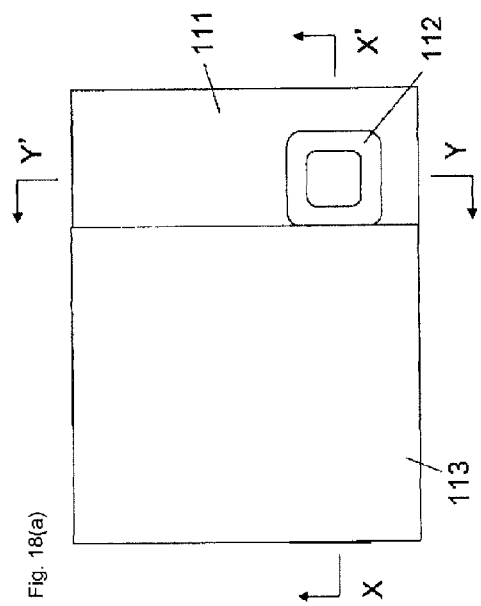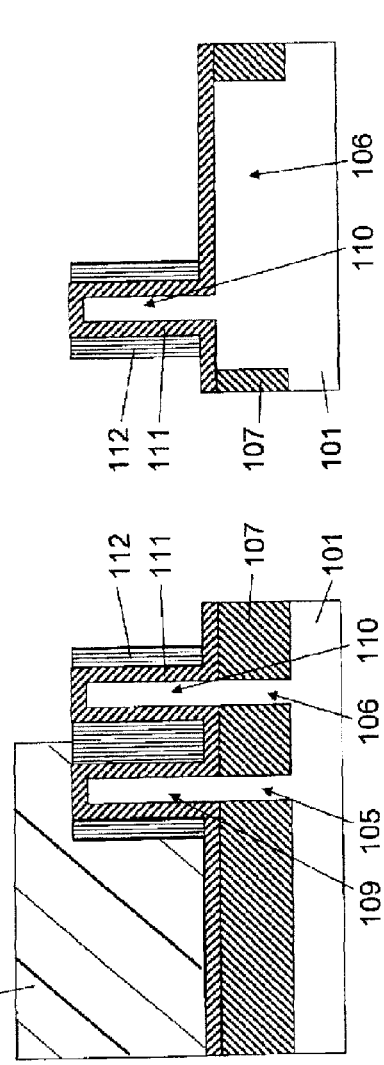

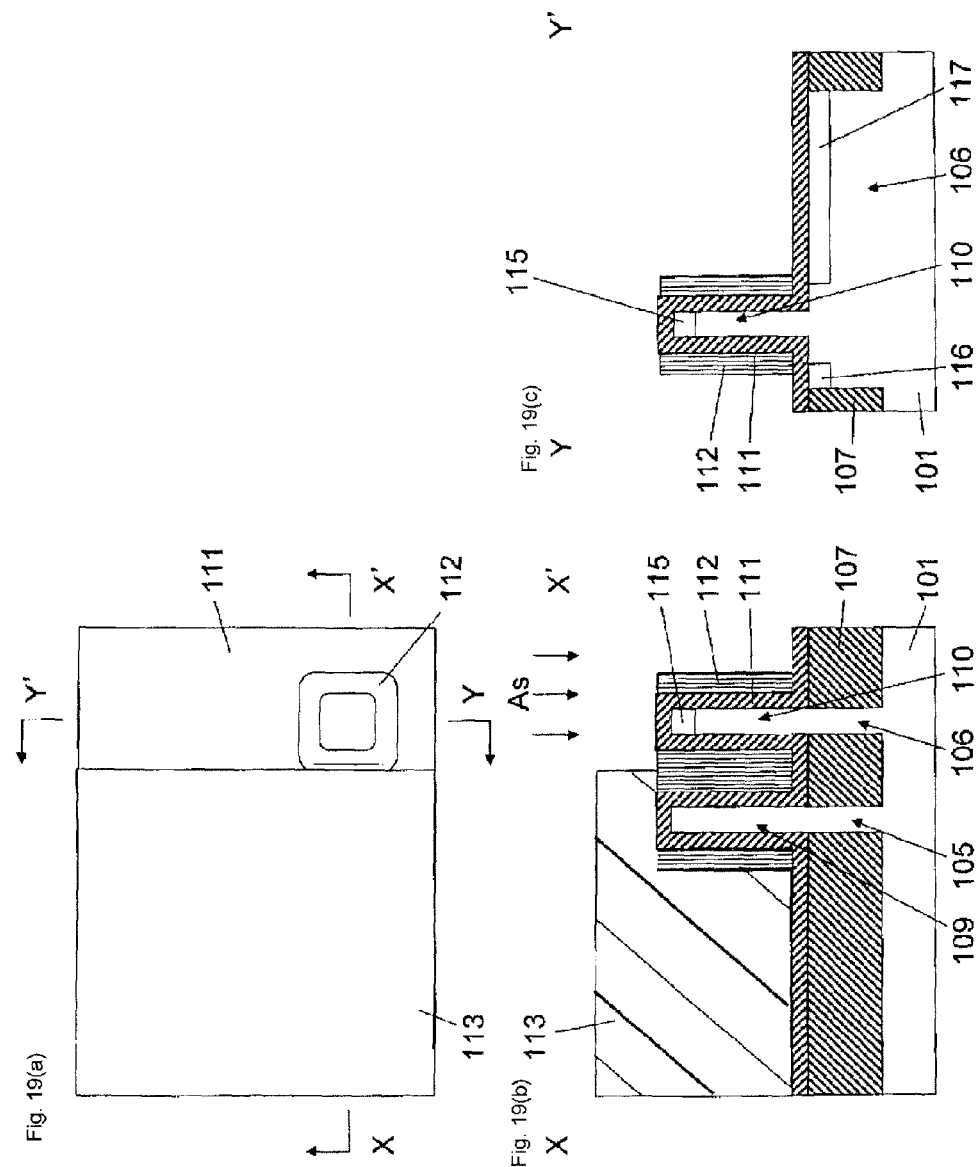

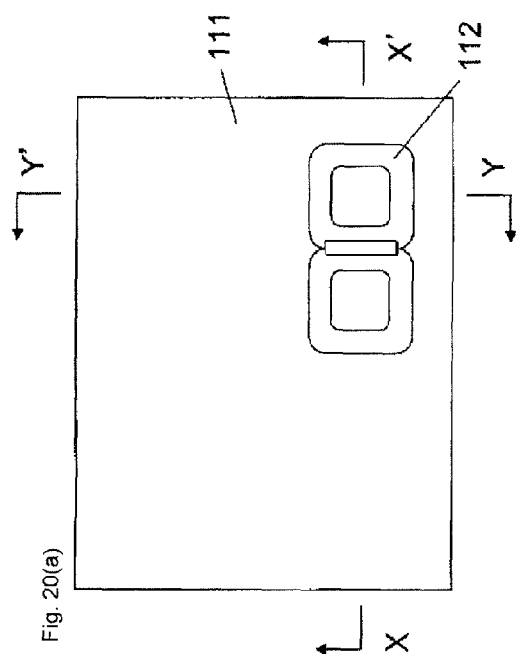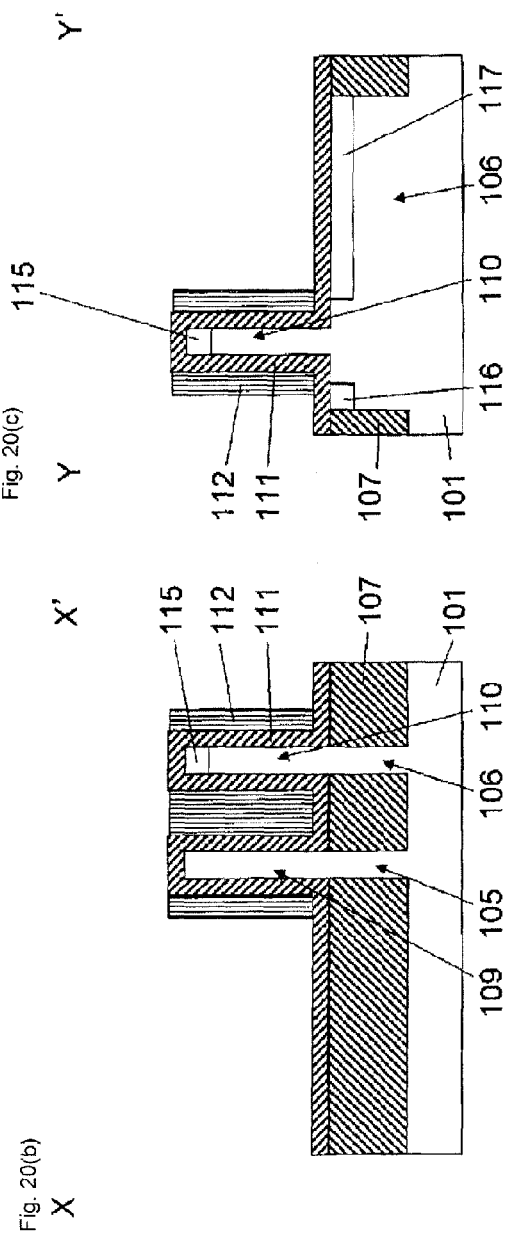

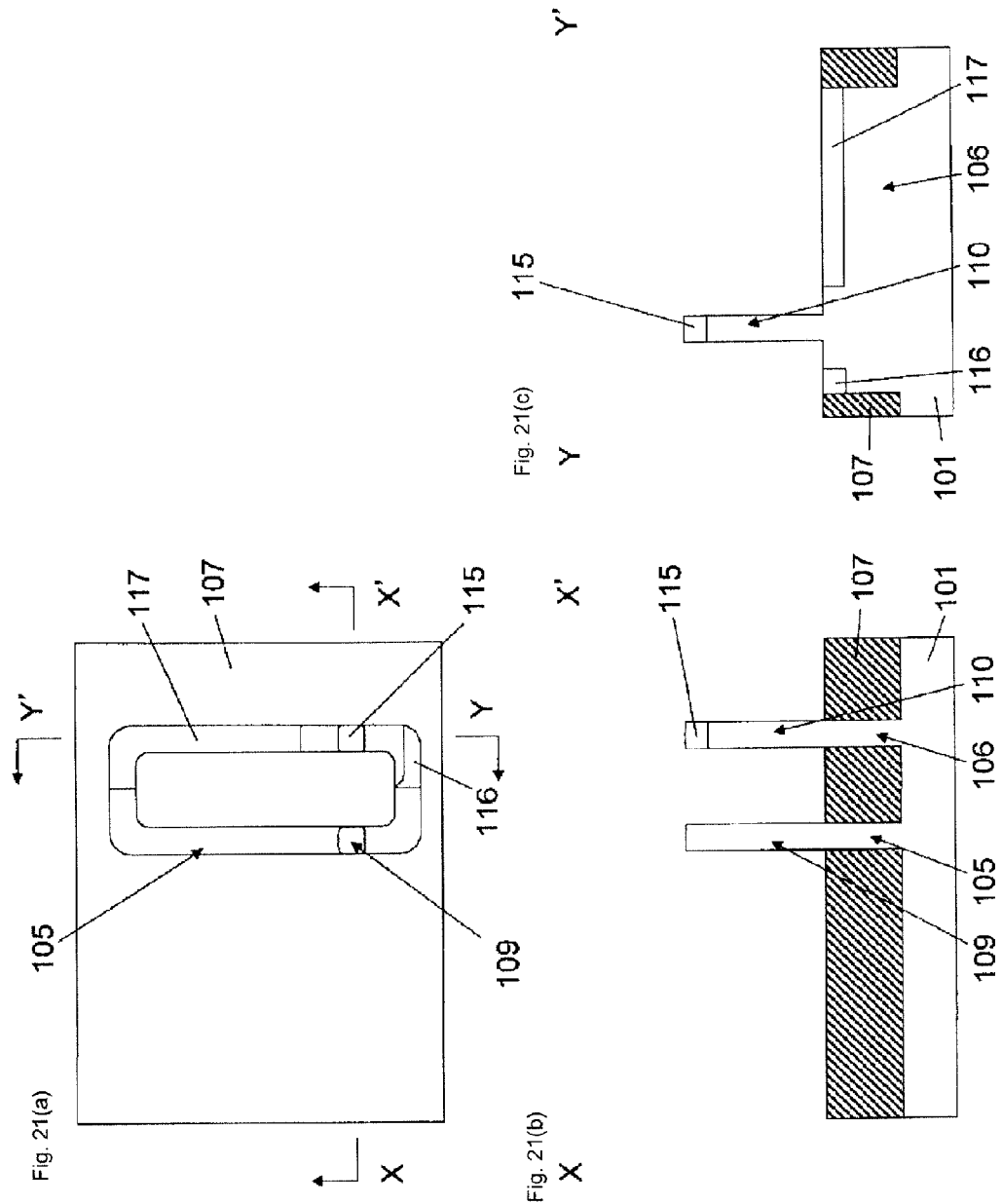

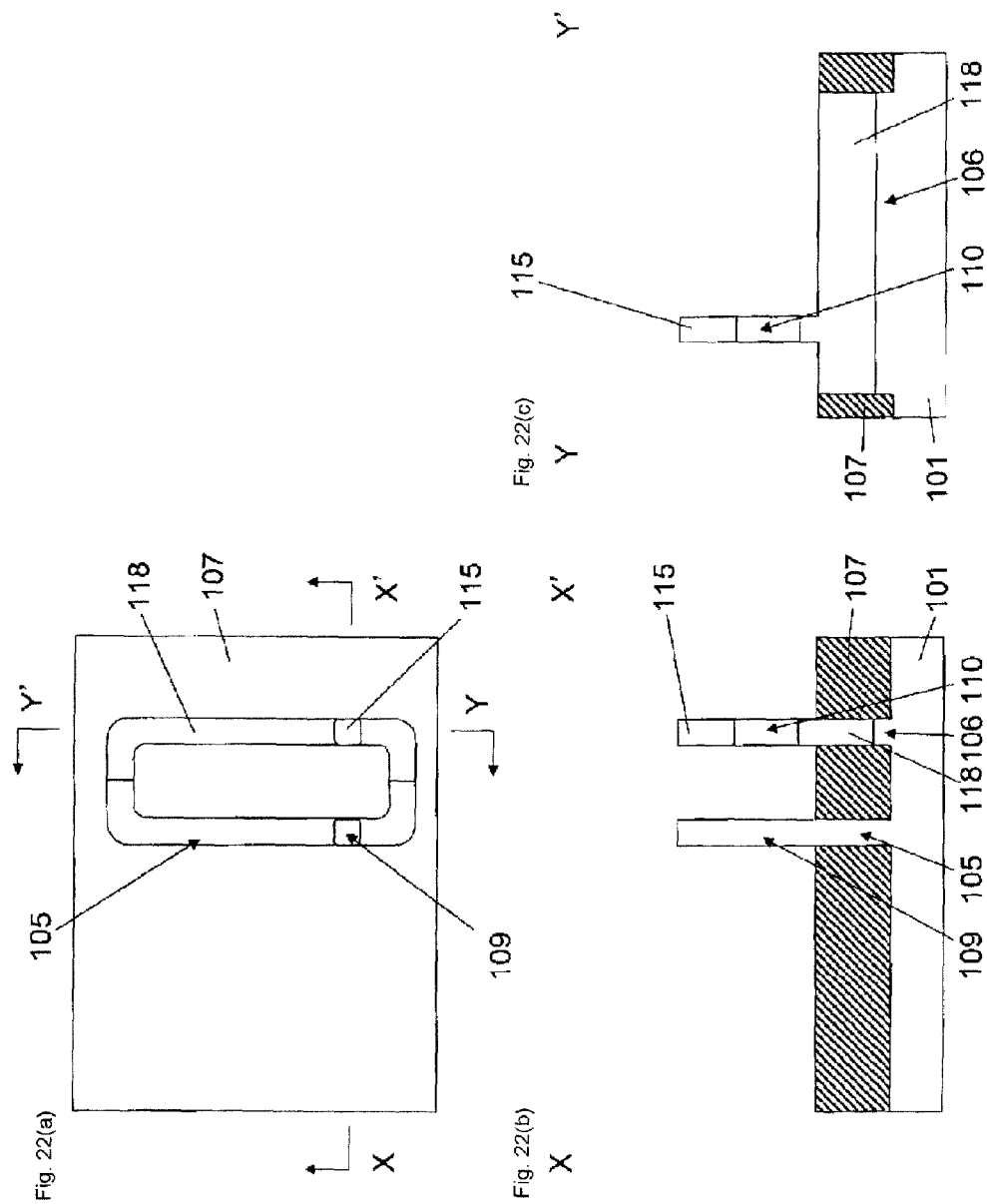

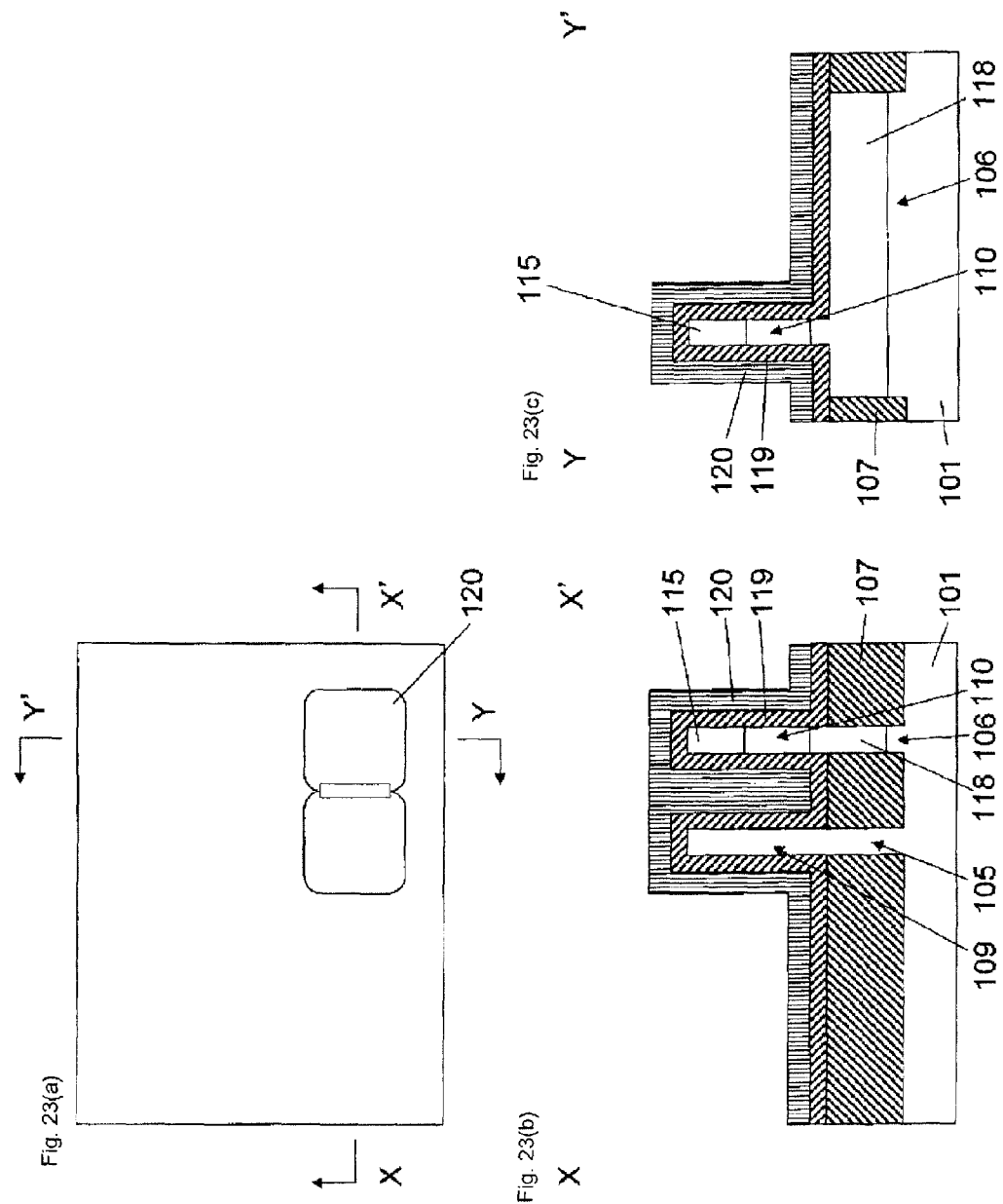

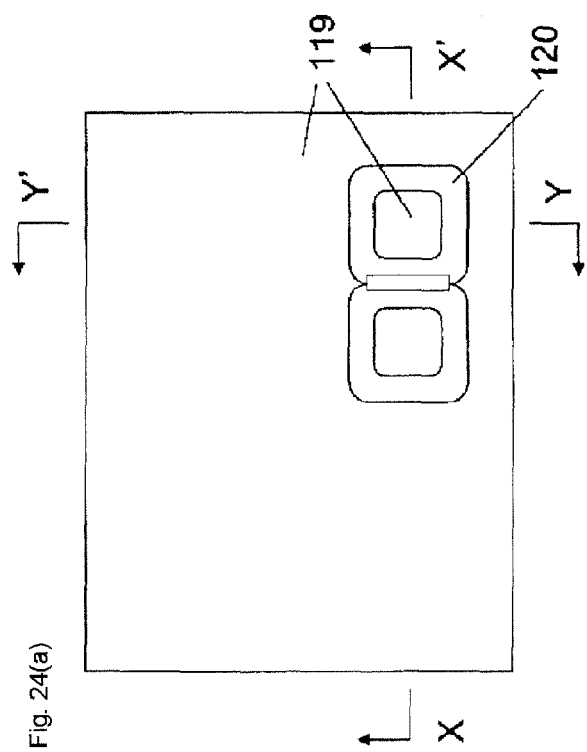
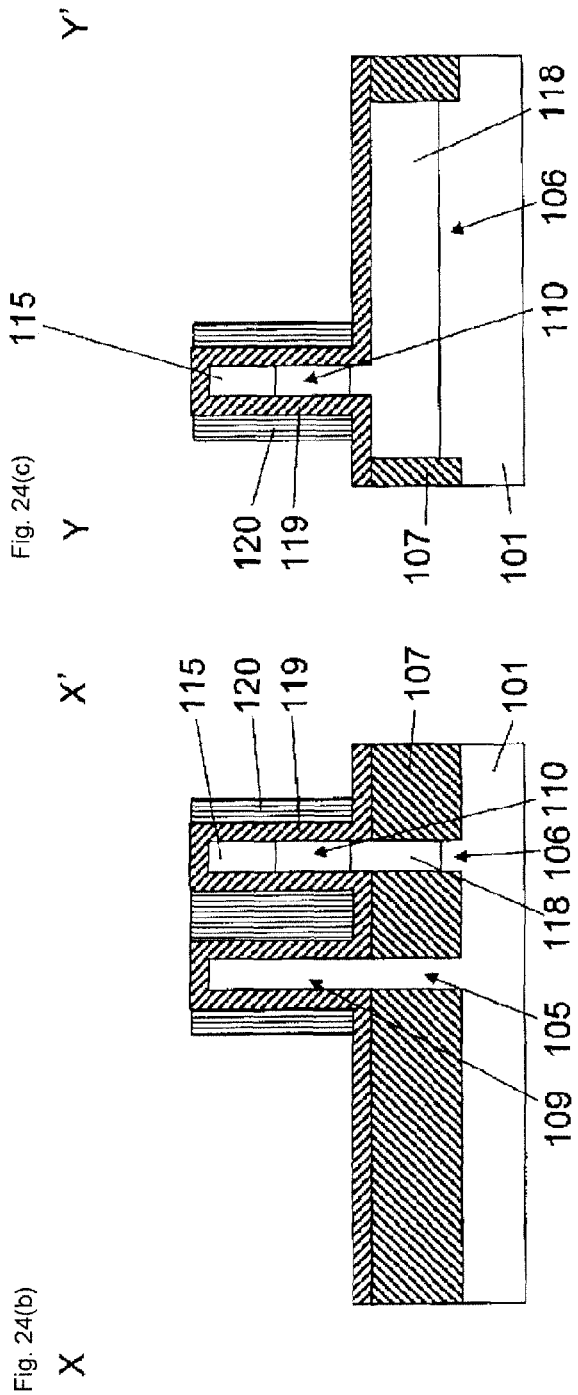
Fig. 24(a)
Fig. 24(b)
Fig. 24(c)

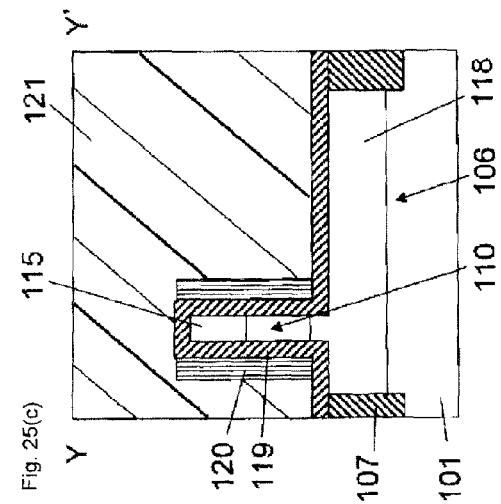
Fig. 25(a)
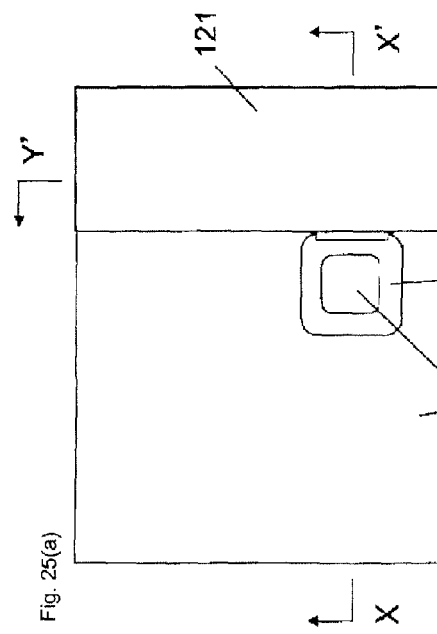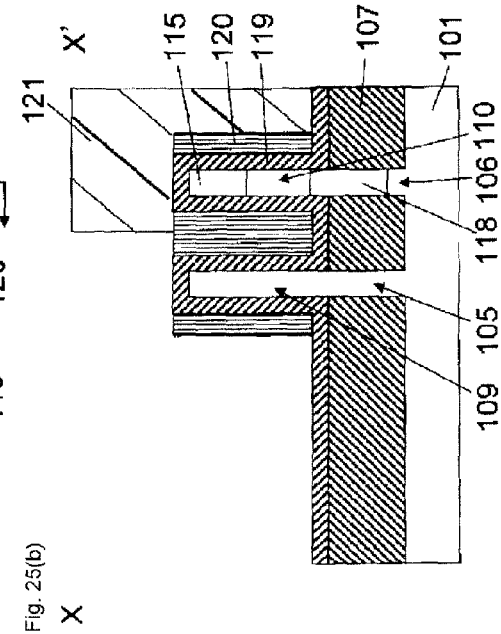
Fig. 25(b)
Fig. 25(c)

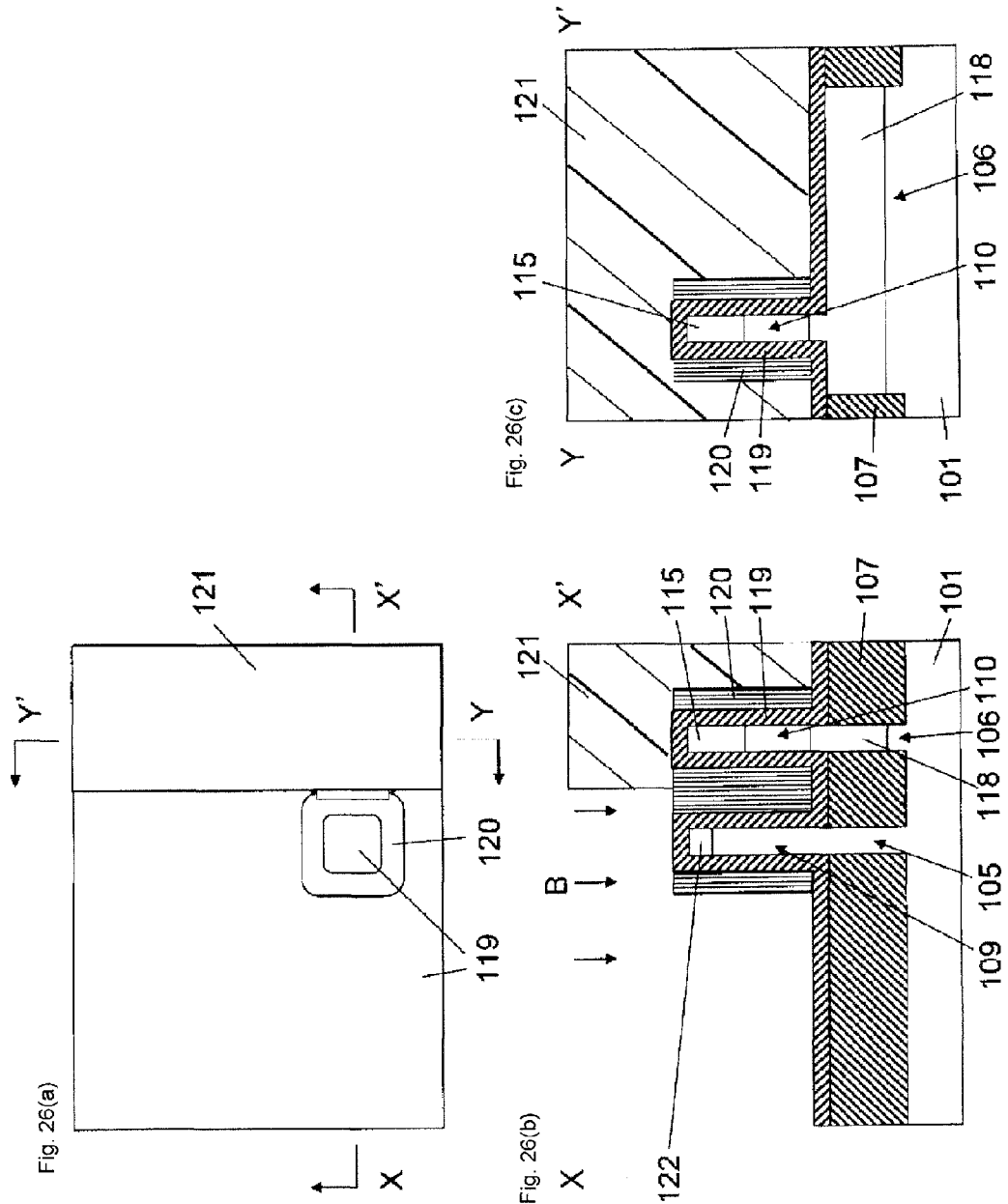

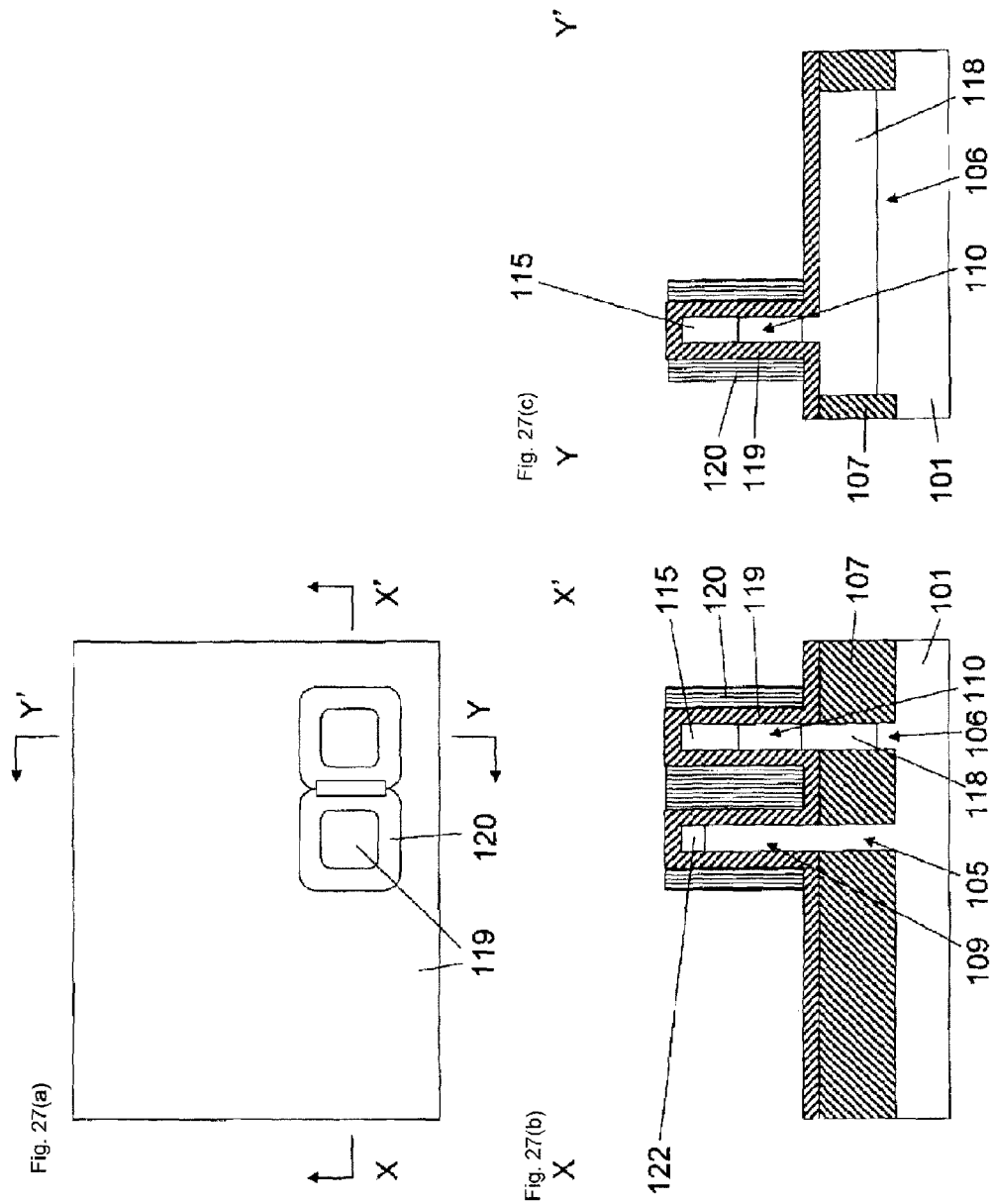

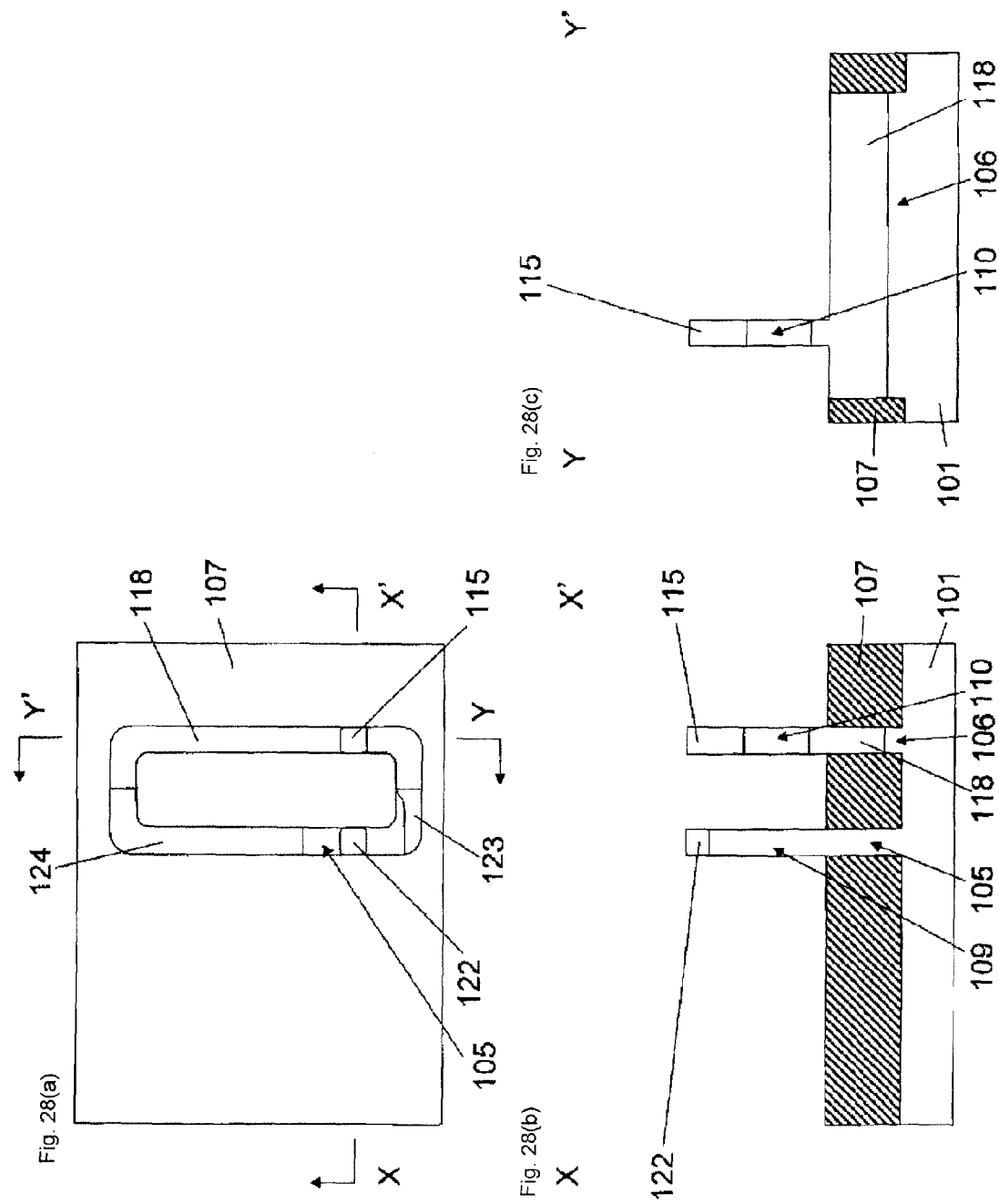

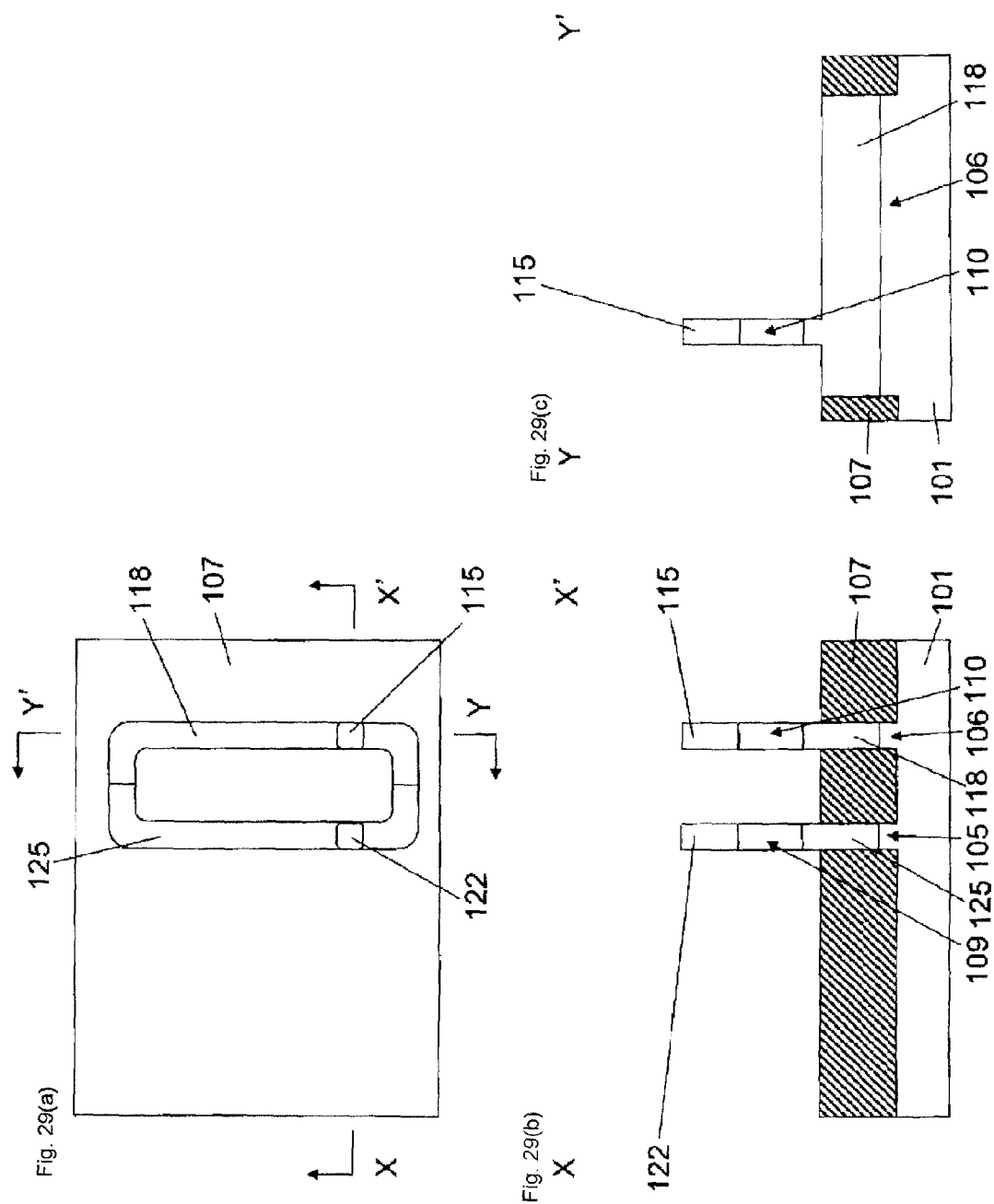

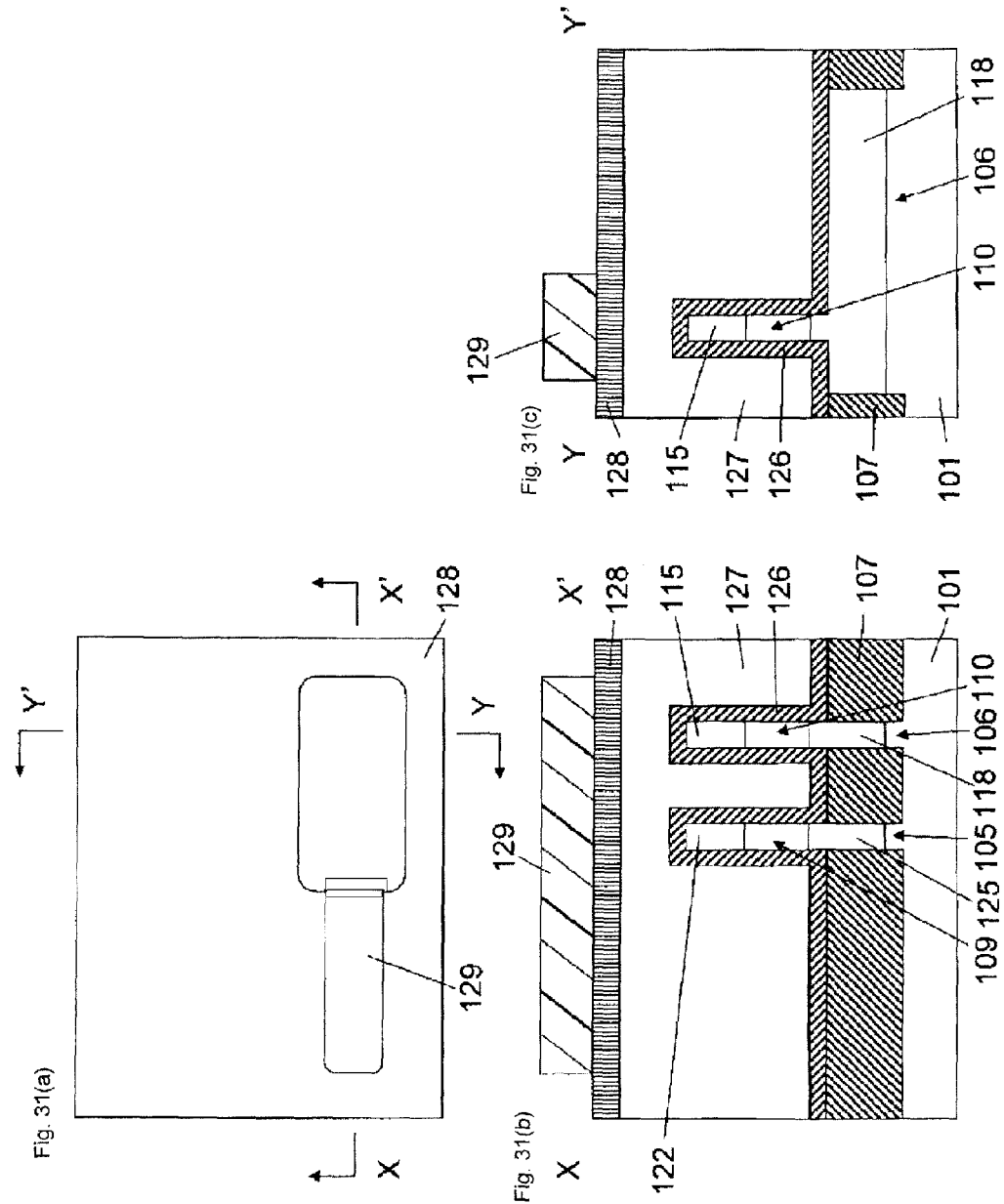

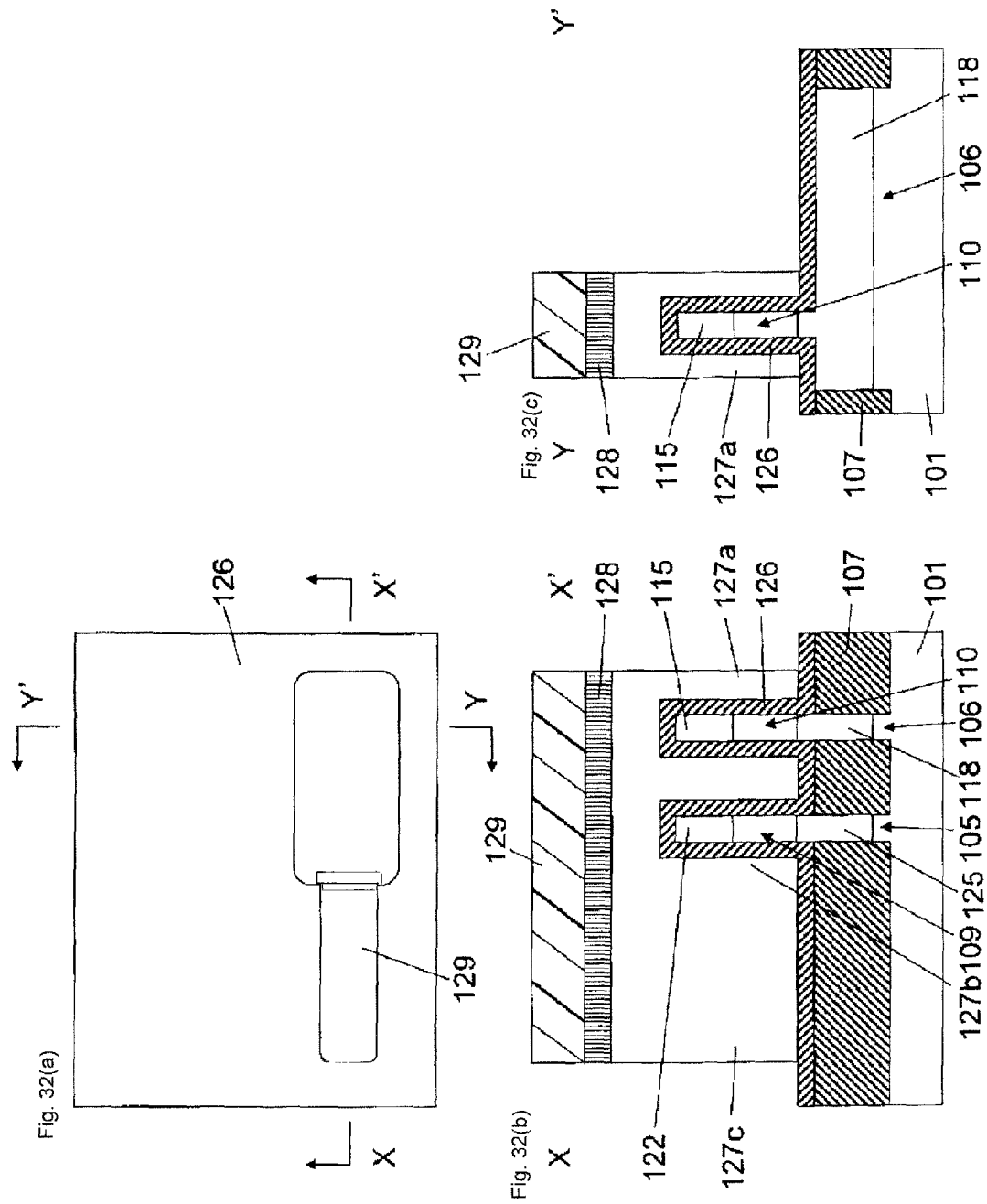

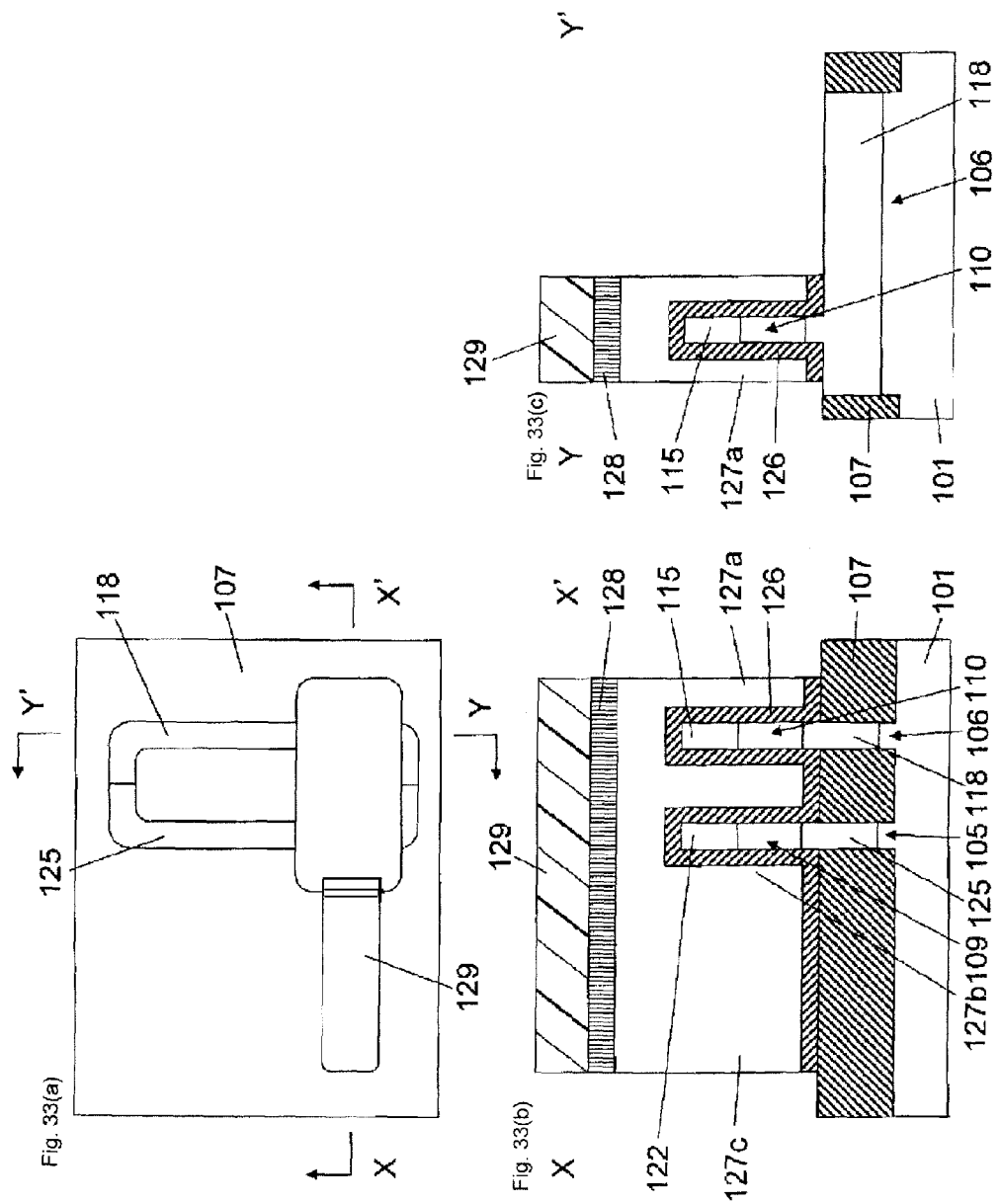

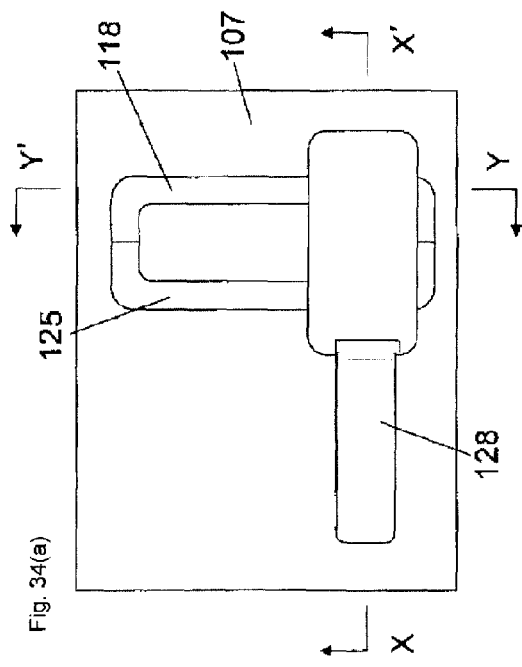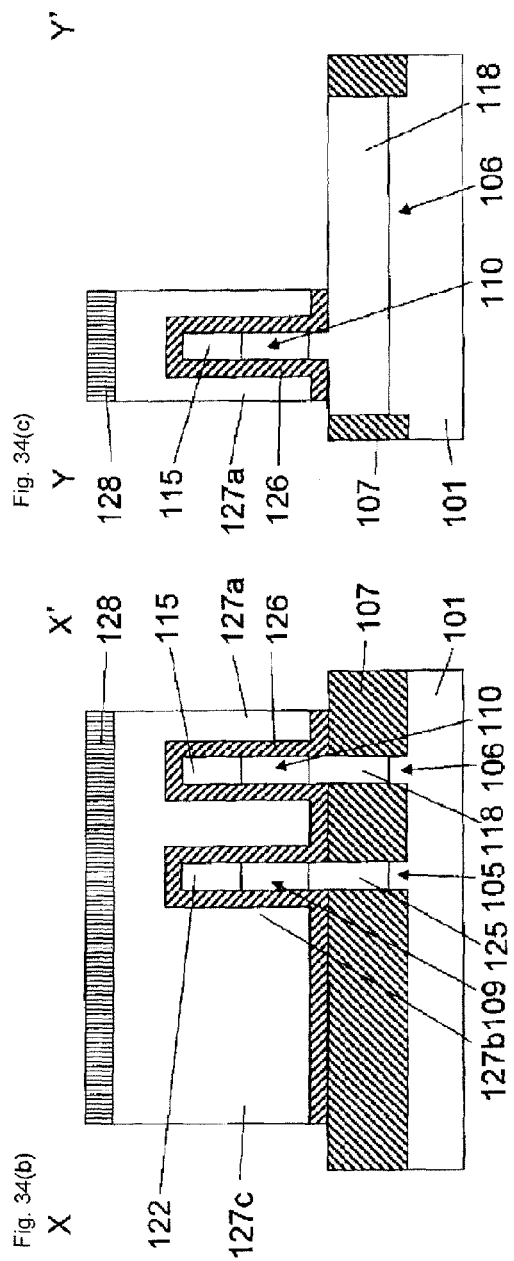

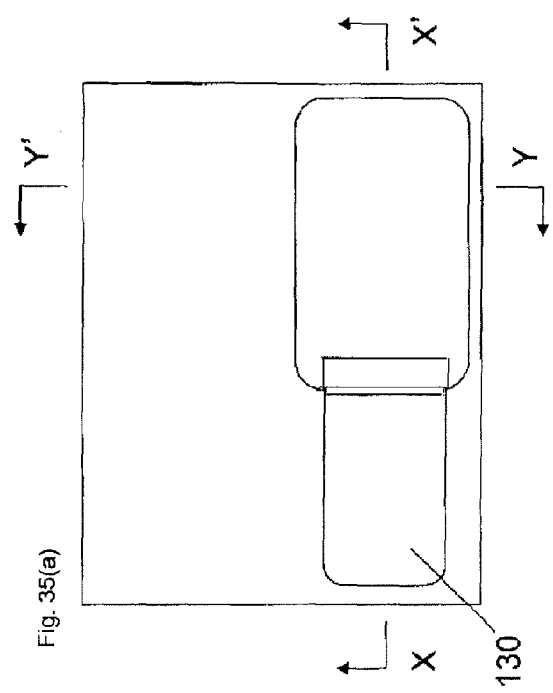
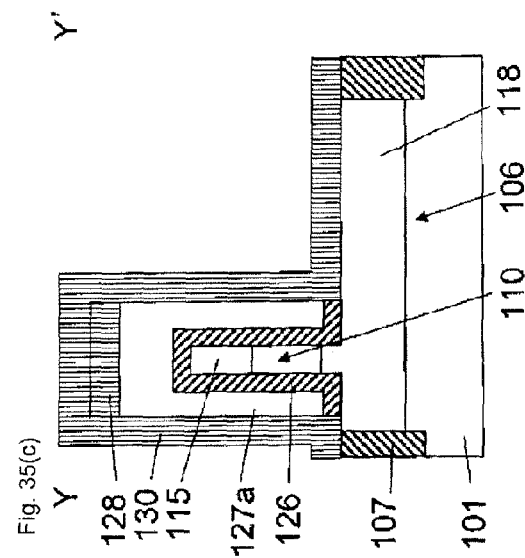
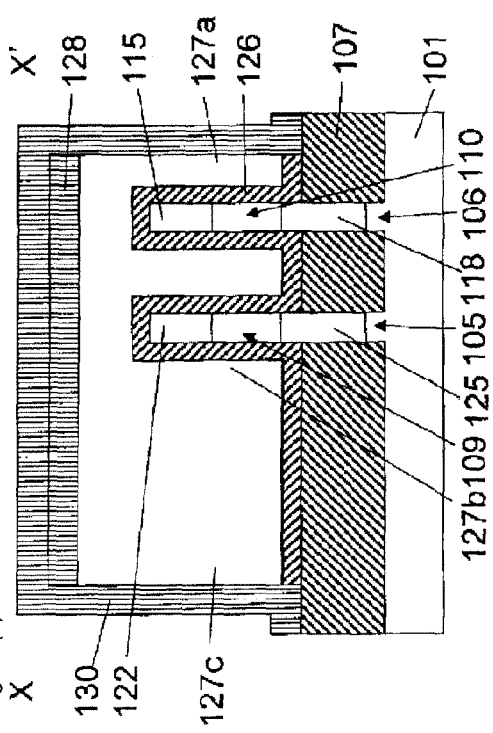

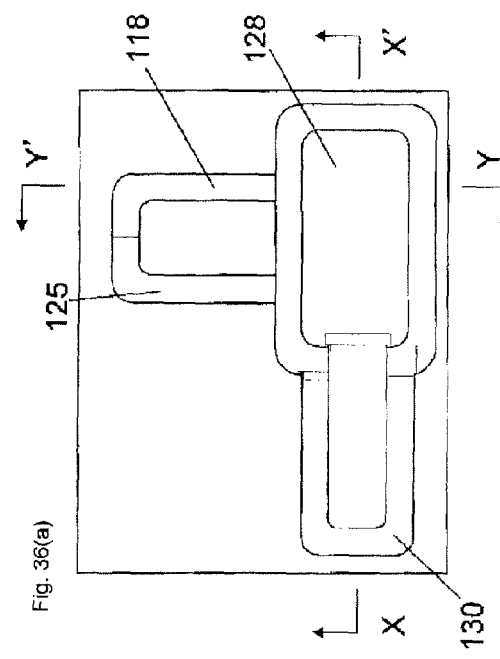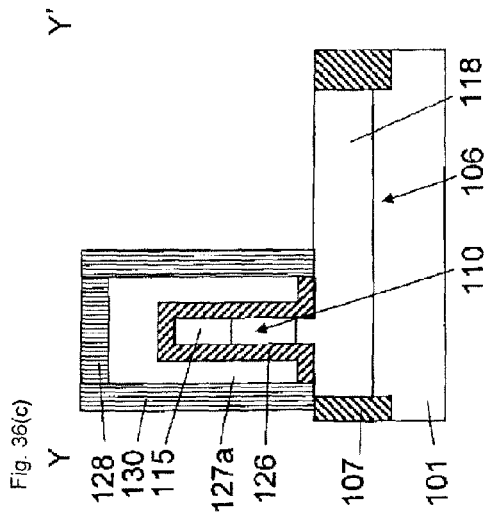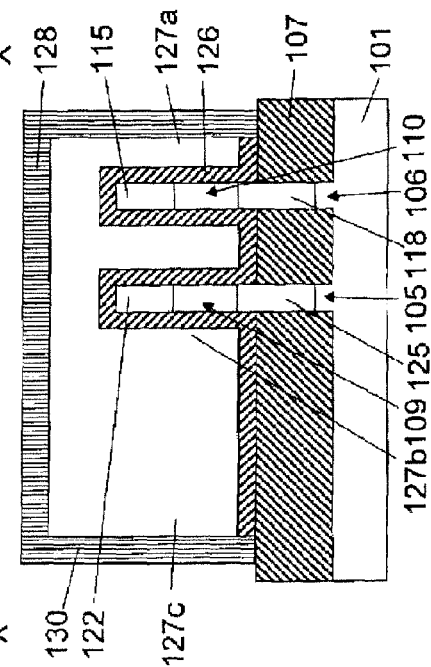

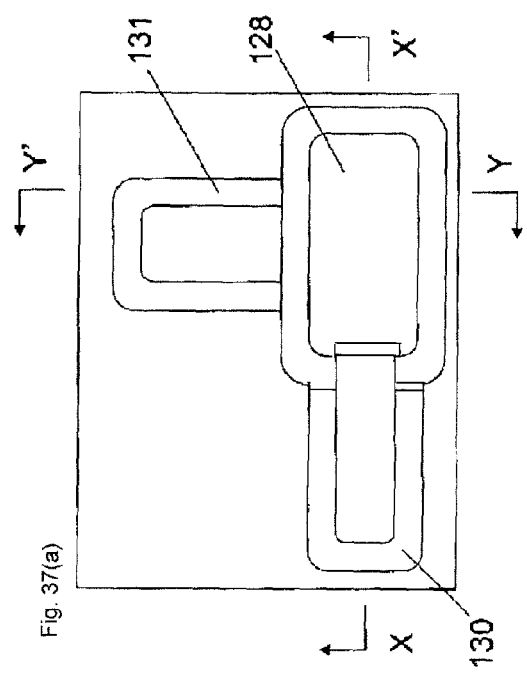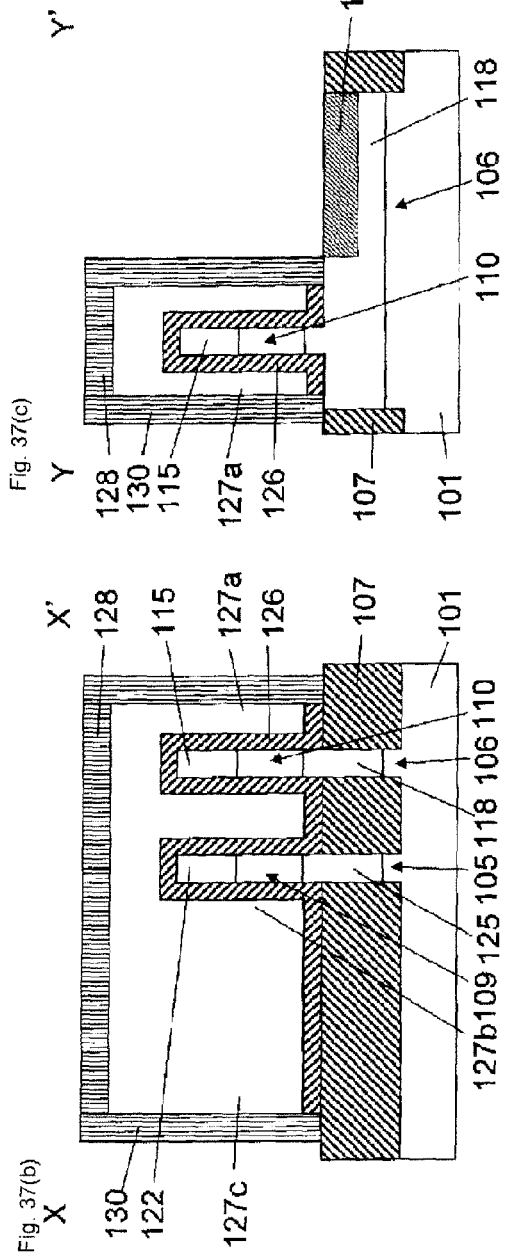

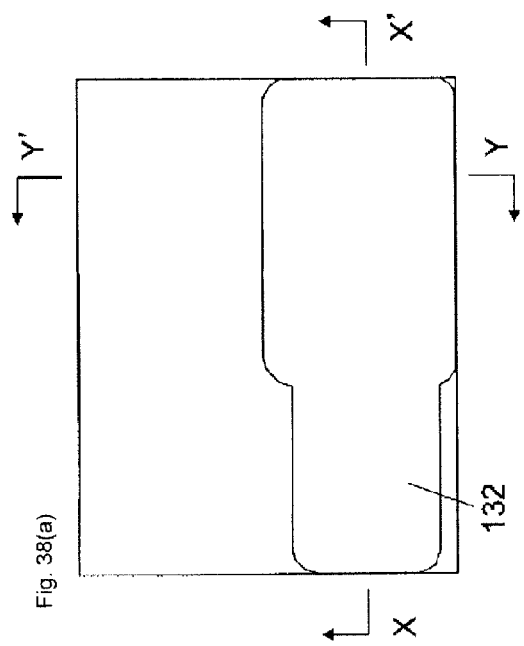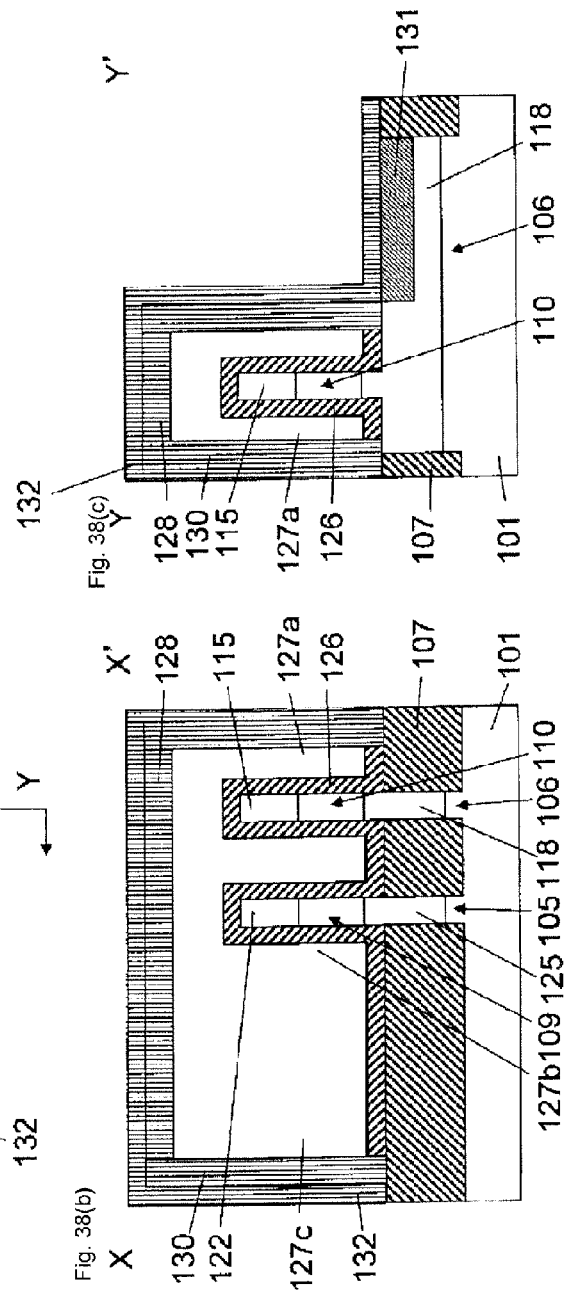

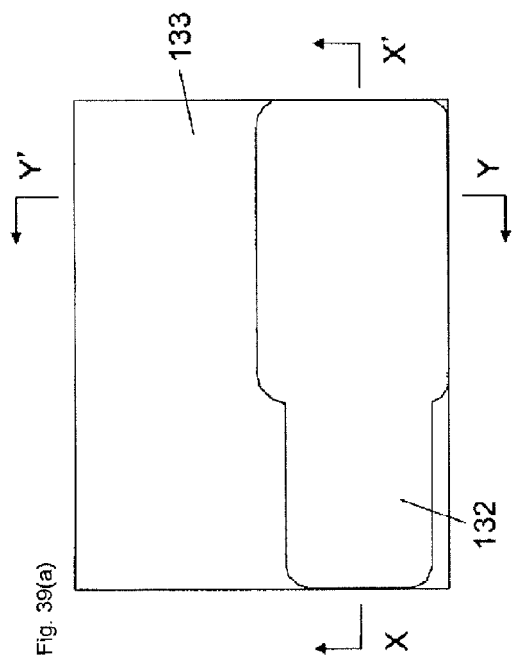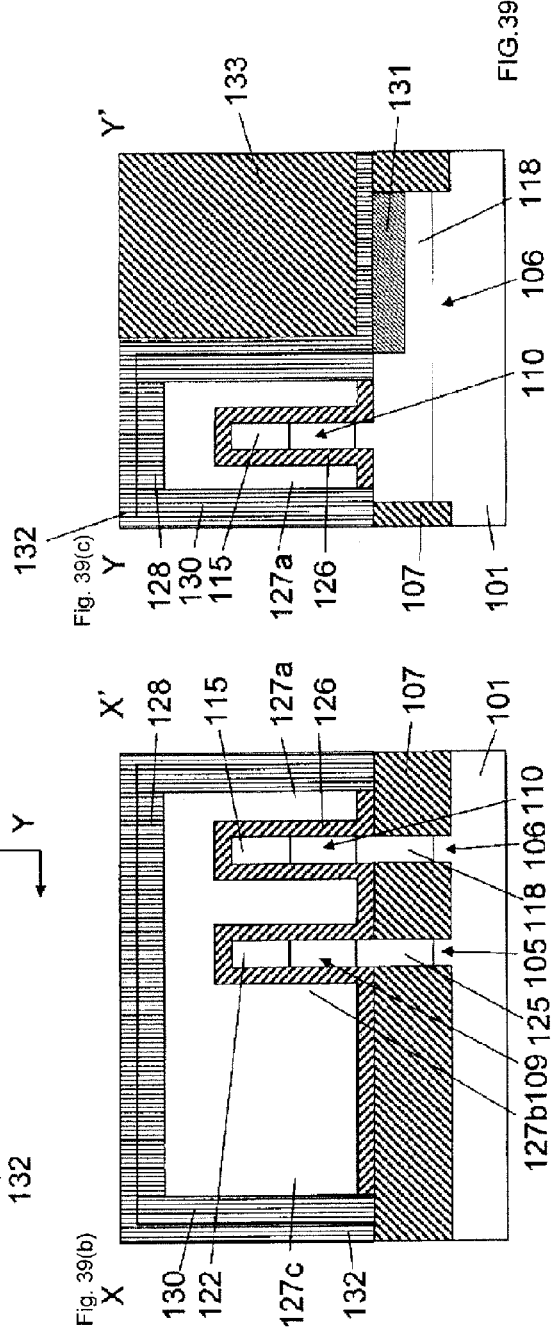

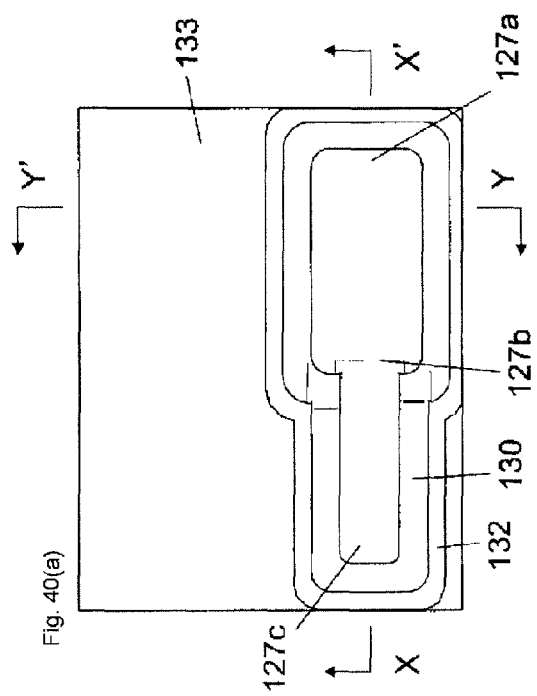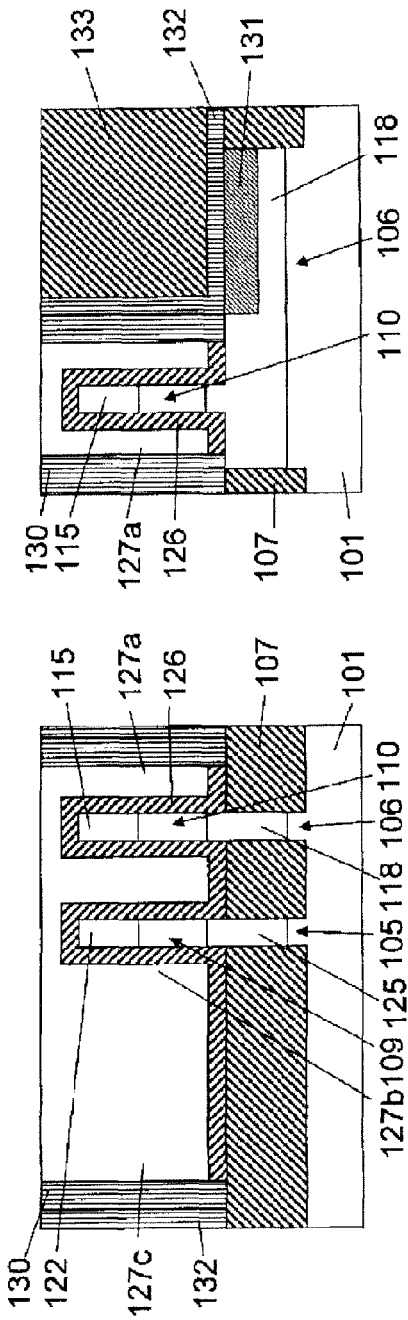

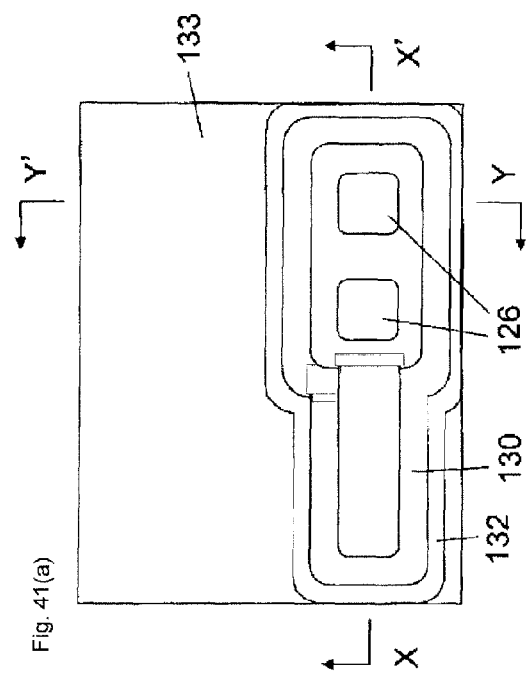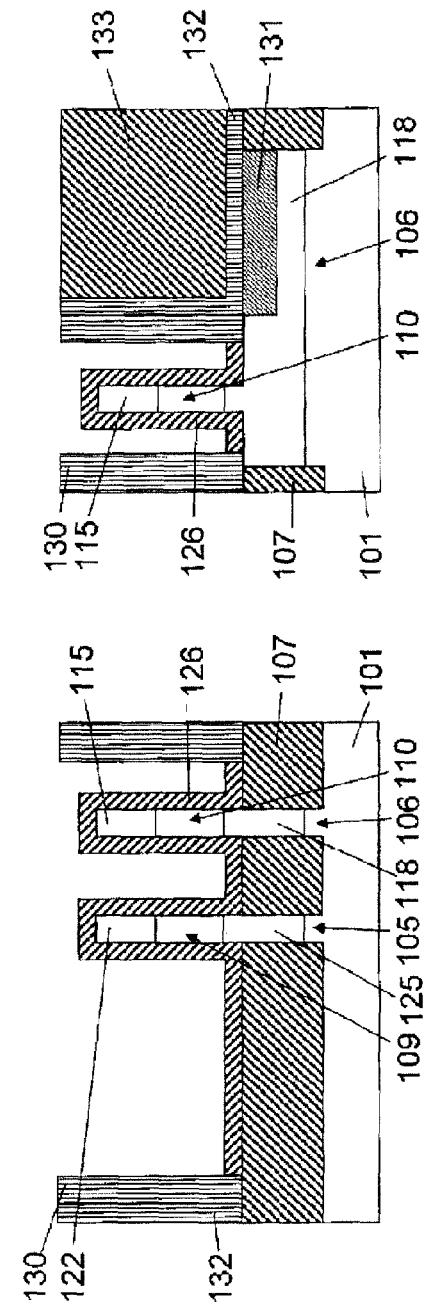

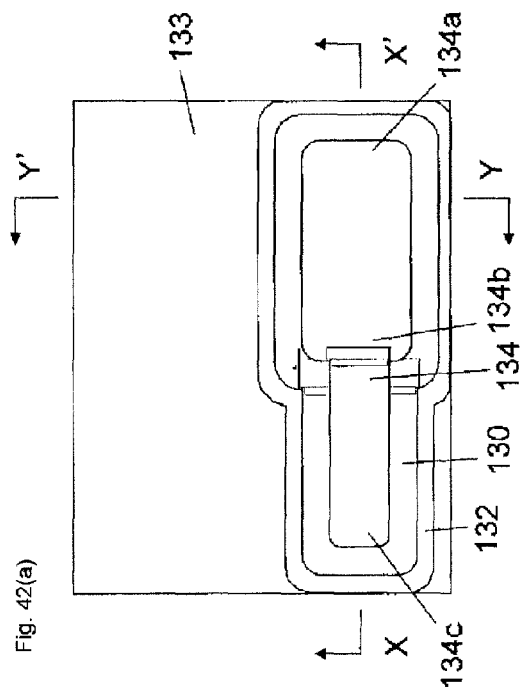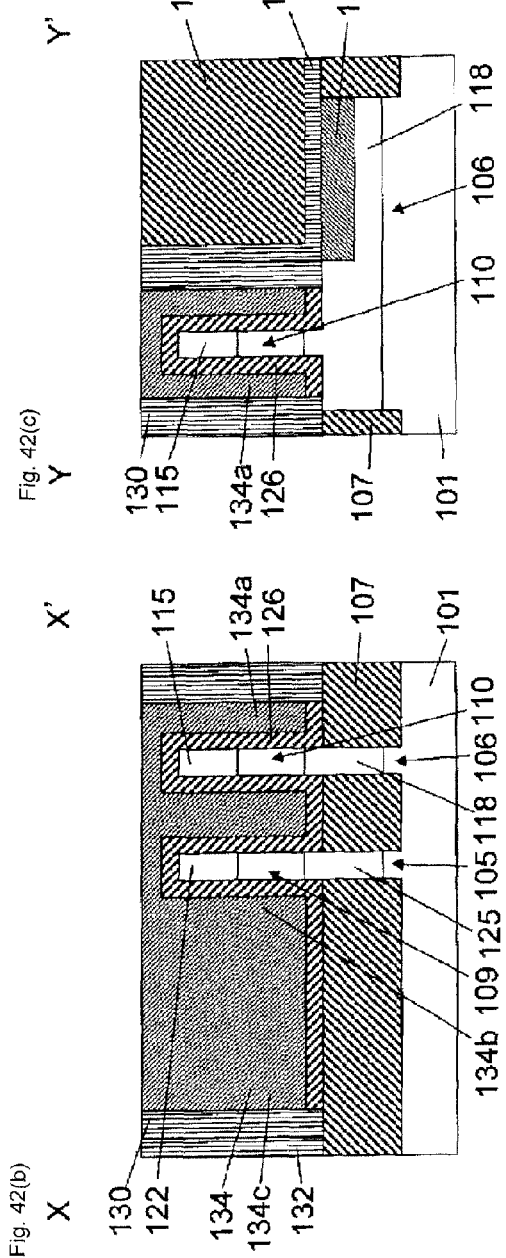

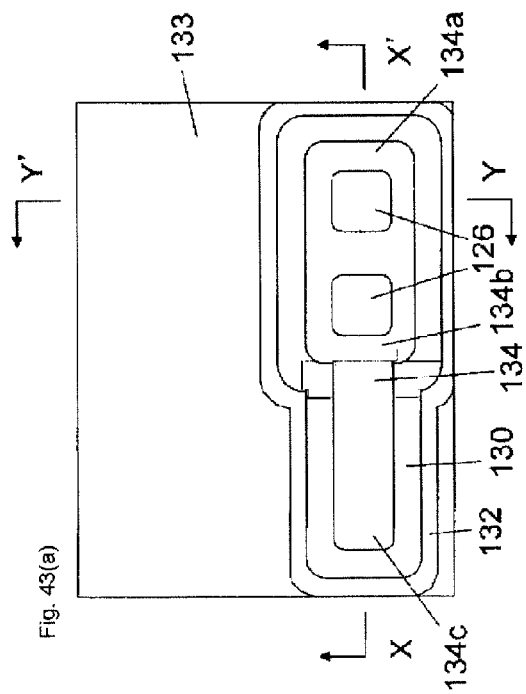
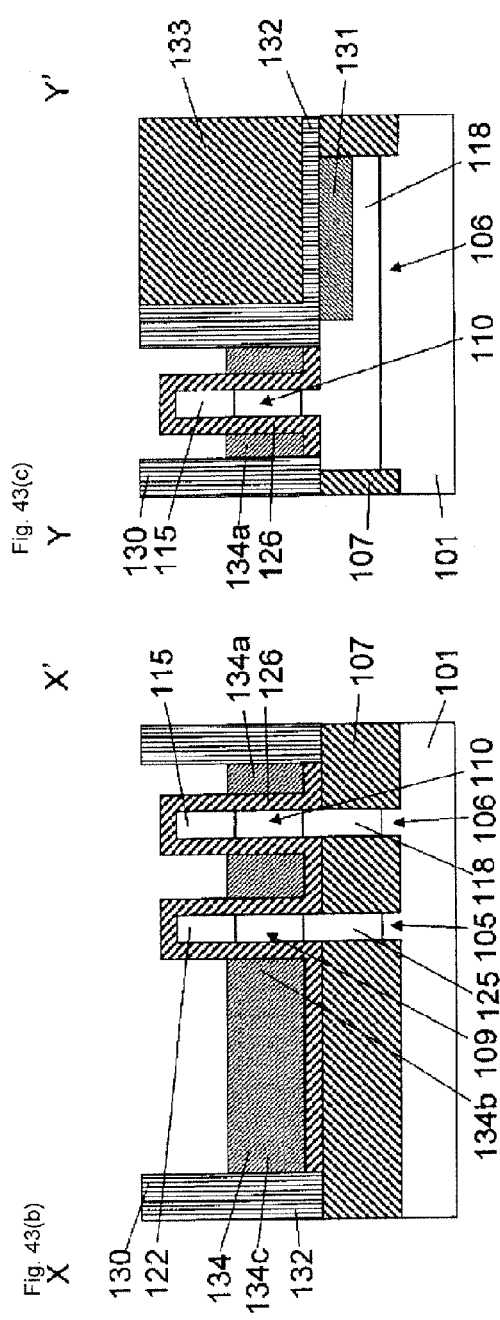
Fig. 43(a)
Fig. 43(b)
Fig. 43(c)

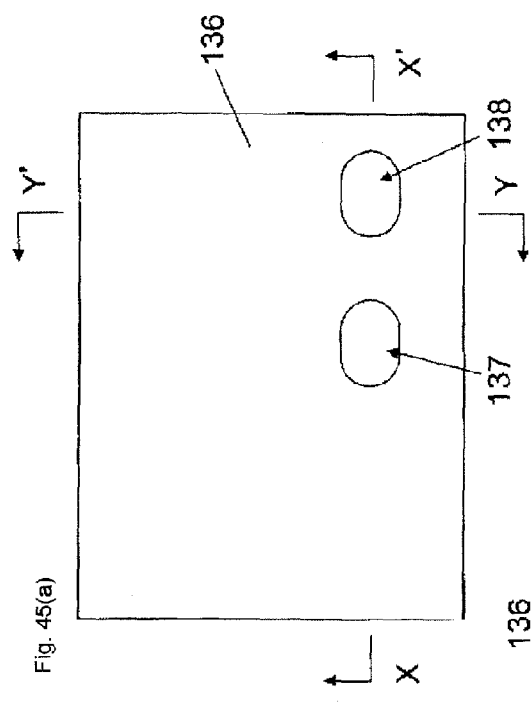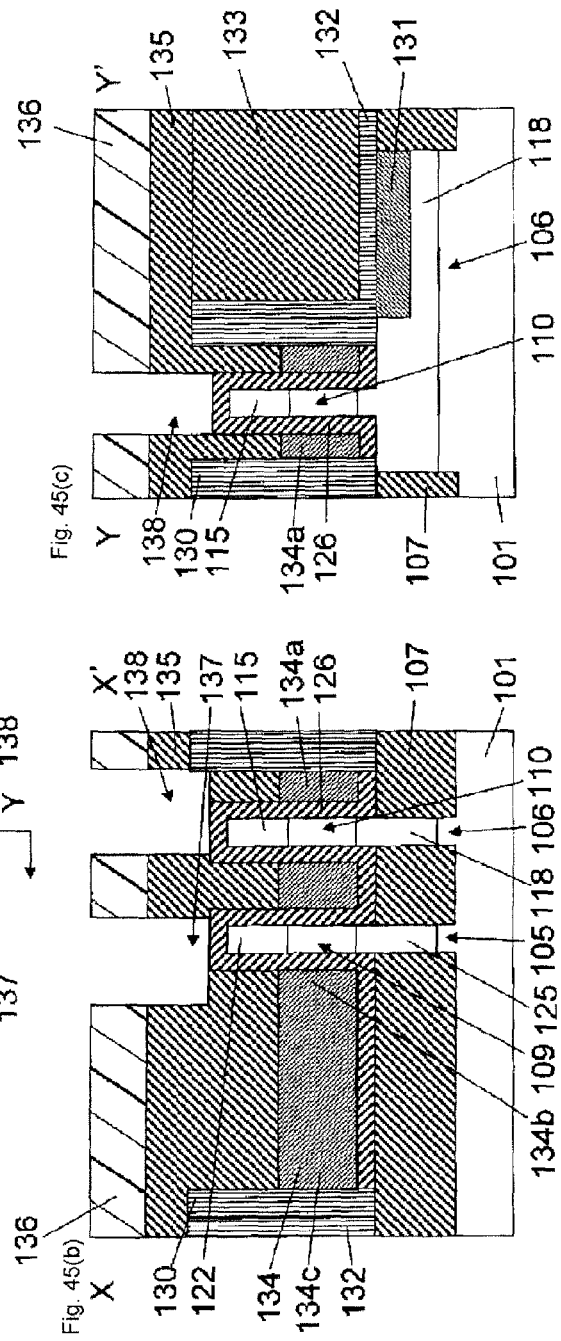

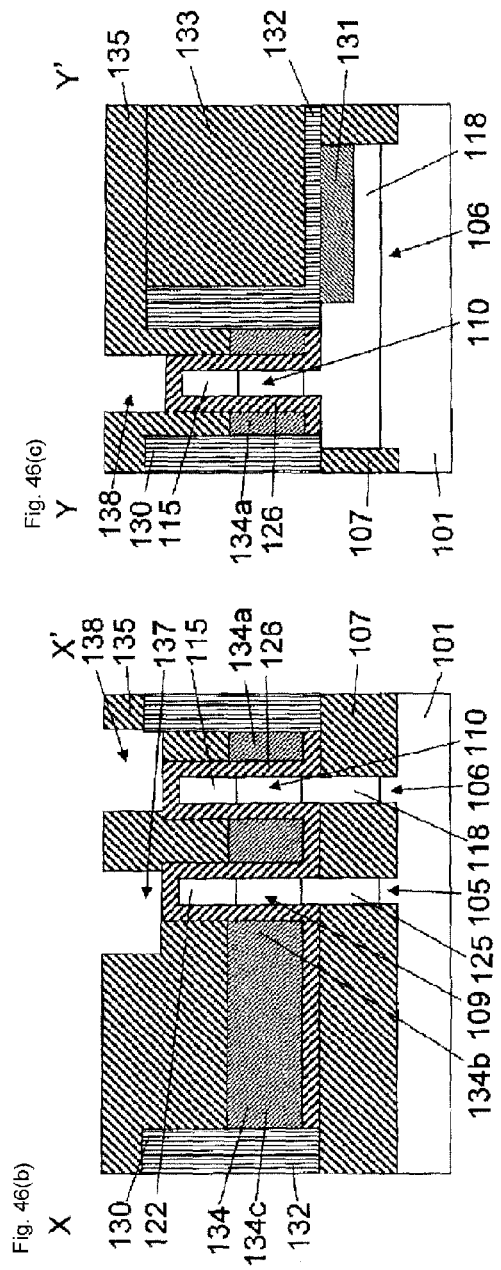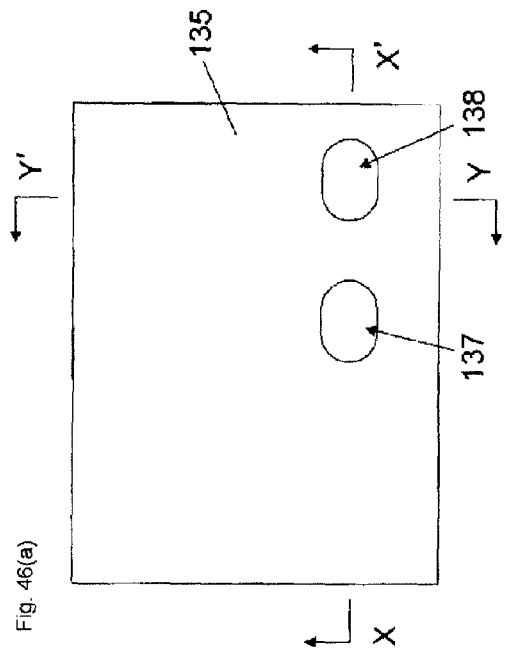

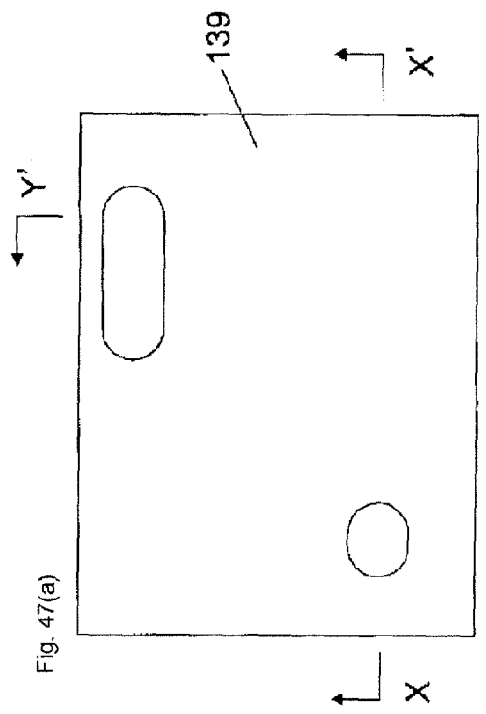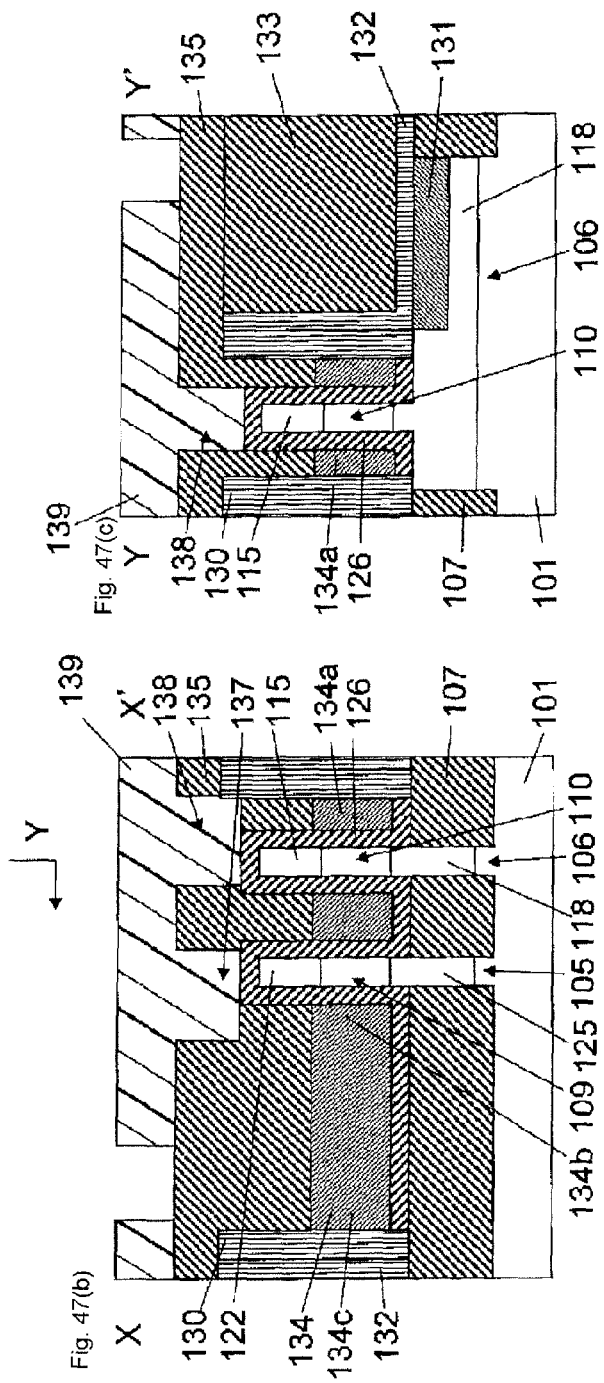
Fig. 47(a)
Fig. 47(b)
Fig. 47(c)

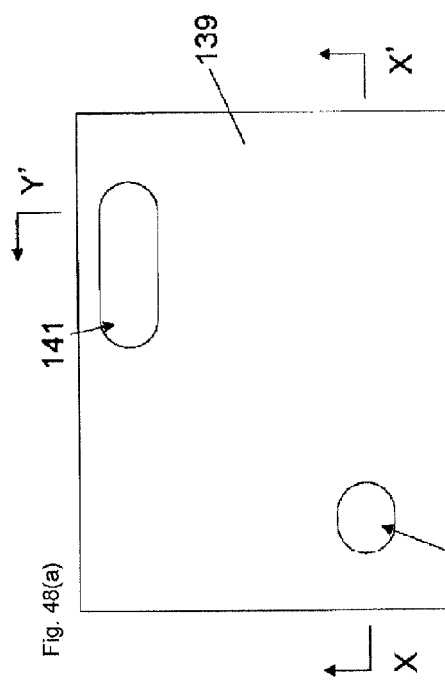
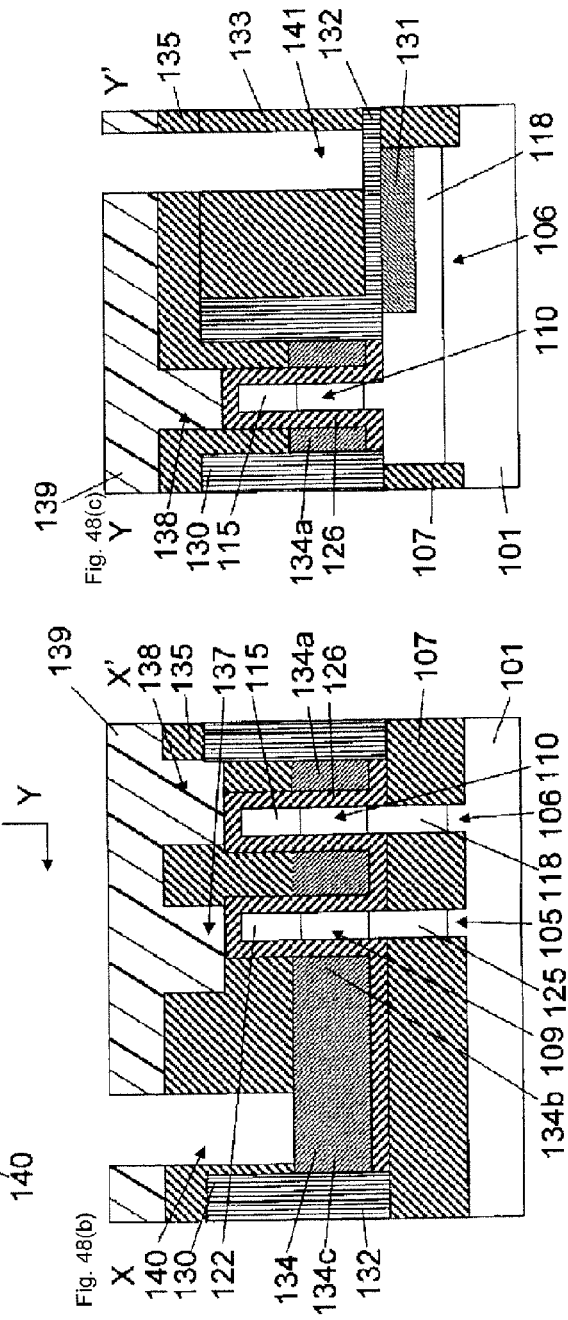
Fig. 48(a)
Fig. 48(b)
Fig. 48(c)

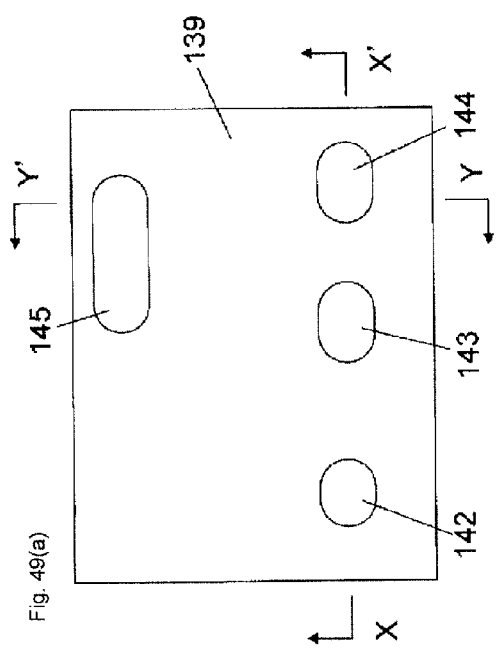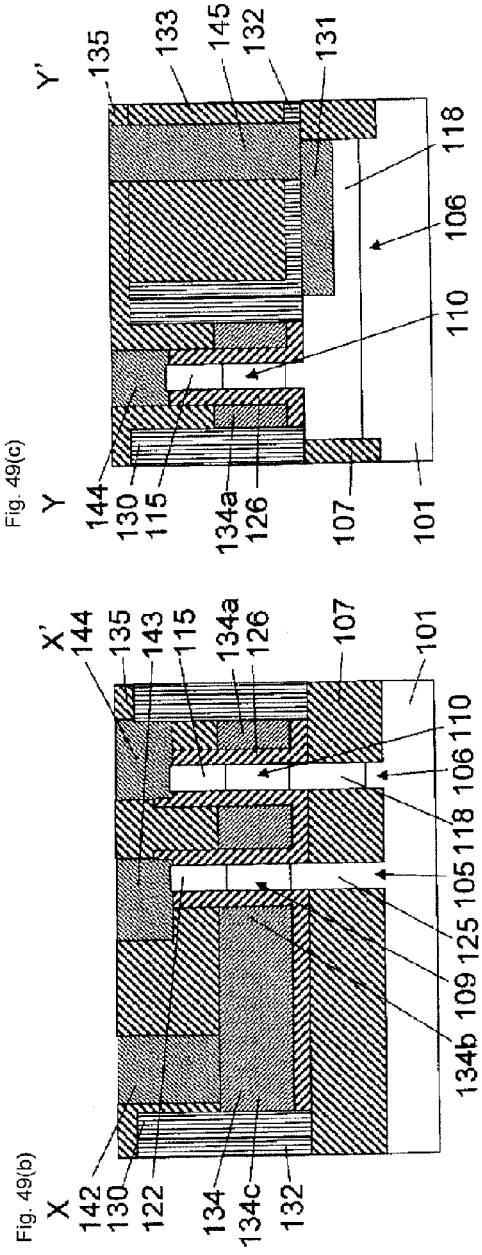

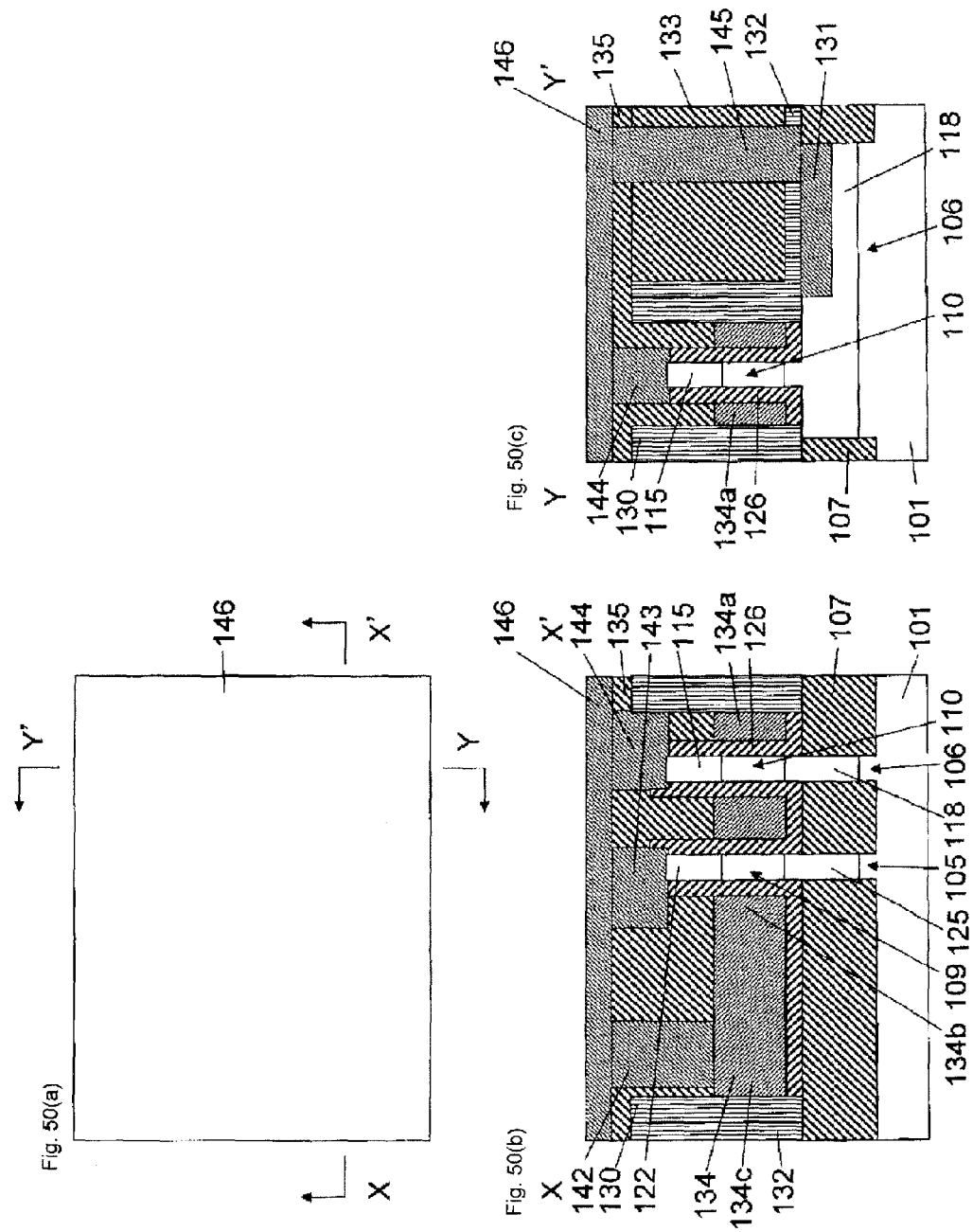

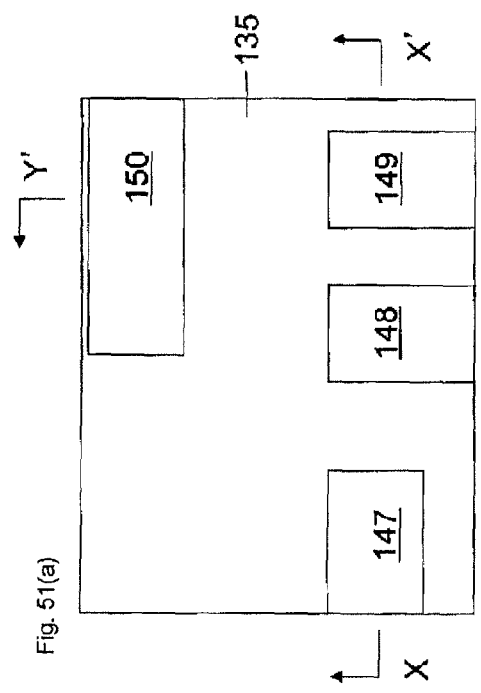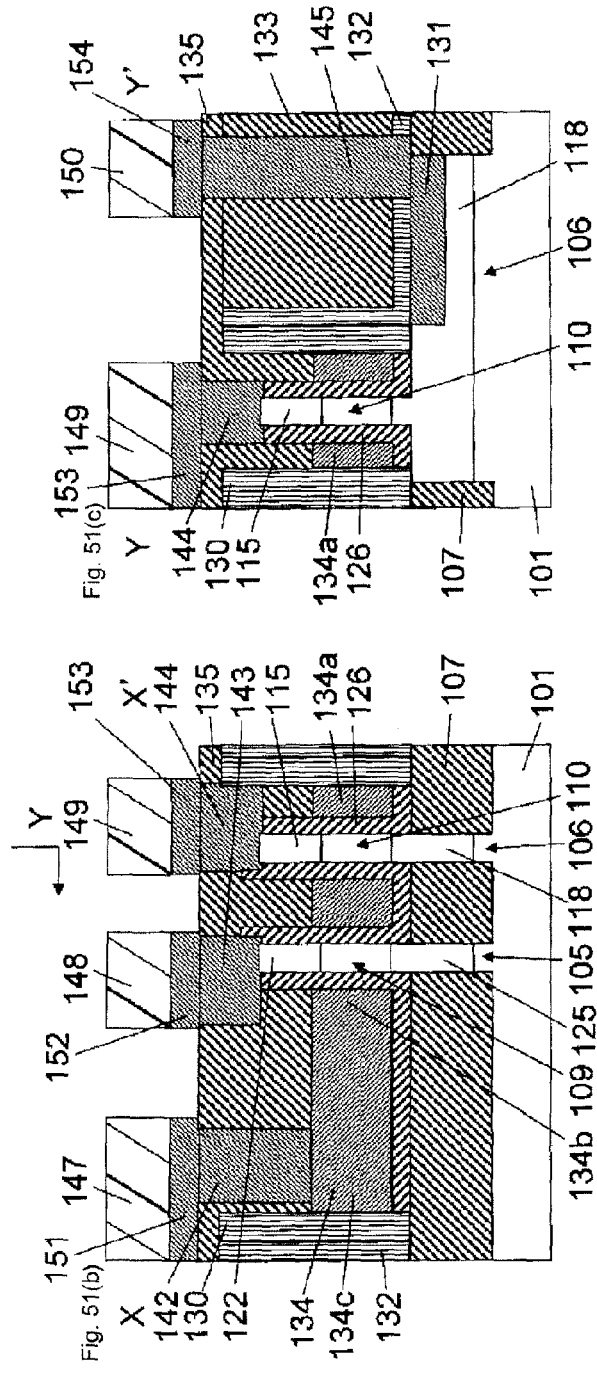

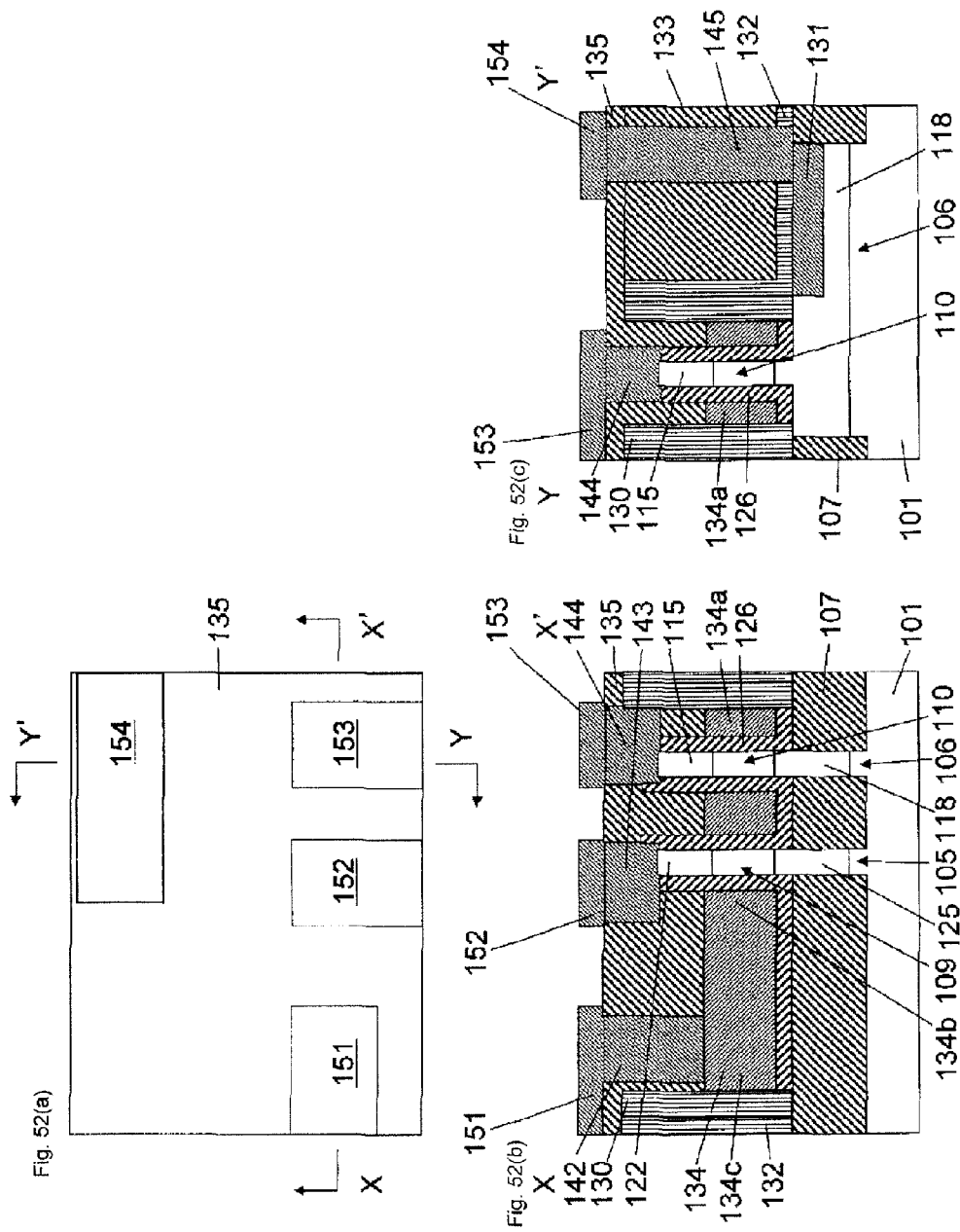

SEMICONDUCTOR DEVICE

RELATED APPLICATIONS

This application is a continuation application of U.S. patent application Ser. No. 14/289,919, filed May 29, 2014, now U.S. Pat. No. 9,035,384, which is a continuation of U.S. patent application Ser. No. 13/693,524, filed Dec. 4, 2012, now U.S. Pat. No. 8,772,175, which claims benefit of the filing date of Provisional U.S. Patent Application Ser. No. 61/577,189, filed Dec. 19, 2011, the entire contents of which are hereby incorporated by reference.

BACKGROUND OF THE INVENTION

1. Technical Field

The present invention relates to a semiconductor device.

2. Description of the Related Art

Semiconductor integrated circuits, particularly integrated circuits using MOS transistors, are increasing in integration. With increases in integration, MOS transistors used in the integrated circuits are increasingly made finer up to a nano region. Finer MOS transistors have the problem of difficulty in suppressing leak currents and difficulty in decreasing the areas occupied by circuits because of the demand for securing necessary amounts of currents. In order to resolve the problem, there have been proposed surrounding gate transistors (SGT) having a structure in which a source, a gate, and a drain are disposed in a direction vertical to a substrate, and the gate surrounds a pillar-shaped semiconductor layer (for example, Japanese Unexamined Patent Application Publication Nos. 2-71556, 2-188966, and 3-145761).

By using a metal for a gate electrode instead of using polysilicon, depletion can be suppressed, and the resistance of the gate electrode can be decreased. However, a manufacturing process after a metal gate is formed must be one in which metal contamination by the metal gate is always taken into consideration.

In addition, in order to satisfy both a metal gate process and a high-temperature process for usual MOS transistors, a metal gate last process is used for actual products, in which a metal gate is formed after a high-temperature process (IEDM 2007 K. Mistry, et. al., pp. 247-250). The gate is formed using polysilicon, and then an interlayer insulating film is deposited. Then, the polysilicon gate is exposed by chemical mechanical polishing and etched, followed by deposition of a metal. Therefore, in order to satisfy both the metal gate process and the high-temperature process, the metal gate last process must be used for SGT, in which a metal gate is formed after the high-temperature process. Since, in the SGT, the top position of the pillar-shaped silicon layer is higher than the gate, some consideration is required for using the metal gate last process.

In addition, usual MOS transistors use a first insulating film in order to decrease a parasitic capacitance between gate line and a substrate. For example, in FINFET (IEDM 2010 CC. Wu, et. al., 27.1.1-27.1.4.), a first insulating film is formed around a fin-shaped semiconductor layer and then etched back to expose the fin-shaped semiconductor layer, thereby decreasing the parasitic capacitance between the gate line and the substrate. Also, in SGT, the first insulating film must be used for decreasing the parasitic capacitance between the gate line and the substrate. The SGT includes the pillar-shaped semiconductor layer in addition to the fin-shaped semiconductor layer, and thus some consideration is required for forming the pillar-shaped semiconductor layer.

On the other hand, FIN FET has been known, in which two transistors are formed from one dummy pattern (for example, Japanese Unexamined Patent Application Publication No. 2011-71235). A sidewall is formed around the dummy pattern and used as a mask for etching a substrate to form a fin, thereby forming two transistors from one dummy pattern.

Since the two transistors are formed, one of the transistors can be used as an nMOS transistor and the other one can be used a pMOS transistor.

SUMMARY OF THE INVENTION

Accordingly, an object is to decrease a parasitic capacitance between a gate line and a substrate, provide a CMOS SGT manufacturing method for forming nMOS SGT and pMOS SGT from one dummy pattern using a gate last process, and provide a resulting SGT structure.

A semiconductor device of the present invention includes a semiconductor device comprising: a first fin-shaped silicon layer on a substrate; a second fin-shaped silicon layer on the substrate, where the first fin-shaped silicon layer and the second fin-shaped silicon layer correspond to the dimensions of a sidewall pattern around a dummy pattern; a first insulating film around the first fin-shaped silicon layer and the second fin-shaped silicon layer; a first pillar-shaped silicon layer on the first fin-shaped silicon layer; a second pillar-shaped silicon layer on the second fin-shaped silicon layer; an n-type diffusion layer in an upper portion of the first fin-shaped silicon layer and a lower portion of the first pillar-shaped silicon layer; an n-type diffusion layer in an upper portion of the first pillar-shaped silicon layer; a p-type diffusion layer in an upper portion of the second fin-shaped silicon layer and a lower portion of the second pillar-shaped silicon layer; a p-type diffusion layer in an upper portion of the second pillar-shaped silicon layer; a gate insulating film around the first pillar-shaped silicon layer; a first metal gate electrode around the gate insulating film; a gate insulating film around the second pillar-shaped silicon layer; a second metal gate electrode around the gate insulating film; and a metal gate line connected to the first metal gate electrode and to the second metal gate electrode and extending in a direction perpendicular to the first fin-shaped silicon layer and the second fin-shaped silicon layer.

According to the present invention, it is possible to decrease a parasitic capacitance between a gate line and a substrate, provide a CMOS SGT manufacturing method for forming nMOS SGT and pMOS SGT from one dummy pattern using a gate last process, and provide a resulting SGT structure. The manufacturing method is based on a conventional FINFET manufacturing method in which a sidewall is formed around a dummy pattern and used as a mask for etching a substrate to form a fin, thereby forming two transistors from one dummy pattern, and thus two SGTs can be easily formed from one dummy pattern.

Since the two SGTs including one serving as nMOS SGT and the other one serving as pMOS SGT are formed, one CMOS SGT can be formed from one dummy pattern, and thus CMOS SGT with high integration can be provided.

In addition, a silicide is generally formed in an upper portion of a pillar-shaped silicon layer, but a silicide must be formed after a polysilicon gate is formed because the deposition temperature of polysilicon is higher than the silicide formation temperature. Therefore, when the silicide is formed in an upper portion of a silicon column, a hole is formed on a polysilicon gate electrode after the polysilicon gate is formed, the silicide is formed after a sidewall composed of an insulating film is formed on the sidewall of the hole, and then the hole is filled with an insulating film, thereby causing the problem of increasing the number of manufacturing steps. Therefore, the diffusion layers are formed before the polysilicon gate electrode and the polysilicon gate line are formed, the pillar-shaped silicon layer is covered with the polysilicon gate electrode, and the silicide is formed only in an upper portion of the fin-shaped silicon layer. Therefore, a usual metal gate last manufacturing method can be used, in which a gate is formed using polysilicon, the interlayer insulating film is deposited, the polysilicon gate is exposed by chemical mechanical polishing and then etched, and then a metal is deposited, thereby facilitating the formation of metal gate CMOS SGT.

BRIEF DESCRIPTION OF THE DRAWING

FIG. 1(a) is a plan view of a semiconductor device according to the present invention, FIG. 1(b) is a sectional view taken along line X-X' in FIG. 1(a), and FIG. 1(c) is a sectional view taken along line Y-Y' in FIG. 1(a).

FIG. 2(a) is a plan view of a method for manufacturing a semiconductor device according to the present invention, FIG. 2(b) is a sectional view taken along line X-X' in FIG. 2(a), and FIG. 2(c) is a sectional view taken along line Y-Y' in FIG. 2(a).

FIG. 3(a) is a plan view of a method for manufacturing a semiconductor device according to the present invention, FIG. 3(b) is a sectional view taken along line X-X' in FIG. 3(a), and FIG. 3(c) is a sectional view taken along line Y-Y' in FIG. 3(a).

FIG. 4(a) is a plan view of a method for manufacturing a semiconductor device according to the present invention, FIG. 4(b) is a sectional view taken along line X-X' in FIG. 4(a), and FIG. 4(c) is a sectional view taken along line Y-Y' in FIG. 4(a).

FIG. 5(a) is a plan view of a method for manufacturing a semiconductor device according to the present invention, FIG. 5(b) is a sectional view taken along line X-X' in FIG. 5(a), and FIG. 5(c) is a sectional view taken along line Y-Y' in FIG. 5(a).

FIG. 6(a) is a plan view of a method for manufacturing a semiconductor device according to the present invention, FIG. 6(b) is a sectional view taken along line X-X' in FIG. 6(a), and FIG. 6(c) is a sectional view taken along line Y-Y' in FIG. 6(a).

FIG. 7(a) is a plan view of a method for manufacturing a semiconductor device according to the present invention, FIG. 7(b) is a sectional view taken along line X-X' in FIG. 7(a), and FIG. 7(c) is a sectional view taken along line Y-Y' in FIG. 7(a).

FIG. 8(a) is a plan view of a method for manufacturing a semiconductor device according to the present invention, FIG. 8(b) is a sectional view taken along line X-X' in FIG. 8(a), and FIG. 8(c) is a sectional view taken along line Y-Y' in FIG. 8(a).

FIG. 9(a) is a plan view of a method for manufacturing a semiconductor device according to the present invention, FIG. 9(b) is a sectional view taken along line X-X' in FIG. 9(a), and FIG. 9(c) is a sectional view taken along line Y-Y' in FIG. 9(a).

FIG. 10(a) is a plan view of a method for manufacturing a semiconductor device according to the present invention, FIG. 10(b) is a sectional view taken along line X-X' in FIG. 10(a), and FIG. 10(c) is a sectional view taken along line Y-Y' in FIG. 10(a).

FIG. 11(a) is a plan view of a method for manufacturing a semiconductor device according to the present invention, FIG. 11(b) is a sectional view taken along line X-X' in FIG. 11(a), and FIG. 11(c) is a sectional view taken along line Y-Y' in FIG. 11(a).

FIG. 12(a) is a plan view of a method for manufacturing a semiconductor device according to the present invention, FIG. 12(b) is a sectional view taken along line X-X' in FIG. 12(a), and FIG. 12(c) is a sectional view taken along line Y-Y' in FIG. 12(a).

FIG. 13(a) is a plan view of a method for manufacturing a semiconductor device according to the present invention, FIG. 13(b) is a sectional view taken along line X-X' in FIG. 13(a), and FIG. 13(c) is a sectional view taken along line Y-Y' in FIG. 13(a).

FIG. 15(a) is a plan view of a method for manufacturing a semiconductor device according to the present invention, FIG. 15(b) is a sectional view taken along line X-X' in FIG. 15(a), and FIG. 15(c) is a sectional view taken along line Y-Y' in FIG. 15(a).

FIG. 16(a) is a plan view of a method for manufacturing a semiconductor device according to the present invention, FIG. 16(b) is a sectional view taken along line X-X' in FIG. 16(a), and FIG. 16(c) is a sectional view taken along line Y-Y' in FIG. 16(a).

FIG. 17(a) is a plan view of a method for manufacturing a semiconductor device according to the present invention, FIG. 17(b) is a sectional view taken along line X-X' in FIG. 17(a), and FIG. 17(c) is a sectional view taken along line Y-Y' in FIG. 17(a).

FIG. 18(a) is a plan view of a method for manufacturing a semiconductor device according to the present invention, FIG. 18(b) is a sectional view taken along line X-X' in FIG. 18(a), and FIG. 18(c) is a sectional view taken along line Y-Y' in FIG. 18(a).

FIG. 19(a) is a plan view of a method for manufacturing a semiconductor device according to the present invention, FIG. 19(b) is a sectional view taken along line X-X' in FIG. 19(a), and FIG. 19(c) is a sectional view taken along line Y-Y' in FIG. 19(a).

FIG. 20(a) is a plan view of a method for manufacturing a semiconductor device according to the present invention, FIG. 20(b) is a sectional view taken along line X-X' in FIG. 20(a), and FIG. 20(c) is a sectional view taken along line Y-Y' in FIG. 20(a).

FIG. 21(a) is a plan view of a method for manufacturing a semiconductor device according to the present invention, FIG. 21(b) is a sectional view taken along line X-X' in FIG. 21(a), and FIG. 21(c) is a sectional view taken along line Y-Y' in FIG. 21(a).

FIG. 22(a) is a plan view of a method for manufacturing a semiconductor device according to the present invention, FIG. 22(b) is a sectional view taken along line X-X' in FIG. 22(a), and FIG. 22(c) is a sectional view taken along line Y-Y' in FIG. 22(a).

FIG. 23(a) is a plan view of a method for manufacturing a semiconductor device according to the present invention, FIG. 23(b) is a sectional view taken along line X-X' in FIG. 23(a), and FIG. 23(c) is a sectional view taken along line Y-Y' in FIG. 23(a).

FIG. 24(a) is a plan view of a method for manufacturing a semiconductor device according to the present invention, FIG. 24(b) is a sectional view taken along line X-X' in FIG. 24(a), and FIG. 24(c) is a sectional view taken along line Y-Y' in FIG. 24(a).

FIG. 25(a) is a plan view of a method for manufacturing a semiconductor device according to the present invention, FIG. 25(b) is a sectional view taken along line X-X' in FIG. 25(a), and FIG. 25(c) is a sectional view taken along line Y-Y' in FIG. 25(a).

FIG. 26(a) is a plan view of a method for manufacturing a semiconductor device according to the present invention, FIG. 26(b) is a sectional view taken along line X-X' in FIG. 26(a), and FIG. 26(c) is a sectional view taken along line Y-Y' in FIG. 26(a).

FIG. 27(a) is a plan view of a method for manufacturing a semiconductor device according to the present invention, FIG. 27(b) is a sectional view taken along line X-X' in FIG. 27(a), and FIG. 27(c) is a sectional view taken along line Y-Y' in FIG. 27(a).

FIG. 28(a) is a plan view of a method for manufacturing a semiconductor device according to the present invention, FIG. 28(b) is a sectional view taken along line X-X' in FIG. 28(a), and FIG. 28(c) is a sectional view taken along line Y-Y' in FIG. 28(a).

FIG. 29(a) is a plan view of a method for manufacturing a semiconductor device according to the present invention, FIG. 29(b) is a sectional view taken along line X-X' in FIG. 29(a), and FIG. 29(c) is a sectional view taken along line Y-Y' in FIG. 29(a).

FIG. 31(a) is a plan view of a method for manufacturing a semiconductor device according to the present invention, FIG. 31(b) is a sectional view taken along line X-X' in FIG. 31(a), and FIG. 31(c) is a sectional view taken along line Y-Y' in FIG. 31(a).

FIG. 32(a) is a plan view of a method for manufacturing a semiconductor device according to the present invention, FIG. 32(b) is a sectional view taken along line X-X' in FIG. 32(a), and FIG. 32(c) is a sectional view taken along line Y-Y' in FIG. 32(a).

FIG. 33(a) is a plan view of a method for manufacturing a semiconductor device according to the present invention, FIG. 33(b) is a sectional view taken along line X-X' in FIG. 33(a), and FIG. 33(c) is a sectional view taken along line Y-Y' in FIG. 33(a).

FIG. 34(a) is a plan view of a method for manufacturing a semiconductor device according to the present invention, FIG. 34(b) is a sectional view taken along line X-X' in FIG. 34(a), and FIG. 34(c) is a sectional view taken along line Y-Y' in FIG. 34(a).

FIG. 35(a) is a plan view of a method for manufacturing a semiconductor device according to the present invention, FIG. 35(b) is a sectional view taken along line X-X' in FIG. 35(a), and FIG. 35(c) is a sectional view taken along line Y-Y' in FIG. 35(a).

FIG. 36(a) is a plan view of a method for manufacturing a semiconductor device according to the present invention, FIG. 36(b) is a sectional view taken along line X-X' in FIG. 36(a), and FIG. 36(c) is a sectional view taken along line Y-Y' in FIG. 36(a).

FIG. 37(a) is a plan view of a method for manufacturing a semiconductor device according to the present invention, FIG. 37(b) is a sectional view taken along line X-X' in FIG. 37(a), and FIG. 37(c) is a sectional view taken along line Y-Y' in FIG. 37(a).

FIG. 38(a) is a plan view of a method for manufacturing a semiconductor device according to the present invention, FIG. 38(b) is a sectional view taken along line X-X' in FIG. 38(a), and FIG. 38(c) is a sectional view taken along line Y-Y' in FIG. 38(a).

FIG. 39(a) is a plan view of a method for manufacturing a semiconductor device according to the present invention, FIG. 39(b) is a sectional view taken along line X-X' in FIG. 39(a), and FIG. 39(c) is a sectional view taken along line Y-Y' in FIG. 39(a).

FIG. 40(a) is a plan view of a method for manufacturing a semiconductor device according to the present invention, FIG. 40(b) is a sectional view taken along line X-X' in FIG. 40(a), and FIG. 40(c) is a sectional view taken along line Y-Y' in FIG. 40(a).

FIG. 41(a) is a plan view of a method for manufacturing a semiconductor device according to the present invention, FIG. 41(b) is a sectional view taken along line X-X' in FIG. 41(a), and FIG. 41(c) is a sectional view taken along line Y-Y' in FIG. 41(a).

FIG. 42(a) is a plan view of a method for manufacturing a semiconductor device according to the present invention, FIG. 42(b) is a sectional view taken along line X-X' in FIG. 42(a), and FIG. 42(c) is a sectional view taken along line Y-Y' in FIG. 42(a).

FIG. 43(a) is a plan view of a method for manufacturing a semiconductor device according to the present invention, FIG. 43(b) is a sectional view taken along line X-X' in FIG. 43(a), and FIG. 43(c) is a sectional view taken along line Y-Y' in FIG. 43(a).

FIG. 45(a) is a plan view of a method for manufacturing a semiconductor device according to the present invention, FIG. 45(b) is a sectional view taken along line X-X' in FIG. 45(a), and FIG. 45(c) is a sectional view taken along line Y-Y' in FIG. 45(a).

FIG. 46(a) is a plan view of a method for manufacturing a semiconductor device according to the present invention, FIG. 46(b) is a sectional view taken along line X-X' in FIG. 46(a), and FIG. 46(c) is a sectional view taken along line Y-Y' in FIG. 46(a).

FIG. 47(a) is a plan view of a method for manufacturing a semiconductor device according to the present invention, FIG. 47(b) is a sectional view taken along line X-X' in FIG. 47(a), and FIG. 47(c) is a sectional view taken along line Y-Y' in FIG. 47(a).

FIG. 48(a) is a plan view of a method for manufacturing a semiconductor device according to the present invention, FIG. 48(b) is a sectional view taken along line X-X' in FIG. 48(a), and FIG. 48(c) is a sectional view taken along line Y-Y' in FIG. 48(a).

FIG. 49(a) is a plan view of a method for manufacturing a semiconductor device according to the present invention, FIG. 49(b) is a sectional view taken along line X-X' in FIG. 49(a), and FIG. 49(c) is a sectional view taken along line Y-Y' in FIG. 49(a).

FIG. 50(a) is a plan view of a method for manufacturing a semiconductor device according to the present invention, FIG. 50(b) is a sectional view taken along line X-X' in FIG. 50(a), and FIG. 50(c) is a sectional view taken along line Y-Y' in FIG. 50(a).

FIG. 51(a) is a plan view of a method for manufacturing a semiconductor device according to the present invention, FIG. 51(b) is a sectional view taken along line X-X' in FIG. 51(a), and FIG. 51(c) is a sectional view taken along line Y-Y' in FIG. 51(a).

FIG. 52(a) is a plan view of a method for manufacturing a semiconductor device according to the present invention, FIG. 52(b) is a sectional view taken along line X-X' in FIG. 52(a), and FIG. 52(c) is a sectional view taken along line Y-Y' in FIG. 52(a).

DETAILED DESCRIPTION OF THE PREFERRED EMBODIMENTS

Figure 14C:
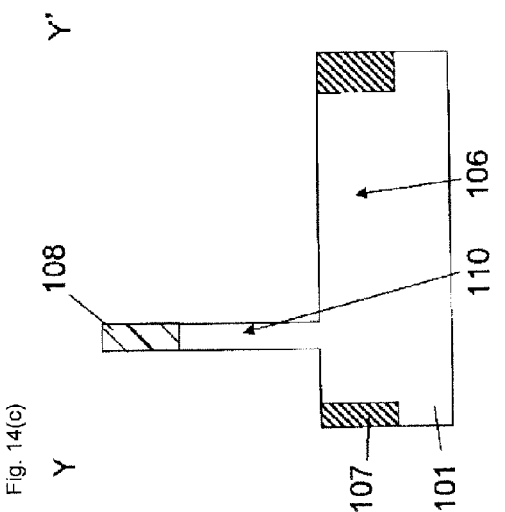
FIG. 14(c) is a sectional view taken along line Y-Y' in FIG. 14(a).

A manufacturing process for forming a SGT structure according to an embodiment of the present invention is described below with reference to FIGS. 2 to 52.

A description is given of a manufacturing method for forming a first fin-shaped silicon layer and a second fin-shaped silicon layer on a substrate, forming a first insulating film around the first fin-shaped silicon layer and the second fin-shaped silicon layer, and forming a first pillar-shaped silicon layer on the first fin-shaped silicon layer and forming a second pillar-shaped silicon layer on the second fin-shaped silicon layer.

As shown in FIG. 2, a second oxide film 102 is formed for forming a dummy pattern on a silicon substrate 101. A nitride film or a laminated film of an oxide film and polysilicon may be used.

As shown in FIG. 3, a first resist 103 is formed for forming the dummy pattern.

As shown in FIG. 4, the second oxide film 102 is etched to form the dummy pattern 102.

As shown in FIG. 5, the first resist 103 is removed.

As shown in FIG. 6, a first nitride film 104 is deposited.

As shown in FIG. 7, the first nitride film 104 is etched to be left as a sidewall. Consequently, a first nitride film sidewall 104 is formed around the dummy pattern 102. The first nitride film sidewall 104 is used for etching silicon to form a first fin-shaped silicon layer 106 and a second fin-shaped silicon layer 105 which are connected to each other at the ends thereof to form a closed loop.

As shown in FIG. 8, the dummy pattern 102 is removed.

As shown in FIG. 9, the silicon substrate 101 is etched using the first nitride film sidewall 104 as a mask to form the first fin-shaped silicon layer 106 and the second fin-shaped silicon layer 105 which are connected to each other at the ends thereof to form a closed loop.

As shown in FIG. 10, a first insulating film 107 is formed around the first fin-shaped silicon layer 106 and the second fin-shaped silicon layer 105. As the first insulating film, an oxide film formed by high-density plasma, or an oxide film formed by low-pressure chemical vapor deposition may be used.

As shown in FIG. 11, the first nitride film sidewall 104 is removed. When the first nitride film sidewall 104 is removed during silicon etching or deposition of the oxide film, this step is not required.

As shown in FIG. 12, the first insulating film 107 is etched back to expose an upper portion of the first fin-shaped silicon layer 106 and an upper portion of the second fin-shaped silicon layer 105.

As shown in FIG. 13, a second resist 108 is formed so as to be perpendicular to the first fin-shaped silicon layer 106 and the second fin-shaped silicon layer 105. A portion where each of the first fin-shaped silicon layer 106 and the second fin-shaped silicon layer 105 intersects at right angles the second resist 108 becomes a pillar-shaped silicon layer. Since a linear resist can be used, the resist is unlikely to fall after patterning, thereby realizing a stable process.

Figure 14A:
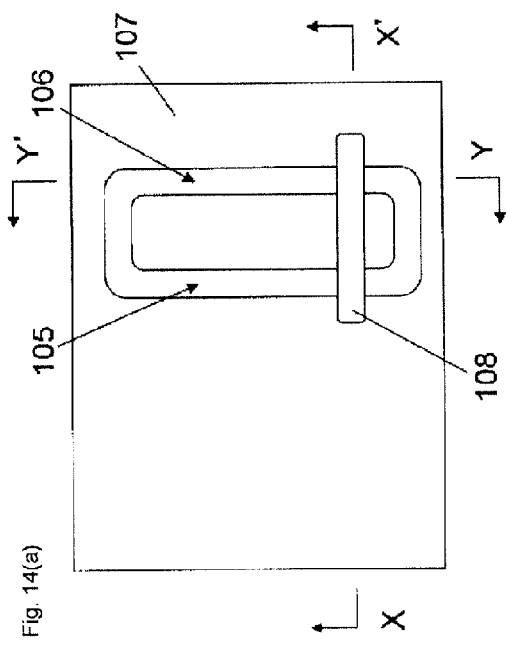
FIG. 14(a) is a plan view of a method for manufacturing a semiconductor device according to the present invention.
Figure 14B:
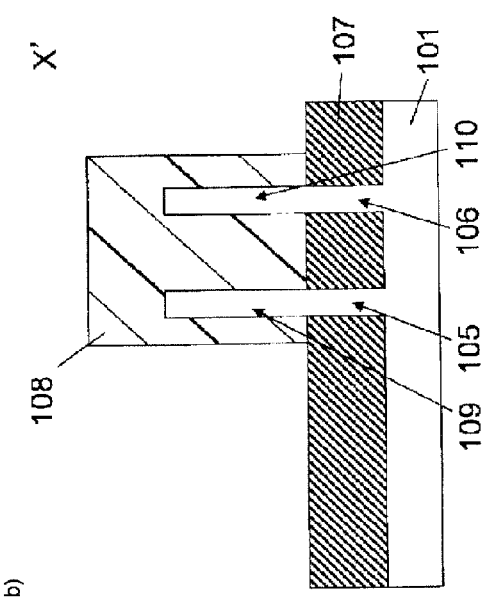
FIG. 14(b) is a sectional view taken along line X-X' in FIG. 14(a)

As shown in FIG. 14, the first fin-shaped silicon layer 106 and the second fin-shaped silicon layer are etched. A portion where the first fin-shaped silicon layer 106 and the second resist 108 intersect at right angles becomes a first pillar-shaped silicon layer 110. A portion where the second fin-shaped silicon layer 105 and the second resist 108 intersect at right angles becomes a second pillar-shaped silicon layer 109. Therefore, the width of the first pillar-shaped silicon layer 110 is equal to the width of the first fin-shaped silicon layer 106. Also, the width of the second pillar-shaped silicon layer 109 is equal to the width of the second fin-shaped silicon layer 105.

As a result, a structure is formed, in which the first pillar-shaped silicon layer 110 is formed in an upper portion of the first fin-shaped silicon layer 106, the second pillar-shaped silicon layer 109 is formed in an upper portion of the second fin-shaped silicon layer 105, and the first insulating film 107 is formed around the first fin-shaped silicon layer 106 and the second fin-shaped silicon layer 105.

As shown in FIG. 15, the second resist 108 is removed.

Next, a description is given of a manufacturing method in which in order to use a gate-last process, n-type diffusion layers are formed by implanting impurities in an upper portion of the first pillar-shaped silicon layer 110, an upper portion of the first fin-shaped silicon layer 106, and a lower portion of the first pillar-shaped silicon layer 110, and p-type diffusion layers are formed by implanting impurities in an upper portion of the second pillar-shaped silicon layer 109, an upper portion of the second fin-shaped silicon layer 105, and a lower portion of the second pillar-shaped silicon layer 109.

As shown in FIG. 16, a third oxide film 111 is deposited, and a second nitride film 112 is formed. Since upper portions of the pillar-shaped silicon layers are subsequently covered with a gate insulating film and polysilicon gate electrodes, diffusion layers are formed in upper portions of the pillar-shaped silicon layers before covering of the pillar-shaped silicon layers.

As shown in FIG. 17, the second nitride film 112 is etched to be left as a sidewall.

As shown in FIG. 18, a third resist 113 is formed for forming the n-type diffusion layers by impurity implantation in an upper portion of the first pillar-shaped silicon layer 110, an upper portion of the first fin-shaped silicon layer 106, and a lower portion of the first pillar-shaped silicon layer 110.

As shown in FIG. 19, impurities such as arsenic or phosphorus are implanted to form a n-type diffusion layer 115 in an upper portion of the first pillar-shaped silicon layer 110, and n-type diffusion layers 116 and 117 in an upper portion of the first fin-shaped silicon layer 106.

As shown in FIG. 20, the third resist 113 is removed.

As shown in FIG. 21, the second nitride film 112 and the third oxide film 111 are removed.

As shown in FIG. 22, heat treatment is performed. The n-type diffusion layers 116 and 117 in an upper portion of the first fin-shaped silicon layer 106 are brought into contact with each other to form a n-type diffusion layer 118.

As shown in FIG. 23, a fourth oxide film 119 is deposited, and a third nitride film 120 is formed. Since upper portions of the pillar-shaped silicon layers are subsequently covered with a gate insulating film and polysilicon gate electrodes, diffusion layers are formed in upper portions of the pillar-shaped silicon layers before the pillar-shaped silicon layers are covered.

As shown in FIG. 24, the third nitride film 120 is etched to be left as a sidewall.

As shown in FIG. 25, a fourth resist 121 is formed for forming the p-type diffusion layers by impurity implantation in an upper portion of the second pillar-shaped silicon layer 109, an upper portion of the second fin-shaped silicon layer 105, and a lower portion of the second pillar-shaped silicon layer 109.

As shown in FIG. 26, impurities such as boron are implanted to form a p-type diffusion layer 122 in an upper portion of the second pillar-shaped silicon layer 109, and p-type diffusion layers 123 and 124 in an upper portion of the second fin-shaped silicon layer 105.

As shown in FIG. 27, the fourth resist 121 is removed.

As shown in FIG. 28, the third nitride film 120 and the fourth oxide film 119 are removed.

As shown in FIG. 29, heat treatment is performed. The p-type diffusion layers 123 and 124 in an upper portion of the second fin-shaped silicon layer 105 are brought into contact with each other to form a n-type diffusion layer 125.

As described above, in order to use the gate-last process, the n-type diffusion layers 115 and 118 are formed by impurity implantation in an upper portion of the first pillar-shaped silicon layer 110 and in an upper portion of the first fin-shaped silicon layer 106 and a lower portion of the first pillar-shaped silicon layer 110, and the p-type diffusion layers 122 and 125 are formed by impurity implantation in an upper portion of the second pillar-shaped silicon layer 109 and in an upper portion of the second fin-shaped silicon layer 105 and a lower portion of the second pillar-shaped silicon layer 109.

Since nMOS SGT and pMOS SGT can be formed as described above, a CMOS SGT can be formed from one dummy pattern.

In addition, when the line width of the dummy pattern is minimum feature size F, the distance between the first pillar-shaped silicon layer 110 and the second pillar-shaped silicon layer 109 is the minimum feature size F. Therefore, an allowance for alignment of a resist mask for impurity implantation can be made F/2, thereby making it easy to separate between pMOS and nMOS elements.

Next, a description is given of a manufacturing method for forming a first polysilicon gate electrode 127a, a second polysilicon gate electrode 127b, and a polysilicon gate line 127c using polysilicon in order to use the gate-last process. In order to use the gate-last process, an interlayer insulating film is deposited, and then the polysilicon gate electrodes and the polysilicon gate line are exposed by chemical mechanical polishing. Therefore, it is necessary to prevent upper portions of the pillar-shaped silicon layers from being exposed by chemical mechanical polishing.

Figure 30A:
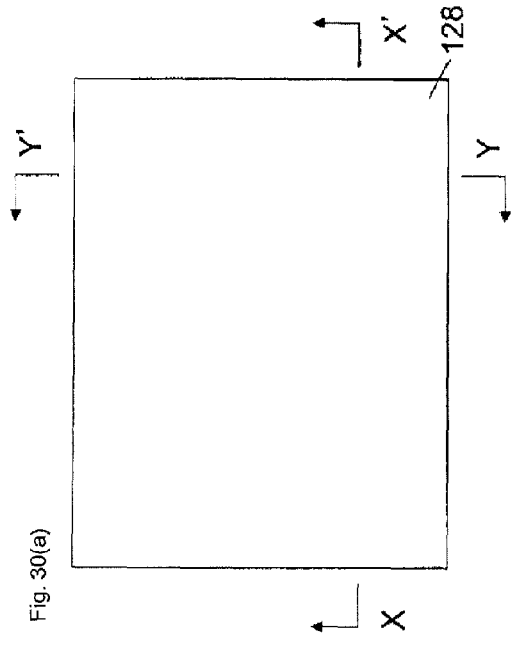
FIG. 30(a) is a plan view of a method for manufacturing a semiconductor device according to the present invention.
Figure 30B:
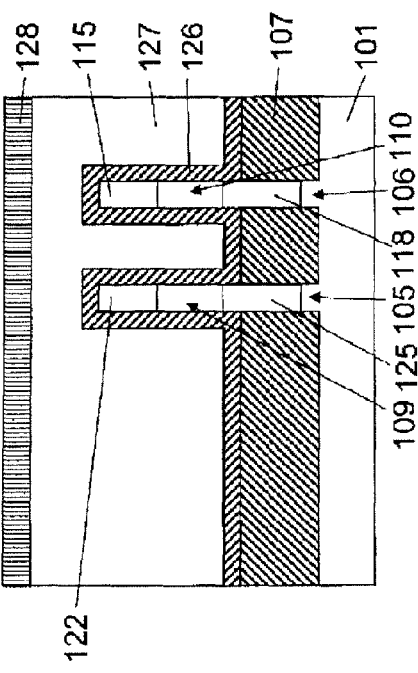
FIG. 30(b) is a sectional view taken along line X-X' in FIG. 30(a)
Figure 30C:
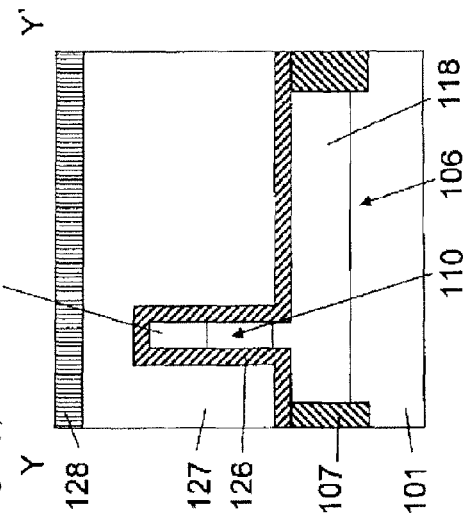
FIG. 30(c) is a sectional view taken along line Y-Y' in FIG. 30(a).

As shown in FIG. 30, a gate insulating film 126 is formed, and polysilicon 127 is deposited and then planarized. After planarization, the top position of the polysilicon 127 is higher than the gate insulating film 126 disposed on the n-type diffusion layer 115 in an upper portion of the first pillar-shaped silicon layer 110 and higher than the gate insulating film 126 disposed on the p-type diffusion layer 122 in an upper portion of the second pillar-shaped silicon layer 109. As a result, when in order to use the gate-last process, the polysilicon gate electrodes and the polysilicon gate line are exposed by chemical mechanical polishing after the interlayer insulating film is deposited, the upper portions of the pillar-shaped silicon layers are not exposed by chemical mechanical polishing.

In addition, a fourth nitride film 128 is deposited. The fourth nitride film 128 is a film which inhibits the formation of silicide in upper portions of the first polysilicon gate electrode 127a, the second polysilicon gate electrode 127b, and the polysilicon gate line 127c when the silicide is formed in upper portions of the first fin-shaped silicon layer 106 and the second fin-shaped silicon layer 105.

As shown in FIG. 31, a fifth resist 129 is formed for forming the first polysilicon gate electrode 127a, the second polysilicon gate electrode 127b, and the polysilicon gate line 127c. A portion corresponding to the gate line is preferably perpendicular to the first fin-shaped silicon layer 106 and the second fin-shaped silicon layer 105. This is because a parasitic capacitance between the gate line and the substrate is decreased.

As shown in FIG. 32, the fourth nitride film 128 is etched, and the polysilicon 127 is etched to form the first polysilicon gate electrode 127a, the second polysilicon gate electrode 127b, and the polysilicon gate line 127c.

As shown in FIG. 33, the gate insulating film 126 is etched.

As shown in FIG. 34, the fifth resist 129 is removed.

The manufacturing method for forming, using polysilicon, the first polysilicon gate electrode 127a, the second polysilicon gate electrode 127b, and the polysilicon gate line 127c in order to use the gate-last process is described above. After the first polysilicon gate electrode 127a, the second polysilicon gate electrode 127b, and the polysilicon gate line 127c are formed, the top position of polysilicon is higher than the gate insulating film 126 on the n-type diffusion layer 115 in an upper portion of the first pillar-shaped silicon layer 110 and higher than the gate insulating film 126 on the p-type diffusion layer 122 in an upper portion of the second pillar-shaped silicon layer 109.

Next, a manufacturing method for forming silicides in an upper portion of the n-type diffusion layer 118 formed in an upper portion of the first fin-shaped silicon layer 106 and in an upper portion of the p-type diffusion layer 125 formed in an upper portion of the second fin-shaped silicon layer 105 is described.

A silicide is not formed in upper portions of the first polysilicon gate electrode 127a, the second polysilicon gate electrode 127b, and the polysilicon gate line 127c, in the n-type diffusion layer 115 in an upper portion of the first pillar-shaped silicon layer 110, and in the p-type diffusion layer 122 in an upper portion of the second pillar-shaped silicon layer 109. When the silicide is formed in the n-type diffusion layer 115 in an upper portion of the first pillar-shaped silicon layer 110, and in the p-type diffusion layer 122 in an upper portion of the second pillar-shaped silicon layer 109, the manufacturing process is enlarged.

As shown in FIG. 35, a fifth nitride film 130 is deposited.

As shown in FIG. 36, the fifth nitride film 130 is etched to be left as a sidewall.

As shown in FIG. 37, a metal such as nickel or cobalt is deposited to form silicide 131 in upper portions of the n-type diffusion layer 118 and the p-type diffusion layer 125 formed in upper portions of the first fin-shaped silicon layer 106 and the second fin-shaped silicon layer 105, respectively. At this time, the first polysilicon gate electrode 127a, the second polysilicon gate electrode 127b, and the polysilicon gate line 127c are covered with the fifth nitride film 130 and the fourth nitride film 128, and the n-type diffusion layer 115 in an upper portion of the first pillar-shaped silicon layer 110 and the p-type diffusion layer 122 in an upper portion of the second pillar-shaped silicon layer 109 are covered with the gate insulating film 126, the first polysilicon gate electrode 127a, the second polysilicon gate electrode 127b, and the polysilicon gate line 127c, and thus a silicide is not formed in these portions.

The manufacturing method for forming a silicide in an upper portion of the n-type diffusion layer 118 in an upper portion of the first fin-shaped silicon layer 106 and in an upper portion of the p-type diffusion layer 125 in an upper portion of the second fin-shaped silicon layer 105 is described above.

Next, a gate-last manufacturing method is described, in which after an interlayer insulting film 133 is deposited, the first polysilicon gate electrode 127a, the second polysilicon gate electrode 127b, and the polysilicon gate line 127c are exposed, the first polysilicon gate electrode 127a, the second polysilicon gate electrode 127b, and the polysilicon gate line 127c are etched, and then a metal is deposited to form a first metal gate electrode 134a, a second metal gate electrode 134b, and a metal gate line 134c.

As shown in FIG. 38, a sixth nitride film 132 is deposited for protecting the silicide 131.

As shown in FIG. 39, an interlayer insulating film 133 is deposited and then planarized by chemical mechanical polishing.

As shown in FIG. 40, the first polysilicon gate electrode 127a, the second polysilicon gate electrode 127b, and the polysilicon gate line 127c are exposed by chemical mechanical polishing.

As shown in FIG. 41, the first polysilicon gate electrode 127a, the second polysilicon gate electrode 127b, and the polysilicon gate line 127c are etched. Wet etching is preferred.

As shown in FIG. 42, a metal 134 is deposited and then planarized to fill, with the metal 134, portions from which the first polysilicon gate electrode 127a, the second polysilicon gate electrode 127b, and the polysilicon gate line 127c have been removed. Atomic layer deposition is preferably used.

As shown in FIG. 43, the metal 134 is etched to expose the gate insulating film 126 formed on the n-type diffusion layer 115 in an upper portion of the first pillar-shaped silicon layer 110 and expose the gate insulating film 126 formed on the p-type diffusion layer 122 in an upper portion of the second pillar-shaped silicon layer 109. Consequently, the first metal gate electrode 134a, the second metal gate electrode 134b, and the metal gate line 134c are formed.

The gate-last manufacturing method is described above, in which after the interlayer insulating film 133 is deposited, the first polysilicon gate electrode 127a, the second polysilicon gate electrode 127b, and the polysilicon gate line 127c are exposed, the first polysilicon gate electrode 127a, the second polysilicon gate electrode 127b, and the polysilicon gate line 127c are etched, and then the metal 134 is deposited to form the first metal gate electrode 134a, the second metal gate electrode 134b, and the metal gate line 134c.

Next, a manufacturing method for forming a contact is described. Since a silicide is not formed in the n-type diffusion layer 115 in an upper portion of the first pillar-shaped silicon layer 110 and in the p-type diffusion layer 122 in an upper portion of the second pillar-shaped silicon layer 109, a first contact is brought into direct contact with the n-type diffusion layer 115 in an upper portion of the first pillar-shaped silicon layer 110 and a second contact is brought into direct contact with the p-type diffusion layer 122 in an upper portion of the second pillar-shaped silicon layer 109.

Figure 44A:
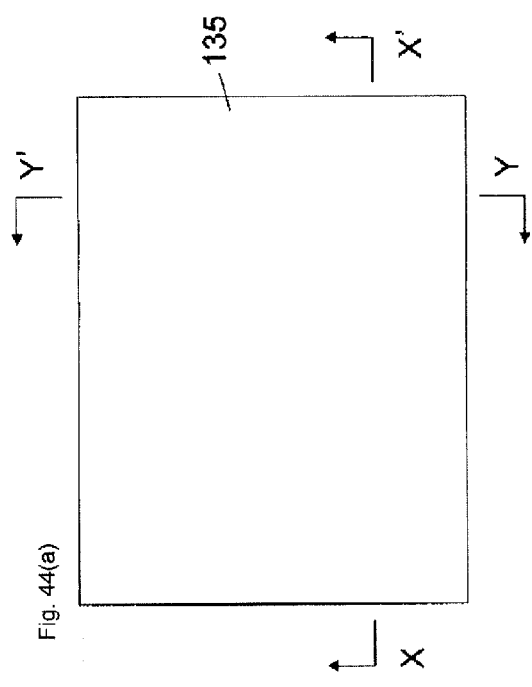
FIG. 44(a) is a plan view of a method for manufacturing a semiconductor device according to the present invention.
Figure 44B:
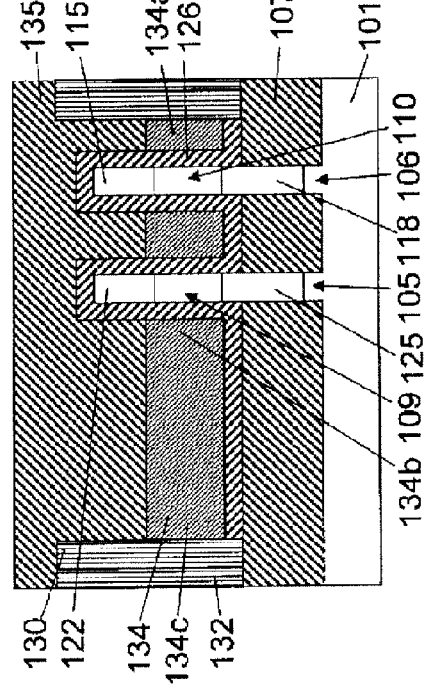
FIG. 44(b) is a sectional view taken along line X-X' in FIG. 44(a)
Figure 44C:
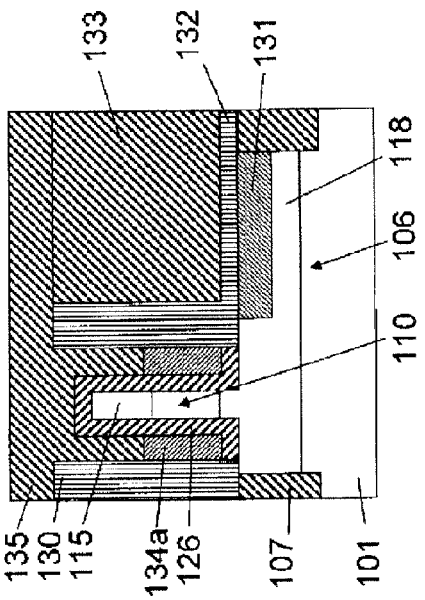
FIG. 44(c) is a sectional view taken along line Y-Y' in FIG. 44(a).

As shown in FIG. 44, an interlayer insulating film 135 is deposited and then planarized.

As shown in FIG. 45, a sixth resist 136 is formed for forming a first contact hole 138 on the first pillar-shaped silicon layer 110 and a second contact hole 137 on the second pillar-shaped silicon layer 109. Then, the interlayer insulating film 135 is etched to form the first contact hole 138 and the second contact hole 137.

As shown in FIG. 46, the sixth resist 136 is removed.

As shown in FIG. 47, a seventh resist 139 is formed for forming a third contact hole 140 and a fourth contact hole 141 on the metal gate line 134c and on the first fin-shaped silicon layer 106 and the second fin-shaped silicon layer 105.

As shown in FIG. 48, the interlayer insulating films 135 and 133 are etched to form the third contact hole 140 and the fourth contact hole 141.

As shown in FIG. 49, the seventh resist 139 is removed, and the sixth nitride film 132 and the gate insulating film 126 are etched to expose the silicide 131, the n-type diffusion layer 115, and the p-type diffusion layer 122. Then, a metal is deposited to form a first contact 144, a second contact 143, a third contact 142, and a fourth contact 145.

The manufacturing method for forming contacts is described above. Since a silicide is not formed in the n-type diffusion layer 115 in an upper portion of the first pillar-shaped silicon layer 110 and in the p-type diffusion layer 122 in an upper portion of the second pillar-shaped silicon layer 109, the first contact is brought into direct contact with the n-type diffusion layer 115 in an upper portion of the first pillar-shaped silicon layer 110, and the second contact is brought into direct contact with the p-type diffusion layer 122 in an upper portion of the second pillar-shaped silicon layer 109.

Next, a manufacturing method for forming a metal wiring layer is described.

As shown in FIG. 50, a metal 146 is deposited.

As shown in FIG. 51, eighth resists 147, 148, 149, and 150 are formed for forming the metal wiring, and the metal 146 is etched to form metal wirings 151, 152, 153, and 154.

As shown in FIG. 52, the eighth resists 147, 148, 149, and 150 are removed.

The manufacturing method for forming metal wiring layers is described above.

The result of the above-described manufacturing method is shown in FIG. 1.

The resulting structure includes: the first fin-shaped silicon layer 106 formed on the substrate 101 and the second silicon layer 105 formed on the substrate 101, the first fin-shaped silicon layer 106 and the second fin-shaped silicon layer 105 being connected to each other at the ends thereof to form a closed loop; the first insulating film 107 formed around the first fin-shaped silicon layer 106 and the second fin-shaped silicon layer 105; the first pillar-shaped silicon layer 110 formed on the first fin-shaped silicon layer 106; the second pillar-shaped silicon layer 109 formed on the second fin-shaped silicon layer 105, the width of the first pillar-shaped silicon layer 110 being equal to the width of the first fin-shaped silicon layer 106 and the width of the second pillar-shaped silicon layer 109 being equal to the width of the second fin-shaped silicon layer 105; the n-type diffusion layer 118 formed in an upper portion of the first fin-shaped silicon layer 106 and a lower portion of the first pillar-shaped silicon layer 110; the n-type diffusion layer 115 formed in an upper portion of the first pillar-shaped silicon layer 110; the p-type diffusion layer 125 formed in an upper portion of the second fin-shaped silicon layer 105 and a lower portion of the second pillar-shaped silicon layer 109; the p-type diffusion layer 122 formed in an upper portion of the second pillar-shaped silicon layer 109; the silicide 131 formed in upper portions of the n-type diffusion layer 118 and the p-type diffusion layer 125 in an upper portion of the first fin-shaped silicon layer 106 and in an upper portion of the second fin-shaped silicon layer 105;

the gate insulating film 126 formed around the first pillar-shaped silicon layer 110 and the first metal gate electrode 134*a* formed around the gate insulating film 126; the gate insulating film 126 formed around the second pillar-shaped silicon layer 109 and the second metal gate electrode 134*b* formed around the gate insulating film 126; the metal gate line 134*c* connected to the first metal gate electrode 134*a* and the second metal gate electrode 134*b* and extending in a direction perpendicular to the first fin-shaped silicon layer 106 and the second fin-shaped silicon layer 105; and the first contact 144 formed on the n-type diffusion layer 115 formed in an upper portion of the first pillar-shaped silicon layer 110 and the second contact 143 formed on the p-type diffusion layer 122 formed in an upper portion of the second pillar-shaped silicon layer 109, the first contact 144 being in direct contact with the n-type diffusion layer 115 formed in an upper portion of the first pillar-shaped silicon layer 110 and the second contact 143 being in direct contact with the p-type diffusion layer 122 formed in an upper portion of the second pillar-shaped silicon layer 109.

As described above, it is possible to decrease a parasitic capacitance between a gate line and a substrate and provide a CMOS SGT manufacturing method for forming a nMOS SGT and a pMOS SGT from one dummy pattern using a gate-last process and provide a resulting SGT structure.

In the present invention, various embodiments and modifications can be made without deviating from the broad spirit and scope of the present invention. The above-described embodiment is illustrative of an example of the present invention, and does not limit the scope of the present invention.

In addition, it is obvious to persons skilled in the art that the technical scope of the present invention includes an embodiment where the conductivity types of p-type (including p+ type) and n-type (including n+ type) are reversed to those in the above description.

The invention claimed is:

1. A semiconductor device comprising:
a first fin-shaped silicon layer on a substrate;
a second fin-shaped silicon layer on the substrate, where the first fin-shaped silicon layer and the second fin-shaped silicon layer correspond to the dimensions of a sidewall pattern around a dummy pattern;
a first insulating film around the first fin-shaped silicon layer and the second fin-shaped silicon layer;
a first pillar-shaped silicon layer on the first fin-shaped silicon layer;
a second pillar-shaped silicon layer on the second fin-shaped silicon layer;
an n-type diffusion layer in an upper portion of the first fin-shaped silicon layer and a lower portion of the first pillar-shaped silicon layer;
an n-type diffusion layer in an upper portion of the first pillar-shaped silicon layer;
a p-type diffusion layer in an upper portion of the second fin-shaped silicon layer and a lower portion of the second pillar-shaped silicon layer;
a p-type diffusion layer in an upper portion of the second pillar-shaped silicon layer;
a gate insulating film around the first pillar-shaped silicon layer;
a first metal gate electrode around the gate insulating film;
a gate insulating film around the second pillar-shaped silicon layer;
a second metal gate electrode around the gate insulating film;
a metal gate line connected to the first metal gate electrode and to the second metal gate electrode and extending in a direction perpendicular to the first fin-shaped silicon layer and the second fin-shaped silicon layer.

\* \* \* \* \*